US012509759B2

(12) United States Patent
Okamoto

(10) Patent No.: US 12,509,759 B2
(45) Date of Patent: Dec. 30, 2025

(54) MANUFACTURING APPARATUS FOR MASK APPARATUS, STORAGE MEDIUM, METHOD OF MANUFACTURING MASK APPARATUS AND MASK APPARATUS

(71) Applicant: Dai Nippon Printing Co., Ltd., Tokyo (JP)

(72) Inventor: Hideyuki Okamoto, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 860 days.

(21) Appl. No.: 17/806,537

(22) Filed: Jun. 13, 2022

(65) Prior Publication Data

US 2022/0403498 A1 Dec. 22, 2022

(30) Foreign Application Priority Data

Jun. 16, 2021 (JP) ................................ 2021-100342
Jun. 2, 2022 (JP) ................................ 2022-090445

(51) Int. Cl.
*C23C 14/04* (2006.01)

(52) U.S. Cl.
CPC ................................ *C23C 14/042* (2013.01)

(58) Field of Classification Search
None
See application file for complete search history.

(56) References Cited

U.S. PATENT DOCUMENTS 5,854,819 A * 12/1998 Hara .................. G03F 7/70783 378/208
2018/0293720 A1 10/2018 Yoshitake et al.
2021/0060700 A1 3/2021 Okamoto

FOREIGN PATENT DOCUMENTS

| | | | |
|---|---|---|---|
| JP | 2017-014582 | A | 1/2017 |
| JP | 2020-183570 | A | 11/2020 |
| KR | 10-2018-0010774 | A | 1/2018 |
| KR | 10-2018-0113915 | A | 10/2018 |
| KR | 10-2019-0038755 | A | 4/2019 |
| KR | 10-2020-0051702 | A | 5/2020 |
| WO | 2019/049600 | A1 | 3/2019 |

OTHER PUBLICATIONS

Korean Office Action (with English translation) dated Apr. 8, 2025 (Application No. 10-2022-0072557).
Chinese Office Action (with English translation) dated Jan. 21, 2025 (Application No. 202210673915.3).

* cited by examiner

*Primary Examiner* — Charles Capozzi
(74) *Attorney, Agent, or Firm* — BURR PATENT LAW, PLLC

(57) ABSTRACT

A mask apparatus may include a frame including first and second sides opposing each other in a first direction across an opening and third and fourth sides opposing each other in a second direction crossing the first direction across the opening. A manufacturing apparatus may include a pressing mechanism that presses the first and second sides toward the opening, a displacement measuring mechanism that measures amounts of deformation of the first and second sides in the first direction, and a fixing unit that fixes a mask to the first and second sides. The pressing mechanism may include five or more pressing units that are arranged at intervals of 500 mm or less in the second direction and that press the first side and five or more pressing units that are arranged at intervals of 500 mm or less in the second direction and that press the second side.

3 Claims, 44 Drawing Sheets

MANUFACTURING APPARATUS FOR MASK APPARATUS, STORAGE MEDIUM, METHOD OF MANUFACTURING MASK APPARATUS AND MASK APPARATUS

CROSS REFERENCES TO RELATED APPLICATIONS

The present application contains subject matter related to Japanese Patent Application No. 2021-100342 filed in the Japan Patent Office on Jun. 16, 2021 and Japanese Patent Application No. 2022-090445 filed in the Japan Patent Office on Jun. 2, 2022, the entire contents of which are incorporated herein by reference.

BACKGROUND

1. Field

Embodiments of the present disclosure relate to a manufacturing apparatus for a mask apparatus, a storage medium, a method of manufacturing a mask apparatus, and a mask apparatus.

2. Description of the Related Art

Organic devices such as an organic electroluminescence (EL) display are attracting attention. Known methods for forming the elements of an organic device include a method of attaching the material for the elements to a substrate by vapor deposition. For example, first, a substrate on which a first electrode is formed in a pattern corresponding to the elements is prepared. Next, a vapor deposition process is performed using a mask apparatus. The mask apparatus includes a mask including a through-hole and a frame that supports the mask. An organic material that has passed through the through-hole of the mask attaches onto the first electrode to form an organic layer on the first electrode.

The frame includes a first side and a second side to which ends of the mask are fixed. The first side and the second side face each other in a first direction with an opening therebetween. The frame supports the mask while applying tension to the mask in the first direction. This eliminates or reduces deflection of the mask.

Patent Document 1: International Publication No. 2019/049600.

SUMMARY

In fixing the mask to the first side and the second side of the frame, with the first side and the second side deformed in the direction toward the opening, the mask is subjected to tension based on the elastically restoring force of the first side and the second side. Accurate adjustment of the amounts of deformation of the first side and the second side is required to accurately adjust the tension to the mask.

One of means for reducing the manufacturing cost of an organic device is increasing the size of the substrate. Increasing the size of the substrate also increases the size of the mask and the frame. The increase in the size of the frame increases difficulty in adjusting the amounts of deformation of the first side and the second side.

In a manufacturing apparatus for a mask apparatus according to an embodiment of the present disclosure, the mask apparatus may include a frame including a first side and a second side opposing each other in a first direction across an opening and a third side and a fourth side opposing each other in a second direction crossing the first direction across the opening and at least one mask including ends fixed to the first side and the second side. The manufacturing apparatus may include a pressing mechanism that presses the first side and the second side in a direction toward the opening, a displacement measuring mechanism that measures amounts of deformation of the first side and the second side in the first direction, and a fixing unit that fixes the mask to the first side and the second side. The pressing mechanism may include five or more pressing units that are arranged at intervals of 500 mm or less in the second direction and that press the first side and five or more pressing units that are arranged at intervals of 500 mm or less in the second direction and that press the second side.

An embodiment of the present disclosure allows appropriate adjustment of the amounts of deformation of the first side and the second side of the frame.

EMBODIMENTS

Figure 1:
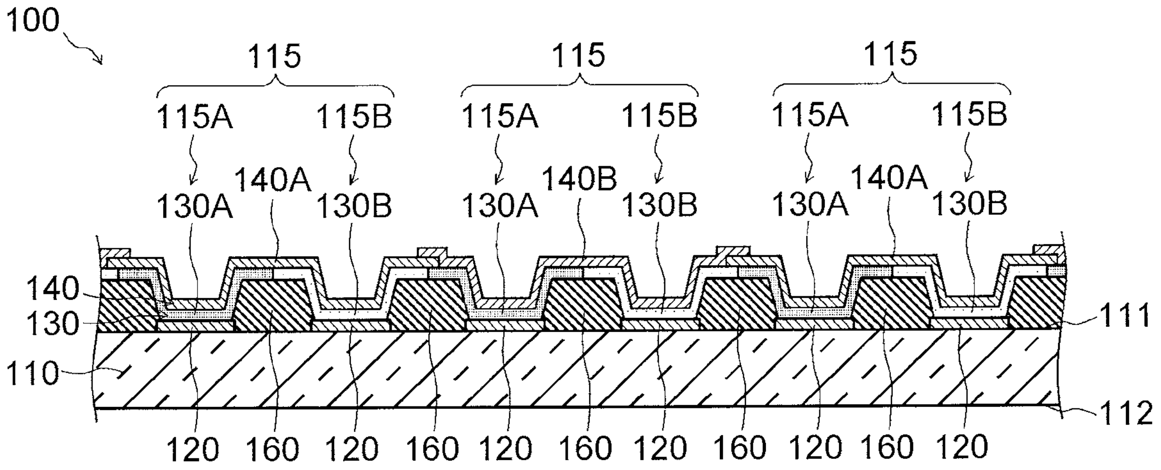
FIG. 1 is a cross-sectional view of an example of an organic device.

In this specification and the drawings, the terms that refer to objects that are the bases of components, such as "substrate", "base material", "plate", "sheet", and "film", are not distinguished from each other on the basis of only the difference in designation unless otherwise specified.

In this specification and the drawings, the terms specifying the shapes, geometrical conditions, and the degree thereof, for example, the terms "parallel" and "orthogonal" and the values of lengths and angles, are not restricted in a strict sense and are construed to the extent to which similar functions may be expected unless otherwise specified.

In this specification and the drawings, a case where a certain component, such as a certain member or a certain area, is "on", "under", or "above" another component or another area, or "higher" or "lower" than another component or another area includes a case where the certain component is in direct contact with the other component, and also a case where another component is disposed between the certain component and the other component, that is, in indirect-contact with each other, unless otherwise specified. The words, "top", "above", "higher", and "under", "below", and "lower" may be inverted in the vertical direction unless otherwise specified.

In this specification and the drawings, identical portions or portions having similar functions are denoted by the same reference signs or similar signs, and repetitive descriptions may be omitted unless otherwise specified. The dimensional ratios of the drawings may differ from the actual ratios, or part of the configurations may be omitted for convenience of explanation.

In this specification and the drawings, an embodiment may be combined with another embodiment within a consistent range. Other embodiments may be combined to each other within a consistent range unless otherwise specified.

In this specification and the drawings, in the case where a plurality of processes for a method of manufacture is disclosed, another process that is not disclosed may be performed between the disclosed processes unless otherwise specified. The disclosed processes may be performed in any order unless otherwise specified.

In this specification and the drawings, a numerical range expressed by the term "to" includes values placed before and after the term "to" unless otherwise specified. For example, the numerical range defined by the expression "34% by mass to 38% by mass" is equal to the numerical range defined by the expression "34% by mass or more and 38% by mass or less".

An embodiment of this specification will be described using an example of a mask for use in patterning an organic material or electrodes on a substrate in a desired pattern and a method of manufacturing the mask in manufacturing an organic EL display. However, this is given for mere illustrative purposes, and the embodiment is applicable to masks for use in various applications. For example, the mask of this embodiment may be used to form the electrodes of an apparatus for displaying or projecting images or video for expressing virtual reality (VR) or augmented reality (AR). The mask of this embodiment may be used to form the electrodes of displays other than organic EL displays, such as the electrodes of liquid-crystal displays. The mask of this embodiment may also be used to form the electrodes of organic devices other than displays, such as the electrodes of pressure sensors.

In a manufacturing apparatus for a mask apparatus according to a first aspect of the present disclosure, the mask apparatus includes a frame including a first side and a second side opposing each other in a first direction across an opening and a third side and a fourth side opposing each other in a second direction crossing the first direction across the opening and at least one mask including ends fixed to the first side and the second side, and the manufacturing apparatus includes a pressing mechanism that presses the first side and the second side in a direction toward the opening, a displacement measuring mechanism that measures amounts of deformation of the first side and the second side in the first direction, and a fixing unit that fixes the mask to the first side and the second side, wherein the pressing mechanism includes five or more pressing units that are arranged at intervals of 500 mm or less in the second direction and that press the first side and five or more pressing units that are arranged at intervals of 500 mm or less in the second direction and that press the second side.

According to a second aspect of the present disclosure, in the manufacturing apparatus according to the first aspect, the displacement measuring mechanism may include at least one displacement meter that measures the amount of deformation of the first side, and the displacement meter may include a sensor head that is in contact with the first side.

According to a third aspect of the present disclosure, in the manufacturing apparatus according to the second aspect, the displacement meter may measure the amount of deformation of the first side at a position 100 mm or less distant from one of the pressing units in the second direction.

According to a fourth aspect of the present disclosure, in the manufacturing apparatus according to the second aspect or the third aspect, the at least one displacement meter may include five or more displacement meters that measure the amounts of deformation of the first side at positions 100 mm or less distant from the pressing units in the second direction, and the displacement measuring mechanism may further include a first auxiliary displacement meter that measures the amount of deformation of the first side at a position 200 mm or less distant from an outer surface of the third side in the second direction and a second auxiliary displacement meter that measures the amount of deformation of the first side at a position 200 mm or less distant from an outer surface of the fourth side in the second direction.

According to a fifth aspect of the present disclosure, in the manufacturing apparatus according to the fourth aspect, a distance between the first auxiliary displacement meter and the second auxiliary displacement meter in the second direction may be 1,300 mm or more.

According to a sixth aspect of the present disclosure, in the manufacturing apparatus according to any one of the first aspect to the fifth aspect, a distance between the pressing unit that presses the first side and the pressing unit that presses the second side in the first direction may be 1,300 mm or more.

According to a seventh aspect of the present disclosure, in the manufacturing apparatus according to any one of the first aspect to the fifth aspect, the at least one mask may include N masks (where N is an integer greater than or equal to 2) arranged in the second direction, the manufacturing apparatus may further include a control unit that controls the pressing mechanism, and the pressing mechanism may press the first side and the second side in such a manner that a difference between the amount of deformation and a target amount of deformation when the masks are fixed to the first side is less than or equal to a first threshold.

According to an eighth aspect of the present disclosure, in the manufacturing apparatus according to the seventh aspect, the fixing unit may fix the masks to the first side and the second side in order of decreasing distance from a center of the frame in the second direction, the pressing mechanism that presses the first side may include a central group including one or two of the pressing units, a first group including two or more of the pressing units between the central group and the third side in the second direction, and a second group including two or more of the pressing units between the central group and the fourth side in the second direction, the one or two pressing units of the central group may apply a first pressing force (1) to the first side when a first one of the masks is fixed to the frame, the one or two pressing units of the central group may apply a first pressing force (U) to the first side when a U-th one of the masks (where U is an integer greater than 1 and less than N) is fixed to the frame, and a ratio of the first pressing force (U) to the first pressing force (1) may be 1.05 or higher.

According to a ninth aspect of the present disclosure, in the manufacturing apparatus according to the seventh aspect, the fixing unit may fix the masks to the first side and the second side in order of increasing distance from a center of the frame in the second direction, the pressing mechanism that presses the first side may include a central group including one or two of the pressing units, a first group including two or more of the pressing units between the central group and the third side in the second direction, and a second group including two or more of the pressing units between the central group and the fourth side in the second direction, one of the pressing units that belongs to the second group and that is closest to the fourth side may apply a first pressing force (1) to the first side when the first one of the masks is fixed to the frame, the pressing unit that belongs to the second group and that is closest to the fourth side may apply a first pressing force (U) to the first side when a U-th one of the masks (where U is an integer greater than 1 and less than N) is fixed to the frame, and a ratio of the first pressing force (U) to the first pressing force (1) may be 1.05 or higher.

According to a tenth aspect of the present disclosure, in the manufacturing apparatus according to the eighth aspect or the ninth aspect, the control unit may control the pressing mechanism so as to satisfy the following inequality:

$$U \geq N/2.$$

According to an (11-1)th aspect of the present disclosure, a program causes a computer to function as the control unit of the manufacturing apparatus according to any one of the seventh aspect to the tenth aspect.

According to an (11-2)th aspect of the present disclosure, a computer-readable non-transitory storage medium stores the program according to the (11-1)th aspect.

According to a 12th aspect of the present disclosure, a method of manufacturing a mask apparatus includes preparing a frame including a first side and a second side opposing each other in a first direction across an opening and a third side and a fourth side opposing each other in a second direction crossing the first direction across the opening, adjusting first pressing forces that a pressing mechanism applies to the first side and the second side in a direction toward the opening, and fixing ends of at least one mask to the first side and the second side, wherein the pressing mechanism includes five or more pressing units that are arranged at intervals of 500 mm or less in the second direction and that press the first side and five or more pressing units that are arranged at intervals of 500 mm or less in the second direction and that press the second side.

According to a 13th aspect of the present disclosure, in the method of manufacture according to the 12th aspect, the adjusting may include adjusting the first pressing forces based on information from a displacement measuring mechanism that measures amounts of deformation of the first side and the second side in the first direction, the displacement measuring mechanism may include at least one displacement meter that measures the amount of deformation of the first side, and the displacement meter may include a sensor head that is in contact with the first side.

According to a 14th aspect of the present disclosure, in the method of manufacture according to the 13th aspect, the displacement meter may measure the amount of deformation of the first side at a position 100 mm or less distant from one of the pressing units in the second direction.

According to a 15th aspect of the present disclosure, in the method of manufacture according to the 13th aspect or the 14th aspect, the at least one displacement meter may include five or more displacement meters that measure the amounts of deformation of the first side at positions 100 mm or less distant from the pressing units in the second direction, and the displacement measuring mechanism may further include a first auxiliary displacement meter that measures the amount of deformation of the first side at a position 200 mm or less distant from an outer surface of the third side in the second direction and a second auxiliary displacement meter that measures the amount of deformation of the first side at a position 200 mm or less distant from an outer surface of the fourth side in the second direction.

In the 15th aspect, a distance between the first auxiliary displacement meter and the second auxiliary displacement meter in the second direction may be 1,300 mm or more.

In the 12th aspect to the 15th aspect, a distance between the pressing unit that presses the first side and the pressing unit that presses the second side in the first direction may be 1,300 mm or more.

According to a 16th aspect of the present disclosure, in the method of manufacture according to any one of the 11th aspect to the 15th aspect, the at least one mask may include N masks (where N is an integer greater than or equal to 2) arranged in the second direction, and the adjusting may include adjusting the first pressing forces in such a manner that a difference between the amount of deformation of the first side and a target amount of deformation when the masks are fixed to the first side is less than or equal to a first threshold.

According to a 17th aspect of the present disclosure, in the method of manufacture according to the 16th aspect, the fixing may include fixing the masks to the first side and the second side in order of decreasing distance from a center of the frame in the second direction, the pressing mechanism that presses the first side may include a central group including one or two of the pressing units, a first group including two or more of the pressing units between the central group and the third side in the second direction, and a second group including two or more of the pressing units between the central group and the fourth side in the second direction, the one or two pressing units of the central group may apply a first pressing force (1) to the first side when a first one of the masks is fixed to the frame, the one or two pressing units of the central group may apply a first pressing force (U) to the first side when a U-th one of the masks (where U is an integer greater than 1 and less than N) is fixed to the frame, and a ratio of the first pressing force (U) to the first pressing force (1) may be 1.05 or higher.

According to an 18th aspect of the present disclosure, in the method of manufacture according to the 16th aspect, the fixing may include fixing the masks to the first side and the second side in order of increasing distance from a center of the frame in the second direction, the pressing mechanism that presses the first side may include a central group including one or two of the pressing units, a first group including two or more of the pressing units between the central group and the third side in the second direction, and a second group including two or more of the pressing units between the central group and the fourth side in the second direction, one of the pressing units that belongs to the second group and that is closest to the fourth side may apply a first pressing force (1) to the first side when a first one of the masks is fixed to the frame, the pressing unit that belongs to the second group and that is closest to the fourth side may apply a first pressing force (U) to the first side when a U-th one of the masks (where U is an integer greater than 1 and less than N) is fixed to the frame, and a ratio of the first pressing force (U) to the first pressing force (1) may be 1.05 or higher.

According to a 19th aspect of the present disclosure, in the method of manufacture according to the 17th aspect or the 18th aspect, the adjusting may include adjusting the first pressing forces so as to satisfy the following inequality:

$$U \geq N/2.$$

According to a 20th aspect of the present disclosure, a mask apparatus includes a frame including a first side and a second side opposing each other in a first direction across an opening and a third side and a fourth side opposing each other in a second direction crossing the first direction across the opening and N masks (where N is an integer greater than or equal to 2) each of which includes ends fixed to the first side and the second side and which are arranged in the second direction, wherein the first side and the second side are deformed in the second direction by a final amount of deformation so as to bend toward the opening, wherein, when a removing step and an inverse adjustment step are alternately performed, a ratio of a second pressing force (Q) to a second pressing force (N) is 1.05 or higher, wherein the removing step is a step of detaching the masks from the frame in order of increasing distance from a center of the frame in the second direction, wherein the inverse adjustment step is a step of adjusting second pressing forces that a pressing mechanism applies to the first side and the second side in a direction toward the opening so as to deform the first side and the second side in the second direction by the final amount of deformation after the removing step, wherein the pressing mechanism that presses the first side includes a central group including one or two pressing units that press the first side, a first group including two or more pressing units between the central group and the third side in the second direction, and a second group including two or more pressing units between the central group and the fourth side in the second direction, wherein the second pressing force (Q) is a pressing force that the one or two pressing units of the central group apply to the first side after a Q-th mask of the masks (where Q is an integer greater than 1 and less than N) is detached from the frame, and wherein the second pressing force (N) is a pressing force that the one or two pressing units of the central group apply to the first side after an N-th mask of the masks is detached from the frame.

According to a 21st aspect of the present disclosure, a mask apparatus includes a frame including a first side and a second side opposing each other in a first direction across an opening and a third side and a fourth side opposing each other in a second direction crossing the first direction across the opening and N masks (where N is an integer greater than or equal to 2) each of which includes ends fixed to the first side and the second side and which are arranged in the second direction, wherein the first side and the second side are deformed in the second direction by a final amount of deformation so as to bend toward the opening, wherein, when a removing step and an inverse adjustment step are alternately performed, a ratio of a second pressing force (Q) to a second pressing force (N) is 1.05 or higher, wherein the removing step is a step of detaching the masks from the frame in order of decreasing distance from a center of the frame in the second direction, wherein the inverse adjustment step is a step of adjusting second pressing forces that a pressing mechanism applies to the first side and the second side in a direction toward the opening so as to deform the first side and the second side in the second direction by the final amount of deformation after the removing step, wherein the pressing mechanism that presses the first side includes a central group including one or two pressing units that press the first side, a first group including two or more pressing units between the central group and the third side in the second direction, and a second group including two or more pressing units between the central group and the fourth side in the second direction, wherein the second pressing force (Q) is a pressing force that one of the pressing units that belongs to the second group and that is closest to the fourth side applies to the first side after a Q-th mask of the masks (where Q is an integer greater than 1 and less than N) is detached from the frame, and wherein the second pressing force (N) is a pressing force that one of the pressing units that belongs the second group and that is closest to the fourth side applies to the first side after an N-th mask of the masks is detached from the frame.

According to a 22nd aspect of the present disclosure, in the mask apparatus according to the 21st aspect or the 22nd aspect, the following inequality may be satisfied:

$$Q \leq N/2.$$

A first embodiment of the present disclosure will be described in detail with reference to the drawings. It is to be understood that the embodiments described below are given for illustrative purposes only and that the present disclosure is not construed as limited to these embodiments.

An organic device 100 including elements formed by using a mask will be described. FIG. 1 is a cross-sectional view of an example of the organic device 100.

The organic device 100 includes a substrate 110 including a first surface 111 and a second surface 112 and a plurality of elements 115 on the first surface 111 of the substrate 110. An example of the elements 115 is a pixel. The elements 115 may be arranged in the in-plane direction of the first surface 111. The substrate 110 may include two or more kinds of elements 115. For example, the substrate 110 may include a first element 115A and a second element 115B. The substrate 110 may include a third element (not shown). Examples of the first element 115A, the second element 115B, and the third element include a red pixel, a blue pixel, and a green pixel.

Each element 115 may include a first electrode 120, an organic layer 130 located on the first electrode 120, and a second electrode 140 located on the organic layer 130. The element formed by using a mask may be either the organic layer 130 or the second electrode 140. The element formed by using a mask is also referred to as "deposited layer".

The organic device 100 may include an insulating layer 160 located between two first electrodes 120 adjacent in plan view. The insulating layer 160 contains, for example, polyimide. The insulating layer 160 may overlap with the end of the first electrode 120 in plan view.

The organic device 100 may be of an active-matrix type. For example, the organic device 100 may include switches electrically connected to the plurality of elements 115. An example of the switches is a transistor. The switches can control the ON/OFF of a voltage or current to the corresponding elements 115.

The substrate 110 may be an insulating plate-like member. The substrate 110 preferably has transparency to allow light to pass through. Examples of the material for the substrate 110 include inflexible rigid materials, such as quartz glass, Pyrex® glass, and a synthetic quartz plate, and flexible materials, such as resin film, an optical resin plate, and thin glass. The base material may be a laminate having a barrier layer on one side or both sides of a resin film.

The element 115 is configured to perform some function when a voltage is applied between the first electrode 120 and the second electrode 140 or when an electric current flows between the first electrode 120 and the second electrode 140. For example, the element 115 is a pixel of an organic EL display, the element 115 can emit light composing an image.

The first electrode 120 contains an electrically conductive material. For example, the first electrode 120 contains metal, electrically conductive metal oxide, or another electrically conductive inorganic material. The first electrode 120 may contain transparent, electrically conductive metal oxide, such as indium tin oxide (ITO) or indium zinc oxide (IZO).

The organic layer 130 contains an organic material. When an electric current flows through the organic layer 130, the organic layer 130 can perform some function. The organic layer 130 may be a light emitting layer that emits light in response an electric current. The organic layer 130 may be a light emitting layer that emits light in response to an electric current. The organic layer 130 may contain an organic semiconductor material. The properties of the organic layer 130, such as transmittance and refractive index, may be adjusted as appropriate.

As shown in FIG. 1, the organic layer 130 may include a first organic layer 130A and a second organic layer 130B. The first organic layer 130A is included in the first elements 115A. The second organic layer 130B is included in the second elements 115B. The organic layer 130 may include a third organic layer included in the third element (not shown). Examples of the first organic layer 130A, the second organic layer 130B, and the third organic layer include a red emission layer, a blue emission layer, and a green emission layer.

When a voltage is applied between the first electrode 120 and the second electrode 140, an electric current flows through the organic layer 130. If the organic layer 130 is an emission layer, light is emitted from the organic layer 130, and the light is taken out of the second electrode 140 or the first electrode 120 to the outside.

The organic layer 130 may further include a hole injection layer, a hole transport layer, an electron transport layer, an electron injection layer, and a charge generation layer.

The second electrode 140 contains an electrically conductive material, such as metal. The second electrode 140 is formed on the organic layer 130 by a vapor deposition method using a mask. Examples of the material for the second electrode 140 include platinum, gold, silver, copper, iron, tin, chromium, aluminum, indium, lithium, sodium, potassium, calcium, magnesium, indium tin oxide (ITO), indium zinc oxide (IZO), and carbon. These materials may be used alone or in combination of two or more kinds. If two or more kinds are used, the layers of the materials may be laminated. Alternatively, an alloy of two or more kinds of material may be used. For example, a magnesium alloy, such as MgAg, or an aluminum alloy, such as AlLi, AlCa, or AlMg, may be used. MgAg is also referred to as magnesium-silver. Magnesium-silver is preferably used as the material for the second electrode 140. Alloys of alkali metals and alkali earth metals may be used. For example, lithium fluoride, sodium fluoride, or potassium fluoride may be used.

The second electrode 140 may be a common electrode. For example, the second electrode 140 of one element 115 may be electrically connected to the second electrode 140 of another element 115.

The second electrode 140 may be constituted of one layer. For example, the second electrode 140 may be a layer formed by a vapor deposition process using a single mask.

Alternatively, the second electrode 140 may include a first layer 140A and a second layer 140B, as shown in FIG. 1. The first layer 140A may be a layer formed by a vapor deposition process using a first mask. The second layer 140B may be a layer formed by a vapor deposition process using a second mask. Thus, the second electrode 140 may be formed using two or more masks. This increases the degree of freedom of the pattern of the second electrode 140 in plan view. For example, the organic device 100 can include an area without the second electrode 140 in plan view. The area without the second electrode 140 is given higher transmittance than an area with the second electrode 140.

As shown in FIG. 1, the end of the first layer 140A and the end of the second layer 140B may partially overlap with each other. This allows the first layer 140A and the second layer 140B to be electrically connected.

The second electrode 140 may include another layer, such as a third layer (not shown). The other layer, such as the third layer, may be electrically connected to the first layer 140A and the second layer 140B.

Of the components of the second electrode 140, components common among the first layer 140A, the second layer 140B, and the third layer, are referred to as the term and reference sign "second electrode 140" in the following description.

Figure 2:
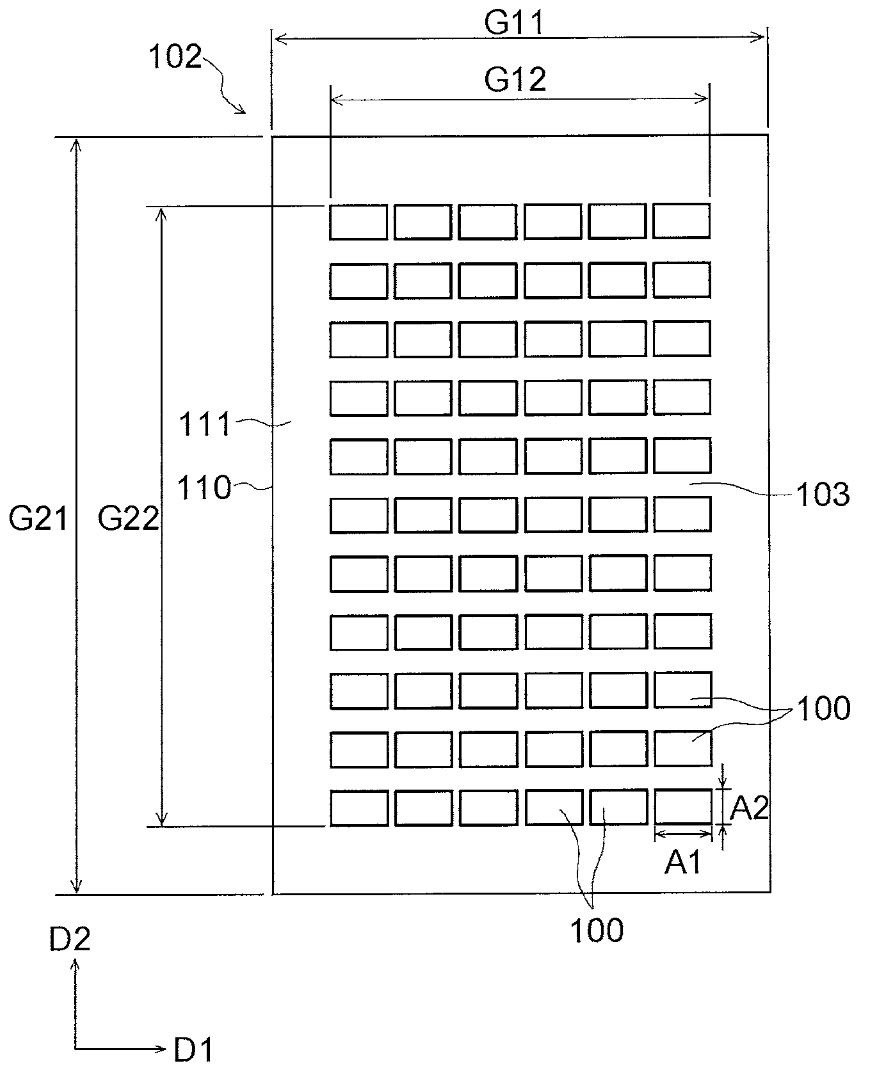
FIG. 2 is a plan view of an example of an organic device group.

In the method of manufacturing the organic device 100, an organic device group 102 as shown in FIG. 2 may be produced. The organic device group 102 includes two or more organic devices 100. For example, the organic device group 102 may include organic devices 100 arranged in a first direction D1 and a second direction D2. The second direction D2 crosses the first direction D1. The second direction D2 may cross the first direction D1 at right angles. Two or more organic devices 100 may share a common single substrate 110. For example, the organic device group 102 may be located on a single substrate 110 and may include the first electrode 120, the organic layer 130, and second electrode 140 constituting two or more organic devices 100. By dividing the organic device group 102, the organic devices 100 are obtained.

The first direction D1 may a direction in which the masks 50 used in manufacturing the organic devices 100 extends.

The dimension A1 of each organic device 100 in the first direction D1 may be, for example, 10 mm, 30 mm, or 100 mm or more. The dimension A1 may be, for example, 200 mm or less, 500 mm or less, or 1,000 mm or less. The range of the dimension A1 may be defined by a first group of 10 mm, 30 mm, and 100 mm and/or a second group of 200 mm, 500 mm, and 1,000 mm. The range of the dimension A1 may be defined by a combination of any one of the values included in the first group and any one of the values included in the second group. The range of the dimension A1 may be defined by any two combinations of the values included in the first group. The range of the dimension A1 may be defined by any two combinations of the values included in the second group. For example, the dimension A1 may be 10 mm or more and 1,000 mm or less, 10 mm or more and 500 mm or less, 10 mm or more and 200 mm or less, 10 mm or more and 100 mm or less, 10 mm or more and 30 mm or less, 30 mm or more and 1,000 mm or less, 30 mm or more and 500 mm or less, 30 mm or more and 200 mm or less, 30 mm or more and 100 mm or less, 100 mm or more and 1,000 mm or less, 100 mm or more and 500 mm or less, between 100 mm and 200 mm or less, 200 mm or more and 1,000 mm or less, 200 mm or more and 500 mm or less, or 500 mm or more and 1,000 mm or less.

The dimension A2 of the organic device 100 in the second direction D2 may be, for example, 10 mm or more, 20 mm or more, or 50 mm or more. The dimension A2 may be, for example, 100 mm or less, 200 mm or less, or 500 mm or less. The range of the dimension A2 may be defined by a first group of 10 mm, 20 mm, and 50 mm and/or a second group of 100 mm, 200 mm, and 500 mm. The range of the dimension A2 may be defined by a combination of any one of the values included in the first group and any one of the values included in the second group. The range of the dimension A2 may be defined by any two combinations of the values included in the first group. The range of the dimension A2 may be defined by any two combinations of the values included in the second group. For example, the dimension A2 may be 10 mm or more and 500 mm or less, 10 mm or more and 200 mm or less, 10 mm or more and 100 mm or less, 10 mm or more and 50 mm or less, 10 mm or more and 20 mm or less, 20 mm or more and 500 mm or less, 20 mm or more and 200 mm or less, 20 mm or more and 100 mm or less, 20 mm or more and 50 mm or less, 50 mm or more and 500 mm or less, 50 mm or more and 200 mm or less, 50 mm or more and 100 mm or less, 100 mm or more and 500 mm or less, 100 mm or more and 200 mm or less, or 200 mm or more and 500 mm or less.

The organic device group 102 includes a device area 103 in which the plurality of organic devices 100 are located. The device area 103 has a dimension G12 in the first direction D1 and a dimension G22 in the second direction D2.

Increasing the size of the substrate 110 allows for increasing the dimensions G12 and G22 of the device area 103. This allows increasing the number of organic devices 100 formed on a single substrate 110. This reduces the manufacturing cost of the organic devices 100.

The dimension G11 of the substrate 110 in the first direction D1 may be, for example, 1,000 mm or more, 1,200 mm or more, 1,300 mm or more, or 2,100 mm or more. The dimension G11 may be, for example, 1,200 mm or less, 1,300 mm or less, 1,900 mm or less, 2,100 mm or less, or 2,300 mm or less. The range of the dimension G11 may be defined by a first group of 1,000 mm, 1,200 mm, 1,300 mm, and 2,100 mm and/or a second group of 1,200 mm, 1,300 mm, 1,900 mm, 2,100 mm, and 2,300 mm. The range of the dimension G11 may be defined by a combination of any one of the values included in the first group and any one of the values included in the second group. The range of the dimension G11 may be defined by any two combinations of the values included in the first group. The range of the dimension G11 may be defined by any two combinations of the values included in the second group. For example, the dimension G11 may be 1,000 mm or more and 2,300 mm or less, 1,000 mm or more and 2,100 mm or less, 1,000 mm or more and 1,900 mm or less, 1,000 mm or more and 1,300 mm or less, 1,000 mm or more and 1,200 mm or less, 1,200 mm or more and 2,300 mm or less, 1,200 mm or more and 2,100 mm or less, 1,200 mm or more and 1,900 mm or less, 1,200 mm or more and 1,300 mm or less, 1,300 mm or more and 2,300 mm or less, 1,300 mm or more and 2,100 mm or less, 1,300 mm or more and 1,900 mm or less, 1,900 mm or more and 2,300 mm or less, 1,900 mm or more and 2,100 mm or less, or 2,100 mm or more and 2,300 mm or less.

The dimension G21 of the substrate 110 in the second direction D2 may be, for example, 1,200 mm or more, 1,300 mm or more, 1,500 mm or more, 2,000 mm or more, or 2,400 mm or more. The dimension G21 may be, for example, 1,300 mm or less, 2,300 mm or less, 2,400 mm or less, or 2,600 mm or less. The range of the dimension G21 may be defined by a first group of 1,200 mm, 1,300 mm, 1,500 mm, 2,000 mm, and 2,400 mm and/or a second group of 1,300 mm, 2,300 mm, 2,400 mm, and 2,600 mm. The range of the dimension G21 may be defined by a combination of any one of the values included in the first group and any one of the values included in the second group. The range of the dimension G21 may be defined by any two combinations of the values included in the first group. The range of the dimension G21 may be defined by any two combinations of the values included in the second group. For example, the dimension G21 may be 1,200 mm or more and 2,600 mm or less, 1,200 mm or more and 2,400 mm or less, 1,200 mm or more and 2,300 mm or less, 1,200 mm or more and 1,500 mm or less, 1,200 mm or more and 1,300 mm or less, 1,300 mm or more and 2,600 mm or less, 1,300 mm or more and 2,400 mm or less, 1,300 mm or more and 2,300 mm or less, 1,300 mm or more and 1,500 mm or less, 1,500 mm or more and 2,600 mm or less, 1,500 mm or more and 2,400 mm or less, 1,500 mm or more and 2,300 mm or less, 2,000 mm or more and 2,300 mm or less, 2,300 mm or more and 2,600 mm or less, 2,300 mm or more and 2,400 mm or less, or 2,400 mm or more and 2,600 mm or less.

A specific numerical range of the dimension G11 and a specific numerical range of the dimension G21 may be combined. For example, the dimension G11 may be 1,000 mm or more and 1,200 mm or less, and the dimension G21 may be 1,200 mm or more and 1,300 mm or less. For example, the dimension G11 may be 1,200 mm or more and 1,300 mm or less, and the dimension G21 may be 2,000 mm or more and 2,300 mm or less. For example, the dimension G11 may be 2,100 mm or more and 2,300 mm or less, and the dimension G21 may be 2,400 mm or more and 2,600 mm or less.

Figure 3:
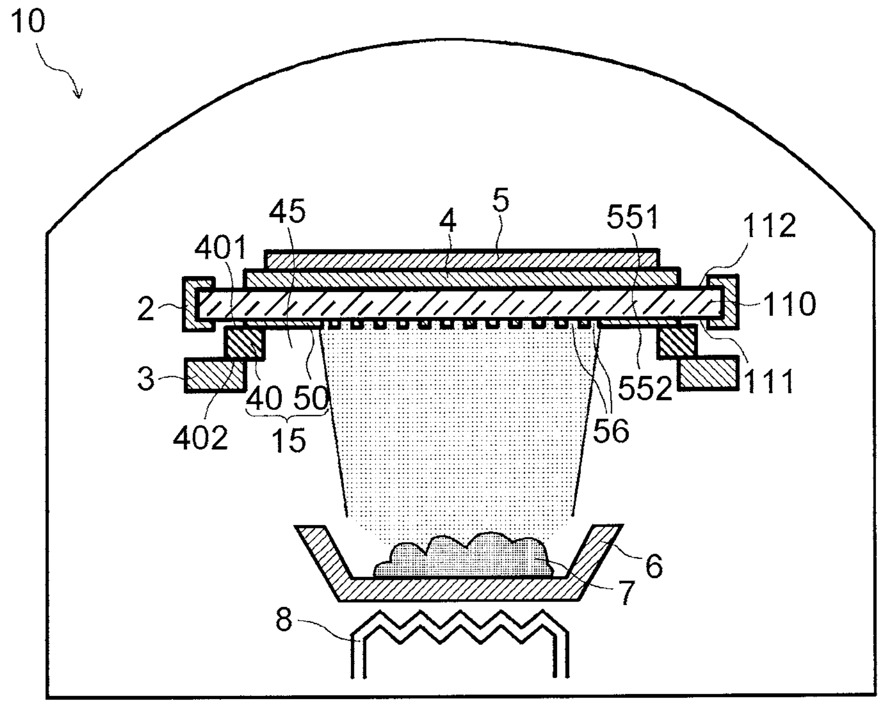
FIG. 3 is a cross-sectional view of an example of a deposition apparatus.

Next, a method of forming elements such as the organic layer 130 and the second electrode 140 by a vapor deposition method will be described. FIG. 3 illustrates a deposition apparatus 10. The deposition apparatus 10 performs a vapor deposition process for evaporating a deposition material onto the substrate 110.

As shown in FIG. 3, the deposition apparatus 10 may contain an evaporation source 6, a heater 8, and a mask apparatus 15. The deposition apparatus 10 may include an exhauster for bringing the interior of the deposition apparatus 10 into a vacuum atmosphere. An example of the evaporation source 6 is a crucible. The evaporation source 6 contains a deposition material 7, such as an organic material or a metal material. The heater 8 heats the evaporation source 6 to evaporate the deposition material 7 under the vacuum atmosphere.

As shown in FIG. 3, the mask apparatus 15 includes at least one mask 50. The mask apparatus 15 may include a frame 40 that supports the mask 50. The frame 40 includes an opening 45. The mask 50 may be fixed to the frame 40 in such a manner as to cross the opening 45 in plan view. The frame 40 may include a first frame surface 401 to which the mask 50 is fixed and a second frame surface 402 located on the opposite side from the first frame surface 401. The frame 40 may support the mask 50, with the mask drawn in the planar direction of the mask 50, to eliminate or reduce the deflection of the mask 50.

As shown in FIG. 3, the mask apparatus 15 is disposed in the deposition apparatus 10 so that the mask 50 faces the first surface 111 of the substrate 110. The mask 50 includes a plurality of through-holes 56 through which the deposition material 7 that comes flying from the evaporation source 6 passes. In the following description, the surface of the mask 50 facing the substrate 110 is referred to as a first surface 551. The surface of the mask 50 on the opposite side from the first surface 551 is referred to as a second surface 552.

As shown in FIG. 3, the deposition apparatus 10 may include a substrate holder 2 that holds the substrate 110. The substrate holder 2 may be movable in the thickness direction of the substrate 110. The substrate holder 2 may be movable in the planar direction of the substrate 110. The substrate holder 2 may be configured to control the inclination of the substrate 110. For example, the substrate holder 2 may include a plurality of chucks attached to the outer edge of the substrate 110. The chucks may be independently movable in the thickness direction and the planar direction of the substrate 110.

As shown in FIG. 3, the deposition apparatus 10 may include a mask holder 3 that holds the mask apparatus 15. The mask holder 3 may be movable.

The position of the mask 50 relative to the substrate 110 can be adjusted by moving at least one of the substrate holder 2 and the mask holder 3.

The deposition apparatus 10 may include a cooling plate 4. As shown in FIG. 3, the cooling plate 4 may be disposed on the second surface 112 of the substrate 110. The cooling plate 4 may include a channel for circulating refrigerant in the cooling plate 4. The cooling plate 4 can eliminate or reduce an increase in the temperature of the substrate 110 at the vapor deposition process.

The deposition apparatus 10 may include a magnet 5. As shown in FIG. 3, the magnet 5 may be disposed nearer to the second surface 112 of the substrate 110. The magnet 5 may be disposed on the surface of the cooling plate 4 remote from the substrate 110. The magnet 5 can attract the mask 50 to the substrate 110 by the magnetic force. This allows reducing or eliminating the gap between the mask 50 and the substrate 110. This can eliminate or reduce the occurrence of a shadow in the vapor deposition process. The shadow is a phenomenon in which the deposition material 7 enters the gap between the mask 50 and the substrate 110 to make the geometry of the deposited layer ununiform. The geometry of the deposited layer includes the thickness of the deposited layer and the dimension of the deposited layer in plan view. The mask 50 may be attracted toward the substrate 110 with an electrostatic chuck using an electrostatic force.

Figure 4:
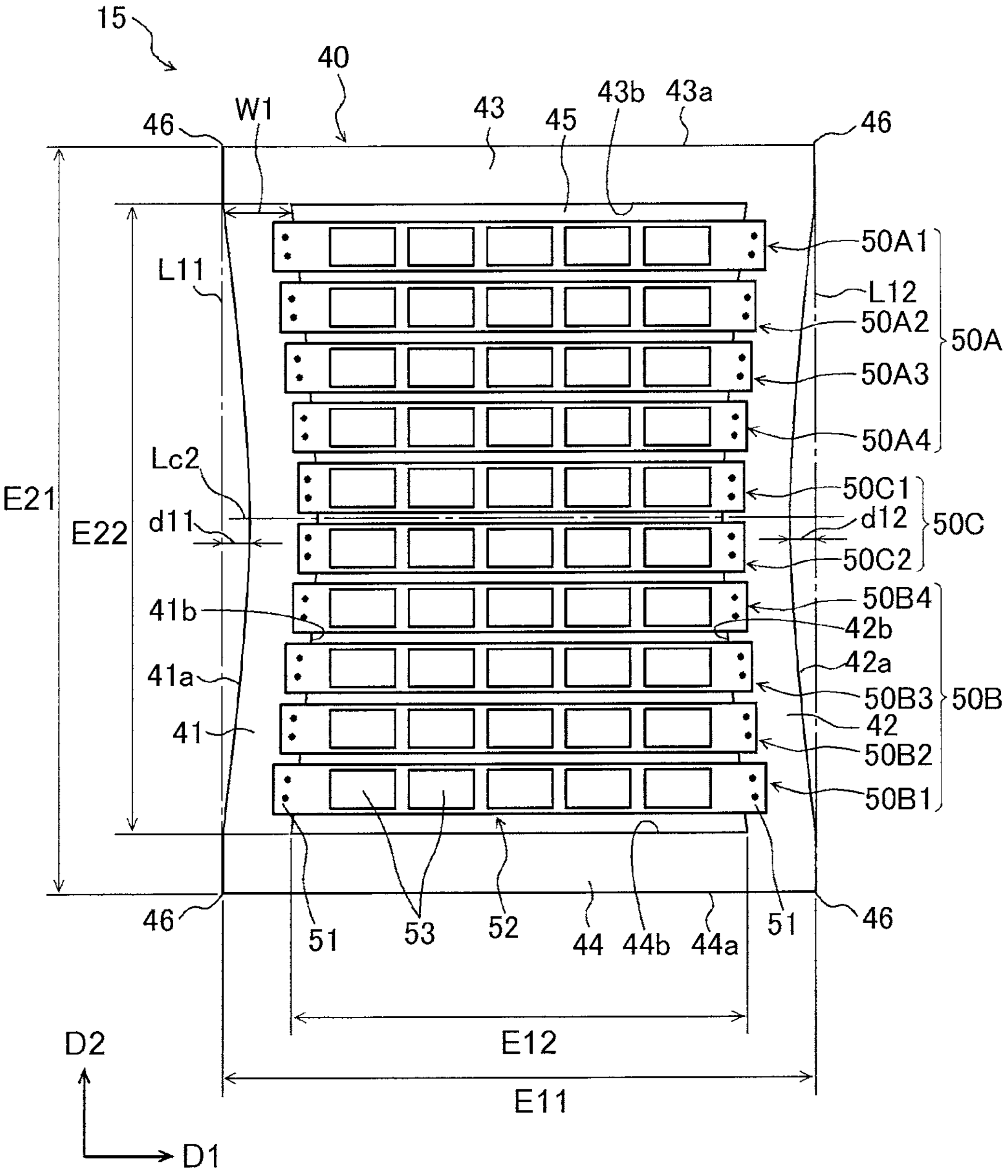
FIG. 4 is a plan view of an example of a mask apparatus.

FIG. 4 is a plan view of the mask apparatus 15 as viewed from the first surface 551. The mask apparatus 15 may include the frame 40 and the mask 50 fixed to the frame 40. The frame 40 may have a rectangular outline extending in the first direction D1 and the second direction D2. The frame 40 may support the mask 50, with the mask 50 subjected to tension in the first direction D1.

The frame 40 includes a first side 41, a second side 42, a third side 43, a fourth side 44, and the opening 45. The first side 41 and the second side 42 face each other in the first direction D1, with the opening 45 therebetween. The first side 41 and the second side 42 may extend in the second direction D2. The third side 43 and the fourth side 44 face each other in the second direction D2, with the opening 45 therebetween. The third side 43 and the fourth side 44 may extend in the first direction D1. The first side 41 and the fourth side 44 may longer than the third side 43 and the fourth side 44. The opening 45 is located between the first side 41 and the second side 42 and between the third side 43 and the fourth side 44.

The first side 41 includes an outer surface 41*a* and an inner surface 41*b*. The second side 42 includes an outer surface 42*a* and an inner surface 42*b*. The third side 43 includes an outer surface 43*a* and an inner surface 43*b*. The fourth side 44 includes an outer surface 44*a* and an inner surface 44*b*. The inner surfaces 41*b*, 42*b*, 43*b*, and 44*b* face the opening 45. The outer surfaces 41*a* and 42*a* are located on the opposite side from the inner surfaces 41*b* and 42*b*, respectively, in the first direction D1. The outer surfaces 43*a* and 44*a* are located on the opposite side from the inner surfaces 43*b* and 44*b*, respectively, in the second direction D2. The frame 40 includes angles 46 at which the outer surfaces of two sides cross each other.

The frame 40 has a dimension E11 in the first direction D1. The dimension E11 may be, for example, 1,000 mm or more, 1,200 mm or more, 1,300 mm or more, or 2,100 mm or more. The dimension E11 may be, for example, 1,200 mm or less, 1,300 mm, or less, 1,900 mm or less, 2,100 mm or less, or 2,300 mm or less. The range of the dimension E11 may be defined by a first group of 1,000 mm, 1,200 mm, 1,300 mm, and 2,100 mm and/or a second group of 1,200 mm, 1,300 mm, 1,900 mm, 2,100 mm, and 2,300 mm. The range of the dimension E11 may be defined by a combination of any one of the values included in the first group and any one of the values included in the second group. The range of the dimension E11 may be defined by any two combinations of the values included in the first group. The range of the dimension E11 may be defined by any two combinations of the values included in the second group. For example, the dimension E11 may be 1,000 mm or more and 2,300 mm or less, 1,000 mm or more and 2,100 mm or less, 1,000 mm or more and 1,900 mm or less, 1,000 mm or more and 1,300 mm or less, 1,000 mm or more and 1,200 mm or less, 1,200 mm or more and 2,300 mm or less, 1,200 mm or more and 2,100 mm or less, 1,200 mm or more and 1,900 mm or less, 1,200 mm or more and 1,300 mm or less, 1,300 mm or more and 2,300 mm or less, 1,300 mm or more and 2,100 mm or less, 1,300 mm or more and 1,900 mm or less, 1,900 mm or more and 2,300 mm or less, 1,900 mm or more and 2,100 mm or less, or 2,100 mm or more and 2,300 mm or less.

The frame 40 has a dimension E21 in the second direction D2. The dimension E21 may be larger than the dimension E11. The dimension E21 may be, for example, 1,200 mm or more, 1,300 mm or more, 1,500 mm or more, 2,000 mm or more, or 2,400 mm or more. The dimension E21 may be, for example, 1,300 mm or less, 2,300 mm or less, 2,400 mm or less, or 2,600 mm or less. The range of the dimension E21 may be defined by a first group of 1,200 mm, 1,300 mm, 1,500 mm, 2,000 mm, and 2,400 mm and/or a second group of 1,300 mm, 2,300 mm, 2,400 mm, and 2,600 mm. The range of the dimension E21 may be defined by a combination of any one of the values included in the first group and any one of the values included in the second group. The range of the dimension E21 may be defined by any two combinations of the values included in the first group. The range of the dimension E21 may be defined by any two combinations of the values included in the second group. For example, the dimension E21 may be 1,200 mm or more and 2,600 mm or less, 1,200 mm or more and 2,400 mm or less, 1,200 mm or more and 2,300 mm or less, 1,200 mm or more and 1,500 mm or less, 1,200 mm or more and 1,300 mm or less, 1,300 mm or more and 2,600 mm or less, 1,300 mm or more and 2,400 mm or less, 1,300 mm or more and 2,300 mm or less, 1,300 mm or more and 1,500 mm or less, 1,500 mm or more and 2,600 mm or less, 1,500 mm or more and 2,400 mm or less, 1,500 mm or more and 2,300 mm or less, 2,000 mm or more and 2,300 mm or less, 2,300 mm or more and 2,600 mm or less, 2,300 mm or more and 2,400 mm or less, or 2,400 mm or more and 2,600 mm or less.

The ratio of the dimension E21 to the dimension E11 may be, for example, 1.1 or higher, 1.2 or higher, or 1.3 or higher. The ratio of the dimension E21 to the dimension E11 may be, for example, 1.5 or lower, 1.7 or lower, or 2.0 or lower. The range of the ratio of the dimension E21 to the dimension E11 may be defined by a first group of 1.1, 1.2, and 1.3 and/or a second group of 1.5, 1.7, and 2.0. The range of the ratio of the dimension E21 to the dimension E11 may be defined by a combination of any one of the values included in the first group and the any one of the values included in the second group. The range of the ratio of the dimension E21 to the dimension E11 may be defined by any two combinations of the values included in the first group. The range of the ratio of the dimension E21 to the dimension E11 may be defined by any two combinations of the values included in the second group. For example, the ratio of the dimension E21 to the dimension E11 may be 1.1 or higher and 2.0 or lower, 1.1 or higher and 1.7 or lower, 1.1 or higher and 1.5 or lower, 1.1 or higher and 1.3 or lower, 1.1 or higher and 1.2 or lower, 1.2 or higher and 2.0 or lower, 1.2 or higher and 1.7 or lower, 1.2 or higher and 1.5 or lower, 1.2 or higher and 1.3 or lower, 1.3 or higher and 2.0 or lower, 1.3 or higher and 1.7 or lower, 1.3 or higher and 1.5 or lower, 1.5 or higher and 2.0 or lower, 1.5 or higher and 1.7 or lower, or 1.7 or higher and 2.0 or lower.

A specific numerical range of the dimension E11 and a specific numerical range of the dimension E21 may be combined. For example, the dimension E11 may be 1,000 mm or more and 1,200 mm or less, and the dimension E21 may be 1,200 mm or more and 1,300 mm or less. For example, the dimension E11 may be 1,200 mm or more and 1,300 mm or less, and the dimension E21 may be 2,000 mm or more and 2,300 mm or less. For example, the dimension E11 may be 2,100 mm or more and 2,300 mm or less, and the dimension E21 may be 2,400 mm or more and 2,600 mm or less.

The opening 45 has a dimension E12 in the first direction D1 and a dimension E22 in the second direction D2. Increasing the dimensions of the frame 40 allows increasing the dimensions of the opening 45. Increasing the dimensions of the opening 45 allows increasing the area of the mask 50 overlapping with the opening 45 in plan view. This allows for increasing the number of organic devices 100 formed on the single substrate 110. This can reduce the manufacturing cost of the organic devices 100. The term "plan view" translate into viewing the object along the thickness of the mask 50.

The mask 50 is fixed to the first side 41 and the second side 42. In plan view, the mask 50 includes a pair of ends 51 fixed to the first side 41 and the second side 42 and an intermediate portion 52 located between the pair of ends. The pair of ends 51 oppose each other in the first direction D1. The intermediate portion 52 overlaps with the opening 45 in plan view. The intermediate portion 52 includes a through-hole group 53.

The mask apparatus 15 may include N masks 50 arranged in the second direction. The value N is an integer greater than or equal to 2. The value N may be an even number. The mask apparatus 15 shown in FIG. 4 includes 10 masks 50. N may be an odd number, as described later.

The masks 50 may include a central mask group 50C, a first mask group 50A, and a second mask group 50B. The central mask group 50C, the first mask group 50A, and the second mask group 50B each include the mask 50. As shown in FIG. 4, the first mask group 50A is located between the central mask group 50C and the third side 43 in the second direction D2. As shown in FIG. 4, the second mask group 50B is located between the central mask group 50C and the fourth side 44 in the second direction D2.

The central mask group 50C includes one or two masks 50. If N is an even number, the central mask group 50C may include two masks 50. If N is an odd number, the central mask group 50C may include one mask 50. The central mask group 50C shown in FIG. 4 includes a first central mask 50C1 and a second central mask 50C2. The first central mask 50C1 may be located between a second center line Lc2 and the third side 43. The second central mask 50C2 may be located between the second center line Lc2 and the fourth side 44. The second center line Lc2 is a virtual straight line passing through the center of the opening 45 in the second direction D2 and extending in the first direction D1. The first central mask 50C1 or the second central mask 50C2 may overlap with the second center line Lc2 (not shown).

The first mask group 50A include one or more masks 50. The first mask group 50A may include two or more masks 50. The first mask group 50A shown in FIG. 4 includes an 11th mask 50A1, a 12th mask 50A2, a 13th mask 50A3, and a 14th mask 50A4 arranged in order in the direction from the third side 43 to the second center line Lc2.

The second mask group 50B includes one or more masks 50. The second mask group 50B may include two or more masks 50. The number of masks 50 included in the second mask group 50B may be the same as the number of masks 50 included in the first mask group 50A. The second mask group 50B shown in FIG. 4 includes a 21st mask 50B1, a 22nd mask 5062, a 23rd mask 5063, and a 24th mask 50B4 arranged in order in the direction from the fourth side 44 to the second center line Lc2.

The mask apparatus 15 may include a member partially overlapping with the masks 50 in plan view (not shown). The member may be fixed to the sides of the frame 40 across the opening 45. The member may be in contact with the second surface 552 of each mask 50. One example of the member may include a pair of ends fixed to the third side 43 and the fourth side 44. One example of the member may include a pair of ends fixed to the first side 41 and the second side 42 and may be located in the gap between two masks 50 adjacent in the second direction D2.

The frame 40 will be described in detail. The first side 41 and the second side 42 may apply tension to the masks 50 in the first direction D1. For example, the first side 41 and the second side 42 may be elastically deformed in the direction toward the opening 45.

For example, the first side 41 may be located inside a line L11. The line L11 indicates the position of the outer surface 41*a* of the first side 41 before the first side 41 is deformed. Reference sign d11 denotes the amount of deformation of the first side 41 in the first direction D1. The amount of deformation d11 may be increased nearer to the second center line Lc2. The line L11 may be set as a straight line connecting the angles 46 at the opposite ends of the first side 41.

For example, the second side 42 may be located inside a line L12. The line L12 indicates the position of the outer surface 42*a* of the second side 42 before the second side 42 is deformed. Reference sign d12 denotes the amount of deformation of the second side 42 in the first direction D1. The amount of deformation d12 may be larger the nearer to the second center line Lc2. The line L12 may be set as a straight line connecting the angles 46 at the opposite ends of the second side 42.

The term "inside" refers to a position nearer to the opening 45. The term "outside" refers to a position farther from the opening 45.

Figure 5:
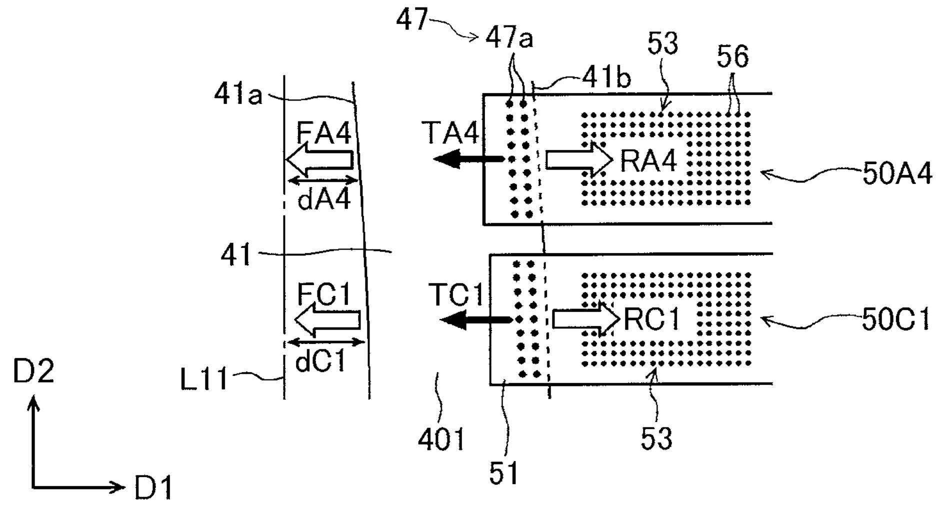
FIG. 5 is an enlarged plan view of a first side of a frame.

FIG. 5 is a partial enlarged plan view of the first side 41. When the first side 41 is elastically deformed inward, an outward restoring force F is generated in the first side 41. Likewise, an outward restoring force is generated also in the second side 42. This causes the masks 50 to be drawn outward in the first direction D1 by the first side 41 and the second side 42. This can eliminate or reduce the distortion and loosening of the masks 50.

In the following description, the tension applied to the masks 50 may be denoted by reference sign TXX. "XX" is any letter or number. For example, the tension applied to the 14th mask 50A4 is denoted by TA4. For example, the tension applied to the first central mask 50C1 is denoted by TC1.

In the following description, the restoring force generated in the first side 41 at the position of a mask 50XX may be denoted by reference sign FXX. For example, the restoring force generated in the first side 41 at the position of the 14th mask 50A4 is denoted by FA4. For example, the restoring force generated in the first side 41 at the position of the first central mask 50C1 is denoted by FC1.

In the following description, the amount of deformation of the first side 41 at the position of the mask 50XX may be denoted by reference sign dXX. For example, the amount of deformation of the first side 41 at the position of the 14th mask 50A4 is denoted by reference sign dA4. For example, the amount of deformation of the first side 41 at the position of the first central mask 50C1 is denoted by reference sign dC1.

The first side 41 and the second side 42 are subjected to a reactive force from the masks 50. In the following description, the reactive force that the first side 41 receives from a mask 50XX may be denoted by reference sign RXX. For example, the reactive force that the first side 41 receives from the 14th mask 50A4 is denoted by reference sign RA4. For example, the reactive force that the first side 41 receives from the first central mask 50C1 is denoted by reference sign RC1.

In describing the configuration common to the masks 50 in the following description, the term and reference sign "mask 50" may be used. In describing the characteristics, such as a tension, a restoring force, and a reactive force, common to the masks 50, the terms and reference signs "tension T", "restoring force F", and "reactive force R" may be used, respectively.

The mask 50 is fixed to the first side 41 and the second side 42 by a fixing portion 47. The fixing portion 47 includes a welded portion 47*a*, as shown in FIG. 5, for example. The welded portion 47*a* is a portion formed by melting part of the mask 50 and part of the frame 40 each other. The welded portion 47*a* is formed, for example, by applying laser light to the end 51 of the mask 50 overlapping with the first frame surface 401 of the frame 40. The fixing portion 47 may include a plurality of welded portions 47*a*. The welded portions 47*a* may be arranged along the inner edge of the first side 41 in plan view.

Figure 6:
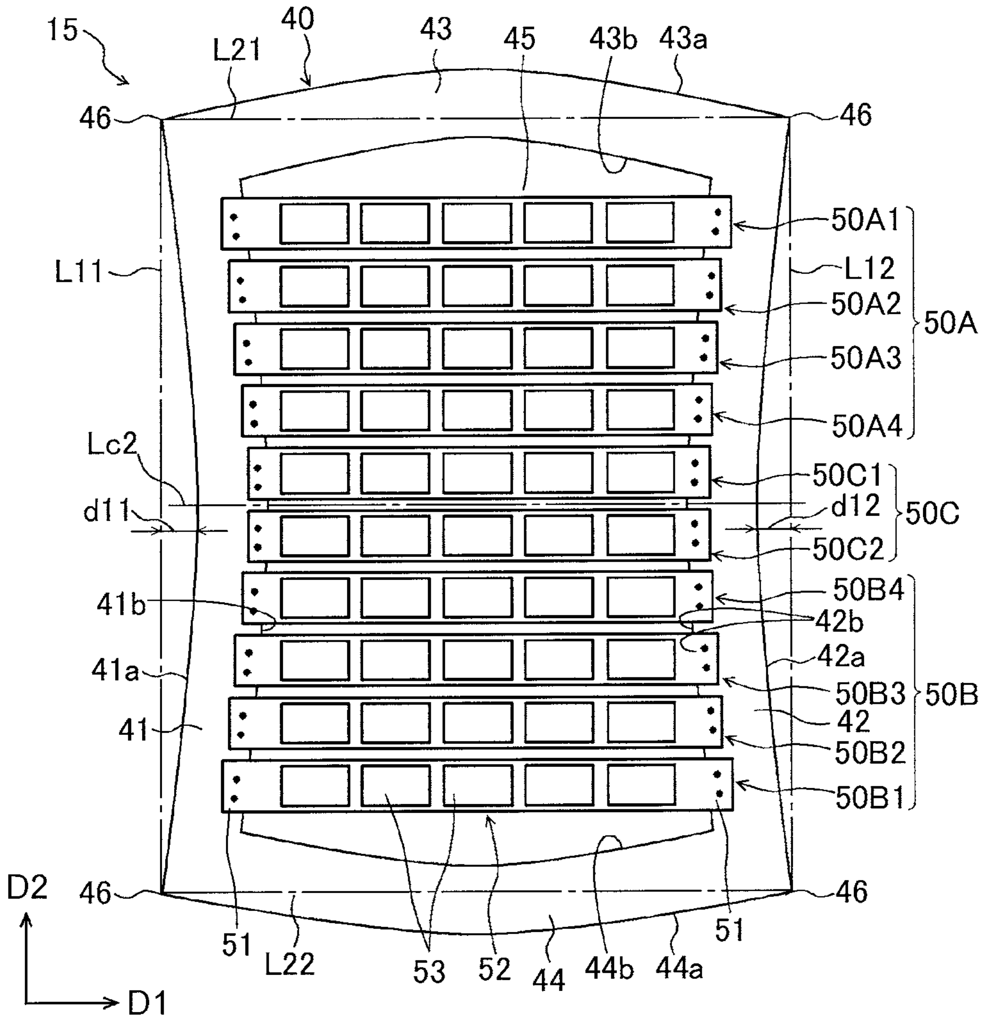
FIG. 6 is a plan view of an example of the mask apparatus.

Third side 43 and the fourth side 44 will be described. As shown in FIG. 4, the third side 43 and the fourth side 44 do not have to be elastically deformed. Alternatively, the third side 43 and the fourth side 44 may be elastically deformed. FIG. 6 is a plan view of an example of the mask apparatus 15.

As shown in FIG. 6, the third side 43 and the fourth side 44 may be elastically deformed outward. A straight line L21 indicates the position of the outer surface 43*a* of the third side 43 before the third side 43 is deformed. A straight line L22 indicates the position of the outer surface 44*a* of the fourth side 44 before the fourth side 44 is deformed.

The dimensions of the frame 40 will be described. The dimensions of the frame 40 are set so as to appropriately generate a restoring force F. The first side 41 has a width W1. The width W1 is the dimension of the first side 41 in the first direction D1. The width W1 may be, for example, 20 mm or more, 60 mm or more, or 100 mm or more. The width W1 may be, for example, 150 mm or less, 200 mm or less, or 250 mm or less. The range of the width W1 may be defined by a first group of 20 mm, 60 mm, and 100 mm and/or a second group of 150 mm, 200 mm, and 250 mm. The range of the width W1 may be defined by a combination of any one of the values included in the first group and any one of the values included in the second group. The range of the width W1 may be defined by any two combinations of the values included in the first group. The range of the width W1 may be defined by any two combinations of the values included in the second group. For example, the width W1 may be 20 mm or more and 250 mm or less, 20 mm or mores and 200 mm or less, 20 mm or more and 150 mm or less, 20 mm or more and 100 mm or less, 20 mm or more and 60 mm or less, 60 mm or more and 250 mm or less, 60 mm or more and 200 mm or less, 60 mm or more and 150 mm or less, 60 mm or more and 100 mm or less, 100 mm or more and 250 mm or less, 100 mm or more and 200 mm or less, 100 mm or more and 150 mm or less, 150 mm or more and 250 mm or less, 150 mm or more and 200 mm or less, or 200 mm or more and 250 mm or less.

The first side 41 has a cross-sectional area B1. The cross-sectional area B1 is a cross-sectional area of the first side 41 cut along a plane perpendicular to the second direction D2. The cross-sectional area B1 may be, for example, 600 $mm^2$ or more, 1,800 $mm^2$ or more, or 3,000 $mm^2$ or more. The cross-sectional area B1 may be, for example, 4,500 $mm^2$ or less, 6,000 $mm^2$ or less, or 7,500 $mm^2$ or less. The range of the cross-sectional area B1 may be defined by a first group of 600 $mm^2$, 1,800 $mm^2$, and 3,000 $mm^2$ and/or a second group of 4,500 $mm^2$, 6,000 $mm^2$, and 7,500 $mm^2$. The range of the cross-sectional area B1 may be defined by a combination of any one of the values included in the first group and any one of the values included in the second group. The range of the cross-sectional area B1 may be defined by any two combinations of the values included in the first group. The range of the cross-sectional area B1 may be defined by any two combinations of the values included in the second group. For example, the cross-sectional area B1 may be 600 $mm^2$ or more and 7,500 $mm^2$ or less, 600 $mm^2$ or more and 6,000 $mm^2$ or less, 600 $mm^2$ or more and 4,500 $mm^2$ or less, 600 $mm^2$ or more and 3,000 $mm^2$ or less, 600 $mm^2$ or more and 1,800 $mm^2$ or less, 1,800 $mm^2$ or more and 7,500 $mm^2$ or less, 1,800 $mm^2$ or more and 6,000 $mm^2$ or less, 1,800 $mm^2$ or more and 4,500 $mm^2$ or less, 1,800 $mm^2$ or more and 3,000 $mm^2$ or less, 3,000 $mm^2$ or more and 7,500 $mm^2$ or less, 3,000 $mm^2$ or more and 6,000 $mm^2$ or less, 3,000 $mm^2$ or more and 4,500 $mm^2$ or less, 4,500 $mm^2$ or more and 7,500 $mm^2$ or less, 4,500 $mm^2$ or more and 6,000 $mm^2$ or less, or 6,000 $mm^2$ or more and 7,500 $mm^2$ or less.

The numerical ranges of the width of the second side 42, the width of the third side 43, and the width of the fourth side 44 may be the same as the numerical range of the width W1 described above. The numerical ranges of the cross-sectional area of the second side 42, the cross-sectional area of the third side 43, and the cross-sectional area of the fourth side 44 may be the same as the numerical range of the cross-sectional area B1 described above.

Figure 7:
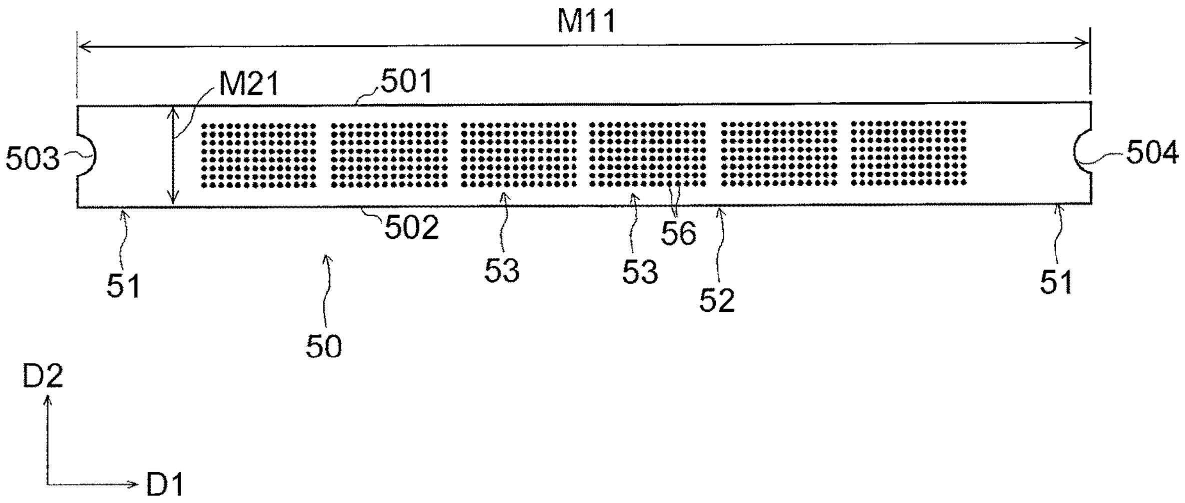
FIG. 7 is a plan view of an example of a mask.

The mask 50 will be described in detail. FIG. 7 is a plan view of an example of the mask 50. The mask 50 may include a first side edge 501 and a second side edge 502 extending in the first direction D1 and a first end 503 and a second end 504 in plan view. The first end 503 and the second end 504 are the ends of the mask 50 in the first direction D1.

The through-hole group 53 of the intermediate portion 52 includes a plurality of through-holes 56 arranged regularly in plan view. The through-holes 56 may be arranged at regular intervals in two directions. For example, the through-holes 56 may be arranged at regular intervals in the first direction D1 and the second direction D2.

One through-hole group 53 corresponds to one organic device 100. For example, a plurality of first organic layers 130A included in a single organic device 100 is made of a deposition material that has passed through the plurality of through-holes 56 of the through-hole group 53. The mask 50 includes at least one through-hole group 53. The mask 50 may include two or more through-hole groups 53 arranged in the first direction D1.

The mask 50 has a dimension M11 in the first direction D1. The dimension M11 may be, for example, 600 mm or more, 800 mm or more, or 1,000 mm or more. The dimension M11 may be, for example, 1,200 mm or less, 1,500 mm or less, or 2,000 mm or less. The range of the dimension M11 may be defined by a first group of 600 mm, 800 mm, and 1,000 mm and/or a second group of 1,200 mm, 1,500 mm, and 2,000 mm. The range of the dimension M11 may be defined by a combination of any one of the values included in the first group and any one of the values included in the second group. The range of the dimension M11 may be defined by any two combinations of the values included in the first group. The range of the dimension M11 may be defined by any two combinations of the values included in the second group. For example, the dimension M11 may be 600 mm or more and 2,000 mm or less, 600 mm or more and 1,500 mm or less, 600 mm or more and 1,200 mm or less, 600 mm or more and 1,000 mm or less, 600 mm or more and 800 mm or less, 800 mm or more and 2,000 mm or less, 800 mm or more and 1,500 mm or less, 800 mm or more and 1,200 mm or less, 800 mm or more and 1,000 mm or less, 1,000 mm or more and 2,000 mm or less, 1,000 mm or more and 1,500 mm or less, 1,000 mm or more and 1,200 mm or less, 1,200 mm or more and 2,000 mm or less, 1,200 mm or more and 1,500 mm or less, or 1,500 mm or more and 2,000 mm or less.

The mask 50 has a dimension M21 in the second direction D2. The dimension M21 may be, for example, 50 mm or more, 100 mm or more, or 150 mm or more. The dimension M21 may be, for example, 200 mm or less, 300 mm or less, or 410 mm or less. The range of the dimension M21 may be defined by a first group of 50 mm, 100 mm, and 150 mm and/or a second group of 200 mm, 300 mm, and 410 mm. The range of the dimension M21 may be defined by a combination of any one of the values included in the first group and any one of the values included in the second group. The range of the dimension M21 may be defined by any two combinations of the values included in the first group. The range of the dimension M21 may be defined by any two combinations of the values included in the second group. For example, the dimension M21 may be 50 mm or more and 410 mm or less, 50 mm or more and 300 mm or less, 50 mm or more and 200 mm or less, 50 mm or more and 150 mm or less, 50 mm or more and 100 mm or less, 100 mm or more and 410 mm or less, 100 mm or more and 300 mm or less, 100 mm or more and 200 mm or less, 100 mm or more and 150 mm or less, 150 mm or more and 410 mm or less, 150 mm or more and 300 mm or less, 150 mm or more and 200 mm or less, 200 mm or more and 410 mm or less, 200 mm or more and 300 mm or less, or 300 mm or more and 410 mm or less.

Figure 8:
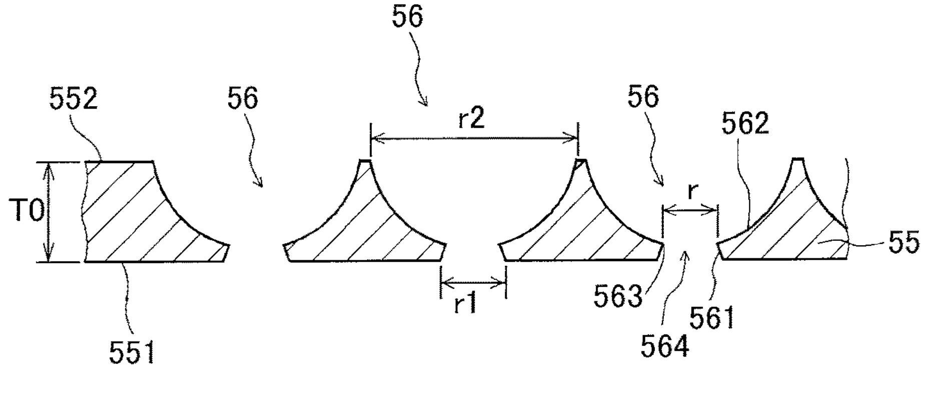
FIG. 8 is a cross-sectional view of an example of the mask.

Next, the cross-section structure of the mask 50 will be described. FIG. 8 is a cross-sectional view of an example of the mask 50.

The mask 50 includes a base material 55 and the through-holes 56 passing through the base material 55. The base material 55 includes the first surface 551 and the second surface 552. The through-holes 56 pass through the base material 55 from the first surface 551 to the second surface 552.

Each through-hole 56 may include a first recess 561, a second recess 562, and a connecting portion 563 connecting the first recess 561 and the second recess 562 together. The first recess 561 is a recess located in the first surface 551 and recessed toward the second surface 552. The second recess 562 is a recess located in the second surface 552 and recessed toward the first surface 551. The through-hole 56 is formed by connecting the first recess 561 and the second recess 562 together. The first recess 561 is formed by processing, for example, etching or laser machining, the base material 55 from the first surface 551. The second recess is formed by processing, for example, etching or laser machining, the base material 55 from the second surface 552.

The first recess 561 has a dimension r1 in plan view. The second recess 562 has a dimension r2 in plan view. The dimension r2 may be larger than the dimension r1. For example, the outline of the second recess 562 may surround the outline of the first recess 561 in plan view.

The connecting portion 563 may have an outline that continues along the periphery. The connecting portion 563 may be located between the first surface 551 and the second surface 552. The connecting portion 563 may define a through-hole portion 564 at which the opening area of the through-hole 56 is smallest in plan view of the mask 50.

The dimension r of the through-hole portion 564 may be, for example, 10 μm or more, 15 μm or more, 20 μm or more, or 25 μm or more. The dimension r of the through-hole portion 564 may be, for example, 40 μm or less, 45 μm or less, 50 μm or less, or 55 μm or less. The range of the dimension r of the through-hole portion 564 may be defined by a first group of 10 μm, 15 μm, 20 μm, and 25 μm and/or a second group of 40 μm, 45 μm, 50 μm, and 55 μm. The range of the dimension r of the through-hole portion 564 may be defined by a combination of any one of the values included in the first group and any one of the values included in the second group. The range of the dimension r of the through-hole portion 564 may be defined by any two combinations of the values included in the first group. The range of the dimension r of the through-hole portion 564 may be defined by any two combinations of the values included in the second group. For example, the dimension r of the through-hole portion 564 may be 10 μm or more and 55 μm or less, 10 μm or more and 50 μm or less, 10 μm or more and 45 μm or less, 10 μm or more and 40 μm or less, 10 μm or more and 25 μm or less, 10 μm or more and 20 μm or less, 10 μm or more and 15 μm or less, 15 μm or more and 55 μm or less, 15 μm or more and 50 μm or less, 15 μm or more and 45 μm or less, 15 μm or more and 40 μm or less, 15 or more and 25 μm or less, 15 μm or more and 20 μm or less, 20 μm or more and 55 μm or less, 20 μm or more and 50 μm or less, 20 μm or more and 45 μm or less, 20 μm or more and 40 μm or less, 20 μm or more and 25 μm or less, 25 μm or more and 55 μm or less, 25 μm or more and 50 μm or less, 25 or more and 45 μm or less, 25 μm or more and 40 μm or less, 40 μm or more and 55 μm or less, 40 μm or more and 50 μm or less, 40 μm or more and 45 μm or less, 45 μm or more and 55 μm or less, 45 μm or more and 50 μm or less, or 50 μm or more and 55 μm or less.

The dimension r of the through-hole portion 564 is defined by light passing through the through-hole 56. Specifically, parallel light is let into one of the first surface 551 and the second surface 552 of the mask 50 along the direction normal to the mask 50 and is let out of the other of the first surface 551 and the second surface 552 through the through-hole 56. The dimension of the area that the outgoing light takes in the planar direction of the mask 50 is adopted as the dimension r of the through-hole portion 564.

FIG. 8 shows an example in which the second surface 552 of the base material 55 remains between the two adjacent second recesses 562. However, this is not intended to limit the present disclosure. Two adjacent second recesses 562 may be connected by etching (not shown). In other words, there may be an area where the second surface 552 of the base material 55 does not remain between the two adjacent second recesses 562.

The material for the mask 50 and the frame 40 will be described. The main material for the mask 50 and the frame 40 may be an iron alloy containing nickel. The iron alloy may contain cobalt in addition to nickel. An example material for the base material 55 of the mask 50 is an iron alloy containing nickel and cobalt of 28% by mass or more and 54% by mass or less in total in which the content of the cobalt is 0% by mass or more and 6% by mass or less. This can decrease the difference between the coefficient of thermal expansion of the mask 50 and the frame 40 and the coefficient of thermal expansion of the substrate 110 that contains glass. This allows for eliminating or reducing a decrease in the dimensional accuracy and the positional accuracy of the layer formed on the substrate 110 by a vapor deposition process due to the thermal expansion of the mask 50, the frame 40, the substrate 110, and so on.

The total amount of the content of the nickel and the content of the cobalt in the base material 55 may be 28% by mass or more and 38% by mass or less. In this case, specific examples of the iron alloy containing nickel and the iron alloy containing nickel and cobalt include an invar material, a super-invar material, and an ultra-invar material. The invar material is an iron alloy containing 34% by mass or more and 38% by mass or less of nickel, the balance being iron and incidental impurities. The super-invar material is an iron alloy containing 30% by mass or more and 34% by mass or less of nickel and cobalt, the balance being iron and incidental impurities. The ultra-invar material is an iron alloy containing 28% by mass or more and 34% by mass or less of nickel, 2% by mass or more and 7% by mass or less of cobalt, 0.1% by mass or more and 1.0% by mass or less of manganese, 0.10% by mass or less of silicon, and 0.01% by mass or less of carbon, the balance being iron and incidental impurities.

The total of the content of nickel and the content of cobalt in the mask 50 may be 38% by mass or more and 54% by mass or less. For example, the mask 50 may be composed of an iron alloy containing 38% by mass or more and 54% by mass or less of nickel, the balance being iron and incidental impurities. The mask 50 may be manufactured by plating.

If the temperatures of the mask 50, the frame 40, and the substrate 110 do not become high during the vapor deposition process, the coefficient of thermal expansion of the mask 50 and the frame 40 do not need to be equal to the coefficient of thermal expansion of the substrate 110. In this case, the mask 50 may be made of a material other than the materials of the iron alloys described above. For example, another iron alloy other than the iron alloys containing nickel, such as an iron alloy containing chromium, may be used. An example of the iron alloy containing chromium is an iron alloy referred to as stainless steel. Alternatively, an alloy other than the iron alloys, such as a nickel alloy or a nickel-cobalt alloy, may be used.

The thickness T0 of the mask 50 may be, for example, 8 μm or more, 10 μm or more, 13 μm or more, or 15 μm or more. The thickness T0 may be, for example, 20 μm or less, 30 μm or less, 40 μm or less, or 50 μm or less. The range of the thickness T0 may be defined by a first group of 8 μm, 10 μm, 13 μm, and 15 μm and/or a second group of 20 μm, 30 μm, 40 μm, and 50 μm. The range of the thickness T0 may be defined by a combination of any one of the values included in the first group and any one of the values included in the second group. The range of the thickness T0 may be defined by any two combinations of the values included in the first group. The range of the thickness T0 may be defined by any two combinations of the values included in the second group. For example, the thickness T0 may be 8 μm or more and 50 μm or less, 8 μm or more and 40 μm or less, 8 μm or more and 30 μm or less, 8 μm or more and 20 μm or less, 8 μm or more and 15 μm or less, 8 μm or more and 13 μm or less, 8 μm or more and 10 μm or less, 10 μm or more and 50 μm or less, 10 μm or more and 40 μm or less, 10 μm or more and 30 μm or less, 10 μm or more and 20 μm or less, 10 μm or more and 15 μm or less, 10 μm or more and 13 μm or less, 13 μm or more and 50 μm or less, 13 μm or more and 40 μm or less, 13 μm or more and 30 μm or less, 13 μm or more and 20 μm or less, 13 μm or more and 15 μm or less, 15 μm or more and 50 μm or less, 15 μm or more and 40 μm or less, 15 μm or more and 30 μm or less, 15 μm or more and 20 μm or less, 20 μm or more and 50 μm or less, 20 μm or more and 40 μm or less, 20 μm or more and 30 or less, 30 μm or more and 50 μm or less, 30 μm or more and 40 μm or less, or 40 μm or more and 50 μm or less.

Setting the thickness to T0 50 μm or less allows eliminating or reducing attachment of the deposition material 7 to the wall of the through-holes 56 before passing through the through-holes 56. This can increase the use efficiency of the deposition material 7. Setting the thickness T0 to 8 μm or more allows providing the mask 50 with sufficient strength, thereby eliminating or reducing damage and deformation of the mask 50.

A contact measuring method is employed to measure the thickness T0. As the contact measuring method, a length gauge HEIDENHAIM-METRO "MT1271" made by Heidenhain Ltd. and having a ball-bush guided plunger is used.

Figure 9:
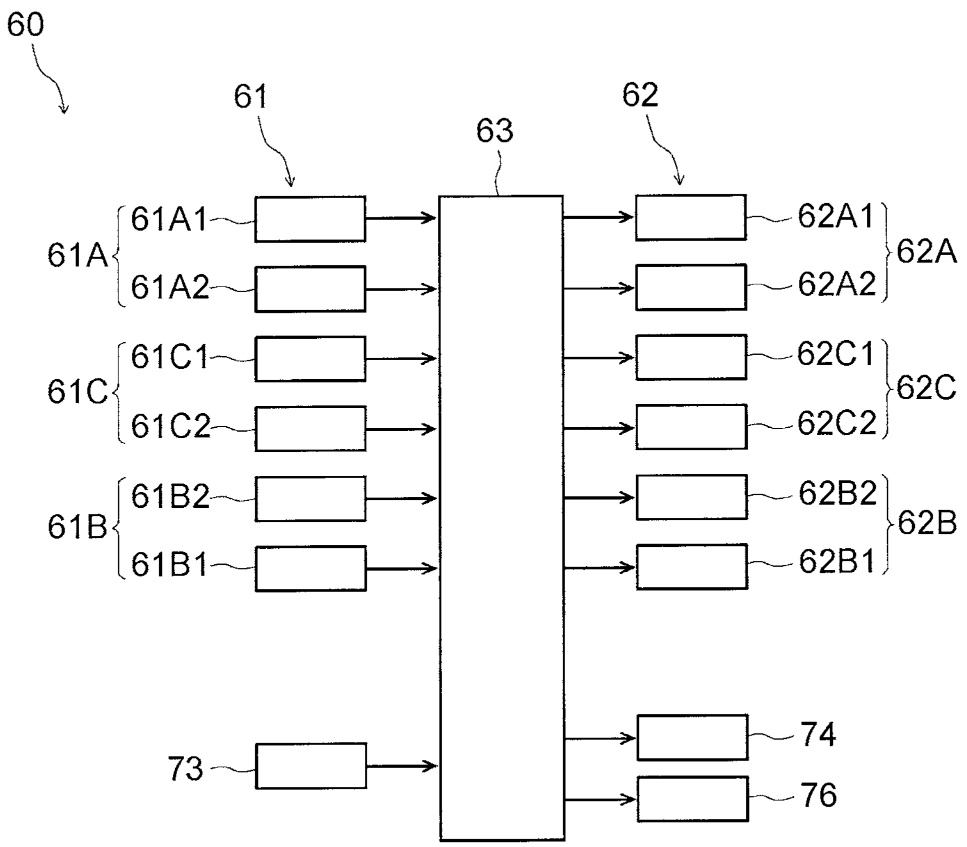
FIG. 9 is a block diagram illustrating an example of a manufacturing apparatus for the mask apparatus.
Figure 10:
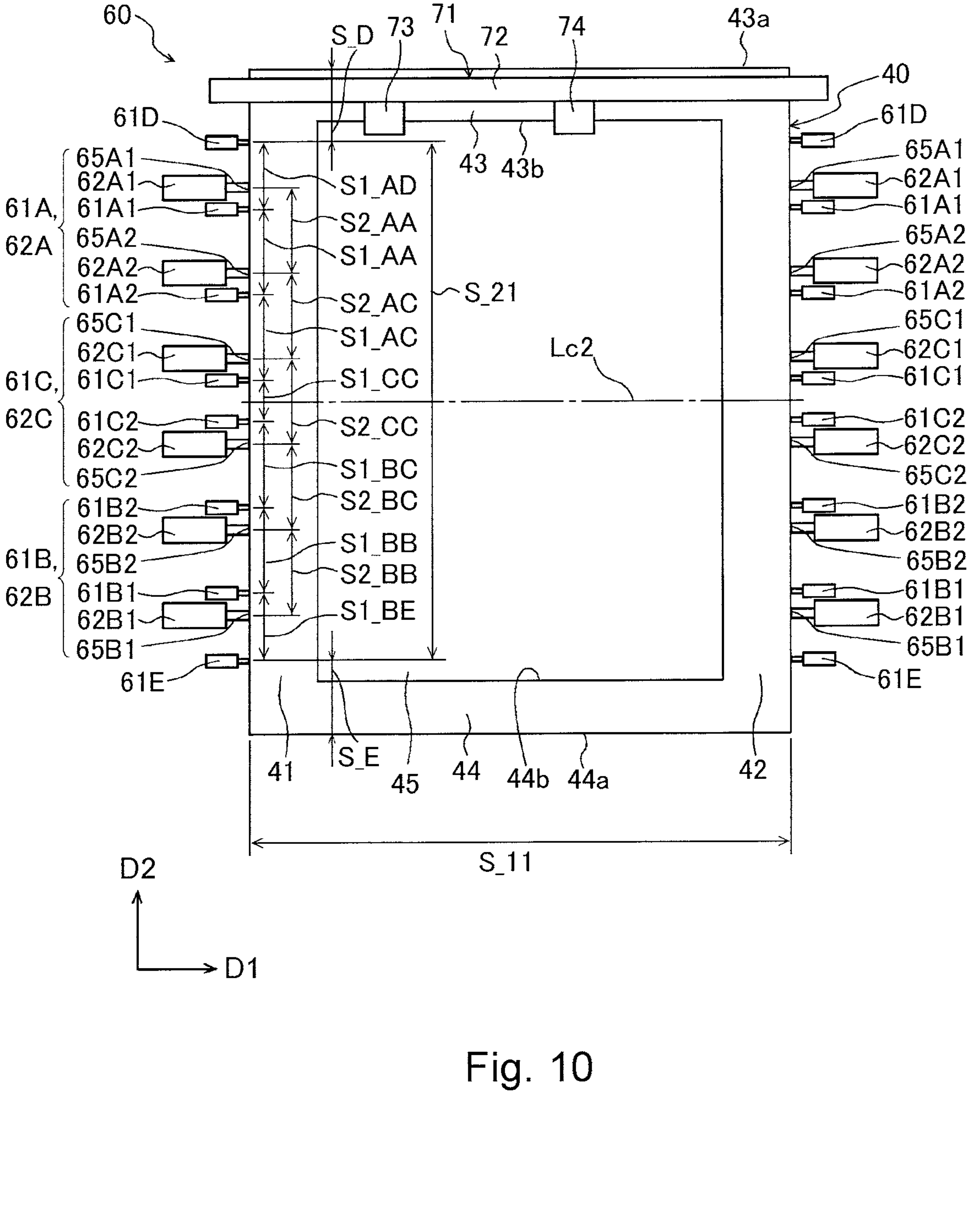
FIG. 10 is a plan view of an example of the manufacturing apparatus.

Next, a manufacturing apparatus for manufacturing the mask apparatus 15 will be described. FIG. 9 is a block diagram illustrating an example of the manufacturing apparatus 60. FIG. 10 is a plan view of an example of the manufacturing apparatus 60. The manufacturing apparatus 60 may include a pressing mechanism 62, a displacement measuring mechanism 61, and a control unit 63. The manufacturing apparatus 60 may include an observation unit 73, a fixing unit 74, and a tension unit 76.

The pressing mechanism 62 presses the first side 41 and the second side 42 of the frame 40 in the direction toward the opening 45. For example, the pressing mechanism 62 presses the first side 41 and the second side 42 inward in the first direction D1. The displacement measuring mechanism 61 measures the amount of deformation of the first side 41 and the amount of deformation of the second side 42 in the first direction D1.

The control unit 63 controls the pressing mechanism 62 on the basis of information on the amounts of deformation of the first side 41 and the second side 42. When the first side 41 and the second side 42 are elastically deformed inward, an external restoring force is generated in the first side 41 and the second side 42. This causes the mask 50 to be drawn outward in the first direction D1 by the first side 41 and the second side 42. The tension to be applied to the mask 50 can be adjusted by adjusting the amounts of deformation of the first side 41 and the second side 42. The tension to be applied to the mask 50 can be appropriately adjusted by controlling the pressing mechanism 62 so that the amounts of deformation of the first side 41 and the second side 42 reach a target amount of deformation.

The function of the control unit 63 may be performed by software operating in a personal computer or another computer. For example, a computer may be used as the control unit 63 by installing programs in the computer.

The programs may be installed in advance in the computer before the shipment of the computer, or alternatively, may be installed in the computer after the shipment of the computer using a computer-readable non-transitory storage medium in which the programs are stored. The storage medium may be of any type. Examples include portable storage media, such as a magnetic disk and an optical disk, and fixed storage media, such as a hard disk drive and a memory. The programs may be delivered via a communication line, such as the Internet. In the case where the programs are delivered via a communication line, a server for the delivery includes a storage medium that at least temporarily stores the programs according to this embodiment.

The observation unit 73 observes the mask 50. The observation unit 73 includes, for example, a camera. The observation unit 73 detects the through-holes 56 and the outline of the mask 50. The observation unit 73 may detect a mark formed at the mask 50.

The observation unit 73 may be supported by a moving mechanism 71. The moving mechanism 71 moves the observation unit 73 in the first direction D1 or the second direction D2. For example, the moving mechanism 71 may include a first moving unit 72 that moves the observation unit 73 in the first direction D1. The moving mechanism 71 may include a second moving unit that moves the first moving unit 72 in the second direction D2. Information about the position of the mask 50 relative to the frame 40 can be obtained by having the observation unit 73 observe the mask 50 at multiple positions.

The tension unit 76 applies tension in the first direction D1 to the mask 50 not fixed to the frame 40. The tension unit 76 includes, for example, a clamp (described later). The tension unit 76 can convey the mask 50 in the in-plane direction of the first frame surface 401 of the frame 40.

The fixing unit 74 fixes the mask 50 to the first side 41 and the second side 42. The fixing unit 74 applies, for example, laser light, to the mask 50. Since the welded portion 47*a* is formed between the mask 50 and the frame 40, the mask 50 is fixed to the frame 40. The fixing unit 74 may fix the mask 50 to the frame 40, with the mask 50 subjected to tension by the tension unit 76.

The fixing unit 74 may be supported by the moving mechanism 71. The moving mechanism 71 that moves the fixing unit 74 may be either the same as or different from the moving mechanism 71 that moves the observation unit 73.

The control unit 63 may control the tension unit 76 and the fixing unit 74 on the basis of information from the observation unit 73. For example, the control unit 63 controls the tension unit 76 so that the through-holes 56, the outline, and the mark at the mask 50 move to target positions. For example, the control unit 63 controls the position of the tension unit 76 and the tension that the tension unit 76 applies to the mask 50. If the difference between the actual position of the mask 50 and the target position is a threshold or less, the control unit 63 may fix the mask 50 to the frame 40 by controlling the fixing unit 74.

The control unit 63 that controls the tension unit 76 and the fixing unit 74 may be the same as or different from the control unit 63 that controls the pressing mechanism 62.

The pressing mechanism 62 will be described in detail. The pressing mechanism 62 that presses the first side 41 may include a plurality of pressing units. Preferably, the pressing mechanism 62 includes five or more pressing units that presses the first side 41. For example, the pressing mechanism 62 may include six pressing units that press the first side 41. The pressing units may press the outer surface 41*a* of the first side 41 inward.

The pressing units that press the first side 41 may be classified into a central group 62C, a first group 62A, and a second group 62B. As shown in FIG. 10, the first group 62A is located between the central group 62C and the third side 43 in the second direction D2. The second group 62B is located between the central group 62C and the fourth side 44 in the second direction D2.

The central group 62C includes one or two pressing units. If N, which indicates the number of masks 50, described above is an even number, the central group 62C may include two pressing units. If N is an odd number, the central group 62C may include one pressing unit. In this embodiment, the central group 62C includes a first central pressing unit 62C1 and a second central pressing unit 62C2. As shown in FIG. 10, the first central pressing unit 62C1 may be located between the second center line Lc2 and the third side 43. The second central pressing unit 62C2 may be located between the second center line Lc2 and the fourth side 44. The first central pressing unit 62C1 or the second central pressing unit 62C2 may overlap with the second center line Lc2 (not shown).

The first group 62A includes two or more pressing units. In this embodiment, the first group 62A includes an 11th pressing unit 62A1 and a 12th pressing unit 62A2 arranged in order in the direction from the third side 43 to the second center line Lc2.

The second group 62B includes two or more pressing units. The number of pressing units included in the second group 62B may be the same as the number of pressing units included in the first group 62A. In this embodiment, the second group 62B includes a 21st pressing unit 62B1 and a 22nd pressing unit 61B2 arranged in order in the direction from the fourth side 44 to the second center line Lc2.

The pressing units may be arranged at intervals in the second direction D2. In the example shown in FIG. 10, the 11th pressing unit 62A1, the 12th pressing unit 62A2, the first central pressing unit 62C1, the second central pressing unit 62C2, the 22nd pressing unit 62B2, and the 21st pressing unit 62B1 are arranged in order in the direction from the third side 43 to the fourth side 44.

Preferably, the interval between two pressing units adjacent in the second direction D2 is 500 mm or less. The amounts of deformation of the first side 41 at the individual positions of the first side 41 can be accurately adjusted by decreasing the interval. This can eliminate or reduce deviation of the tension that the first side 41 applies to the individual masks 50 from a target tension. The interval is calculated on the basis of the positions of the centers of the portions of the pressing units that are in contact with the first side 41. Reference signs 65A1, 65A2, 65C1, 65C2, 65B2, and 65B1 denote the portions of the 11th pressing unit 62A1, the 12th pressing unit 62A2, the first central pressing unit 62C1, the second central pressing unit 62C2, the 22nd pressing unit 62B2, and the 21st pressing unit 62B1 that are in contact with the first side 41.

The interval between two adjacent pressing units may be, for example, 50 mm or more, 100 mm or more, or 200 mm or more. The interval between two adjacent pressing units may be, for example, 300 mm or less, 400 mm or less, or 500 mm or less. The range of the interval between two adjacent pressing units may be defined by a first group of 50 mm, 100 mm, and 200 mm and/or a second group of 300 mm, 400 mm, and 500 mm. The range of the interval between two adjacent pressing units may be defined by a combination of any one of the values included in the first group and any one of the values included in the second group. The range of the interval between two adjacent pressing units may be defined by any two combinations of the values included in the first group. The range of the interval between two adjacent pressing units may be defined by any two combinations of the values included in the second group. For example, the interval between two adjacent pressing units may be 50 mm or more and 500 mm or less, 50 mm or more and 400 mm or less, 50 mm or more and 300 mm or less, 50 mm or more and 200 mm or less, 50 mm or more and 100 mm or less, 100 mm or more and 500 mm or less, 100 mm or more and 400 mm or less, 100 mm or more and 300 mm or less, 100 mm or more and 200 mm or less, 200 mm or more and 500 mm or less, 200 mm or more and 400 mm or less, 200 mm or more and 300 mm or less, 300 mm or more and 500 mm or less, 300 mm or more and 400 mm or less, or 400 mm or more and 500 mm or less.

Reference sign S2_AA denotes the interval between two pressing units that belong to the first group 62A. Reference sign S2_AC denotes the interval between a pressing unit that belongs to the first group 62A and a pressing unit that belongs to the central group 62C. Reference sign S2_CC denotes the interval between two pressing units that belongs to the central group 62C. Reference sign S2_BC denotes the interval between a pressing unit that belongs to the second group 62B and a pressing unit that belongs to the central group 62C. Reference sign S2_BB denotes the interval between two pressing units that belong to the second group 62B. The interval S2_AA, the interval S2_AC, the interval S2_CC, the interval S2_BC, and the interval S2_BB may be the same or differ from one another.

The pressing mechanism 62 that presses the second side 42 may also include a plurality of pressing units. Preferably, the pressing mechanism 62 include five or more pressing units that press the second side 42. In the example shown in FIG. 10, the pressing mechanism 62 includes six pressing units that press the second side 42. The individual pressing units may press the outer surface 42*a* of the second side 42 inward.

The configuration of the pressing units that press the second side 42 may be the same as the configuration of the pressing units that press the first side 41. For example, as shown in FIG. 10, the pressing mechanism 62 may include an 11th pressing unit 62A1, a 12th pressing unit 62A2, a first central pressing unit 62C1, a second central pressing unit 62C2, a 22nd pressing unit 62B2, and a 21st pressing unit 62B1 that are arranged in order in the direction from the third side 43 to the fourth side 44 and that press the second side 42.

Preferably, the interval between two pressing units located on the second side 42 and adjacent in the second direction D2 is also 500 mm or less. The numerical range of the interval between two adjacent pressing units located on the second side 42 and adjacent in the second direction D2 may be the same as the numerical range of the interval between two pressing units located on the first side 41 and adjacent in the second direction D2. The pressing unit located on the first side 41 and the pressing unit located on the second side 42 may be arranged side by side in the first direction D1. For example, the first central pressing unit 62C1 located on the first side 41 and the first central pressing unit 62C1 located on the second side 42 may be at the same coordinate in the second direction D2.

Reference sign S_11 shown in FIG. 10 denotes the distance in the first direction D1 between the pressing unit that presses the first side 41 and the pressing unit that presses the second side 42. Distance S_11 may be, for example, 1,300 mm or more, 1,500 mm or more, or 1,700 mm or more. The distance S_11 may be, for example, 1,900 mm or less, 2,100 mm or less, or 2,400 mm or less. The range of the distance S_11 may be defined by a first group of 1,300 mm, 1,500 mm, and 1,700 mm and/or a second group of 1,900 mm, 2,100 mm, and 2,400 mm. The range of the distance S_11 may be defined by a combination of any one of the values included in the first group and any one of the values included in the second group. The range of the distance S_11 may be defined by any two combinations of the values included in the first group. The range of the distance S_11 may be defined by any two combinations of the values included in the second group. For example, the distance S_11 may be 1,300 mm or more and 2,400 mm or less, 1,300 mm or more and 2,100 mm or less, 1,300 mm or more and 1,900 mm or less, 1,300 mm or more and 1,700 mm or less, 1,300 mm or more and 1,500 mm or less, 1,500 mm or more and 2,400 mm or less, 1,500 mm or more and 2,100 mm or less, 1,500 mm or more and 1,900 mm or less, 1,500 mm or more and 1,700 mm or less, 1,700 mm or more and 2,400 mm or less, 1,700 mm or more and 2,100 mm or less, 1,700 mm or more and 1,900 mm or less, 1,900 mm or more and 2,400 mm or less, 1,900 mm or more and 2,100 mm or less, or 2,100 mm or more and 2,400 mm or less.

Components common among the pressing units may each be denoted by the term and reference sign "pressing unit 62*x*".

The displacement measuring mechanism 61 will be described in detail. The displacement measuring mechanism 61 that measures the amount of deformation of the first side 41 may include a plurality of displacement meters. Preferably, the displacement measuring mechanism 61 includes displacement meters that measure the amounts of deformation of the first side 41 near the individual pressing units. Preferably, the number of displacement meters that measure the amounts of deformation of the first side 41 is larger than or equal to the number of pressing units that press the first side 41. For example, if the number of pressing units that press the first side 41 is five, the displacement measuring mechanism 61 preferably includes five or more displacement meters. This allows for placing the displacement meters near all of the pressing units.

The displacement meters that measure the amount of deformation of the first side 41 near the pressing units may be classified into a central measurement group 61C, a first measurement group 61A, and a second measurement group 61B, as shown in FIG. 9. The first measurement group 61A is located between the central measurement group 61C and the third side 43 in the second direction D2. The second measurement group 61B is located between the central measurement group 61C and the fourth side 44 in the second direction D2.

The central measurement group 61C includes one or two displacement meters. If the central group 62C of the pressing mechanism 62 includes one pressing unit, the central measurement group 61C may include one displacement meter. If the central group 62C includes two pressing units, the central measurement group 61C may include two displacement meters. In this embodiment, the central measurement group 61C includes a first central displacement meter 61C1 and a second central displacement meter 61C2. The first central displacement meter 61C1 is located near the first central pressing unit 62C1. The second central displacement meter 61C2 is located near the second central pressing unit 62C2.

The first measurement group 61A includes two or more displacement meters. In this embodiment, the first measurement group 61A includes an 11th displacement meter 61A1 and a 12th displacement meter 61A2 arranged in order in the direction from the third side 43 to the second center line Lc2. The 11th displacement meter 61A1 is located near the 11th pressing unit 62A1. The 12th displacement meter 61A2 is located near the 12th pressing unit 62A2.

The second measurement group 61B includes two or more displacement meters. In this embodiment, the second measurement group 61B includes a 21st displacement meter 61B1 and a 22nd displacement meter 61B2 arranged in order in the direction from the fourth side 44 to the second center line Lc2. The 21st displacement meter 61B1 is located near the 21st pressing unit 62B1. The 22nd displacement meter 61B2 is located near the 22nd pressing unit 62B2.

Components common among the displacement meters may be expressed using the term and reference sign "displacement meter 61*x*".

Figure 11:
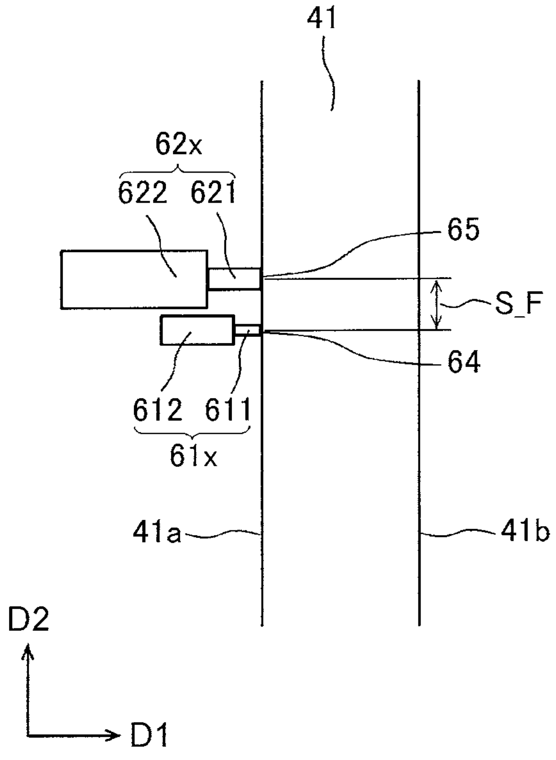
FIG. 11 is a plan view of an example of a pressing unit and a displacement meter.

FIG. 11 is a diagram illustrating an example of the pressing unit 62*x* and the displacement meter 61*x*. The displacement meter 61*x* is located near the pressing unit 62*x*. The interval S_F between the pressing unit 62*x* and the displacement meter 61*x* in the second direction D2 is preferably 100 mm or less. By decreasing the interval S_F, the pressing unit 62*x* can be accurately controlled using the result of measurement by the displacement meter 61*x*. This allows accurate adjustment of the amounts of deformation at the individual positions of the first side 41. This can eliminate or reduce deviation of the tension that the first side 41 applies to the individual masks 50 from a target tension. The interval S_F is calculated from the center position of a portion 65 of the pressing unit 62*x* in contact with the first side 41 and the position of the first side 41 that the displacement meter 61*x* measures. If the displacement meter 61*x* is in contact with the first side 41, the position of the first side 41 that the displacement meter 61*x* measures is the center position of a portion 64 of the displacement meter 61*x* in contact with the first side 41. The interval S_F is preferably kept constant while the mask apparatus 15 is manufactured using the manufacturing apparatus 60. In other words, the displacement meter 61*x* preferably remains still with respect to the pressing unit 62*x* in the second direction D2. The displacement meter 61*x* that remains still with respect to the pressing unit 62*x* in the second direction D2 while the mask apparatus 15 is manufactured using the manufacturing apparatus 60 is also referred to as a still displacement meter 61*x*.

The interval S_F may be, for example, 1 mm or more, 5 mm or more, or 10 mm or more. The interval S_F may be, for example, 20 mm or less, 50 mm or less, or 100 mm or less. The range of the interval S_F may be defined by a first group of 1 mm, 5 mm, and 10 mm and/or a second group of 20 mm, 50 mm, and 100 mm. The range of the interval S_F may be defined by a combination of any one of the values included in the first group and any one of the values included in the second group. The range of the interval S_F may be defined by any two combinations of the values included in the first group. The range of the interval S_F may be defined by any two combinations of the values included in the second group. For example, the interval S_F may be 1 mm or more and 100 mm or less, 1 mm or more and 50 mm or less, 1 mm or more and 20 mm or less, 1 mm or more and 10 mm or less, 1 mm or more and 5 mm or less, 5 mm or more and 100 mm or less, 5 mm or more and 50 mm or less, 5 mm or more and 20 mm or less, 5 mm or more and 10 mm or less, 10 mm or more and 100 mm or less, 10 mm or more and 50 mm or less, 10 mm or more and 20 mm or less, 20 mm or more and 100 mm or less, 20 mm or more and 50 mm or less, or 50 mm or more and 100 mm or less.

The displacement meter 61*x* may include a sensor head 611 and a support portion 612. The support portion 612 supports the sensor head 611 so that the sensor head 611 can move in the first direction D1. The sensor head 611 includes an end that is in contact with the outer surface 41*a* of the first side 41. The displacement meter 61*x* detects the amount of deformation of the first side 41 on the basis of the position of the end of the sensor head 611.

The pressing unit 62*x* may include a rod 621 and a drive unit 622. The drive unit 622 drives the rod 621 in the first direction D1. The drive unit 622 includes, for example, a motor. The rod 621 includes an end that is in contact with the outer surface 41*a* of the first side 41. The pressing unit 62*x* may include a load meter, such as a load cell. The load meter detects the pressing force that the rod 621 applies to the frame 40.

As shown in FIG. 10, the displacement measuring mechanism 61 may include a first auxiliary displacement meter 61D and a second auxiliary displacement meter 61E. The first auxiliary displacement meter 61D measures the amount of deformation of the first side 41 at a position distance S_D apart from the outer surface 43*a* of the third side 43 in the second direction D2. The second auxiliary displacement meter 61E measures the amount of deformation of the first side 41 at a position distance S_E apart from the outer surface 44*a* of the fourth side 44 in the second direction D2. The configurations of the first auxiliary displacement meter 61D and the second auxiliary displacement meter 61E may be the same as or different from the configurations of the displacement meters of the central measurement group 61C, the first measurement group 61A, and the second measurement group 61B.

The distance S_D and the distance S_E may be, for example, 1 mm or more, 5 mm or more, or 20 mm or more. The distance S_D and the distance S_E may be, for example, 50 mm or less, 100 mm or less, or 200 mm or less. The range of the distance S_D and the distance S_E may be defined by a first group of 1 mm, 5 mm, and 20 mm and/or a second group of 50 mm, 100 mm, and 200 mm. The range of the distance S_D and the distance S_E may be defined by a combination of any one of the values included in the first group and any one of the values included in the second group. The range of the distance S_D and the distance S_E may be defined by any two combinations of the values included in the first group. The range of the distance S_D and the distance S_E may be defined by any two combinations of the values included in the second group. For example, the distance S_D and the distance S_E may be 1 mm or more and 200 mm or less, 1 mm or more and 100 mm or less, 1 mm or more and 50 mm or less, 1 mm or more and 20 mm or less, 1 mm or more and 5 mm or less, 5 mm or more and 200 mm or less, 5 mm or more and 100 mm or less, 5 mm or more and 50 mm or less, 5 mm or more and 20 mm or less, 20 mm or more and 200 mm or less, 20 mm or more and 100 mm or less, 20 mm or more and 50 mm or less, 50 mm or more and 200 mm or less, 50 mm or more and 100 mm or less, or 100 mm or more and 200 mm or less.

Preferably, the interval between two displacement meters adjacent in the second direction D2 is 500 mm or less. By decreasing the interval, the amount of deformation at the individual positions of the first side 41 can be accurately measured. This allows accurate adjustment of the amounts of deformation at the individual positions of the first side 41 using the pressing units. This can eliminate or reduce deviation of the tension that the first side 41 applies to the masks 50 from a target tension.

The interval between two adjacent displacement meters may be, for example, 50 mm or more, 100 mm or more, or 200 mm or more. The interval between two adjacent displacement meters may be, for example, 300 mm or less, 400 mm or less, or 500 mm or less. The range of the interval between two adjacent displacement meters may be defined by a first group of 50 mm, 100 mm, and 200 mm and/or a second group of 300 mm, 400 mm, and 500 mm. The range of the interval between two adjacent displacement meters may be defined by a combination of any one of the values included in the first group and any one of the values included in the second group. The range of the interval between two adjacent displacement meters may be defined by any two combinations of the values included in the first group. The range of the interval between two adjacent displacement meters may be defined by any two combinations of the values included in the second group. For example, the interval between two adjacent displacement meters may be 50 mm or more and 500 mm or less, 50 mm or more and 400 mm or less, 50 mm or more and 300 mm or less, 50 mm or more and 200 mm or less, 50 mm or more and 100 mm or less, 100 mm or more and 500 mm or less, 100 mm or more and 400 mm or less, 100 mm or more and 300 mm or less, 100 mm or more and 200 mm or less, 200 mm or more and 500 mm or less, 200 mm or more and 400 mm or less, 200 mm or more and 300 mm or less, 300 mm or more and 500 mm or less, 300 mm or more and 400 mm or less, or 400 mm or more and 500 mm or less.

Reference sign S1_AA denotes the interval between the two displacement meters that belong to the first measurement group 61A. Reference sign S1_AC denotes the interval between a displacement meter that belongs to the first measurement group 61A and a displacement meter that belongs to the central measurement group 61C. Reference sign S1_CC denotes the interval between the two displacement meters that belong to the central measurement group 61C. Reference sign S1_BC denotes the interval between a displacement meter that belongs to the second measurement group 61B and a displacement meter that belongs to the central measurement group 61C. Reference sign S1_BB denotes the interval between the two displacement meters that belong to the second measurement group 61B. The interval S1_AA, the interval S1_AC, the interval S1_CC, the interval S1_BC, and the interval S1_BB may be the same or differ from one another.

Preferably, the interval between a displacement meter and an auxiliary displacement meter adjacent in the second direction D2 is 500 mm or less. The numerical range of the interval between the displacement meter and the auxiliary displacement meter may be the same as the numerical range of "the interval between two displacement meters" described above.

The displacement measuring mechanism 61 that measures the amount of deformation of the second side 42 may also include a plurality of displacement meters. Preferably, the displacement measuring mechanism 61 includes displacement meters that measure the amounts of deformation of the second side 42 near the individual pressing units. Preferably, the number of displacement meters that measure the amounts of deformation of the second side 42 is larger than or equal to the number of pressing units that press the second side 42. For example, if the number of pressing units that press the second side 42 is five, the displacement measuring mechanism 61 preferably includes five or more displacement meters. The displacement measuring mechanism 61 that measures the amounts of deformation of the second side 42 may also include the first auxiliary displacement meter 61D and the second auxiliary displacement meter 61E.

Also on the second side 42, the interval between each pressing unit and each displacement meter in the second direction D2 is preferably 100 mm or less. The numerical range of the interval between the pressing unit and the displacement meter in the second direction D2 on the second side 42 may be the same as the numerical range of the interval between the pressing unit and the displacement meter in the second direction D2 on the first side 41.

Also on the second side 42, the range of the interval between two adjacent displacement meters in the second direction D2 is 500 mm or less. The range of the interval in the second direction D2 between two displacement meters adjacent along the second side 42 may be the same as the numerical range of the interval between two displacement meters adjacent along the first side 41.

The displacement meters located on the first side 41 and the displacement meters located on the second side 42 may be arranged side by side in the first direction D1. For example, the first central displacement meter 61C1 located on first side 41 and the first central displacement meter 61C1 located on the second side 42 may be at the same coordinate in the second direction D2.

The displacement measuring mechanism 61 that measures the amount of deformation of the second side 42 may also include the first auxiliary displacement meter 61D and the second auxiliary displacement meter 61E.

Figure 12:
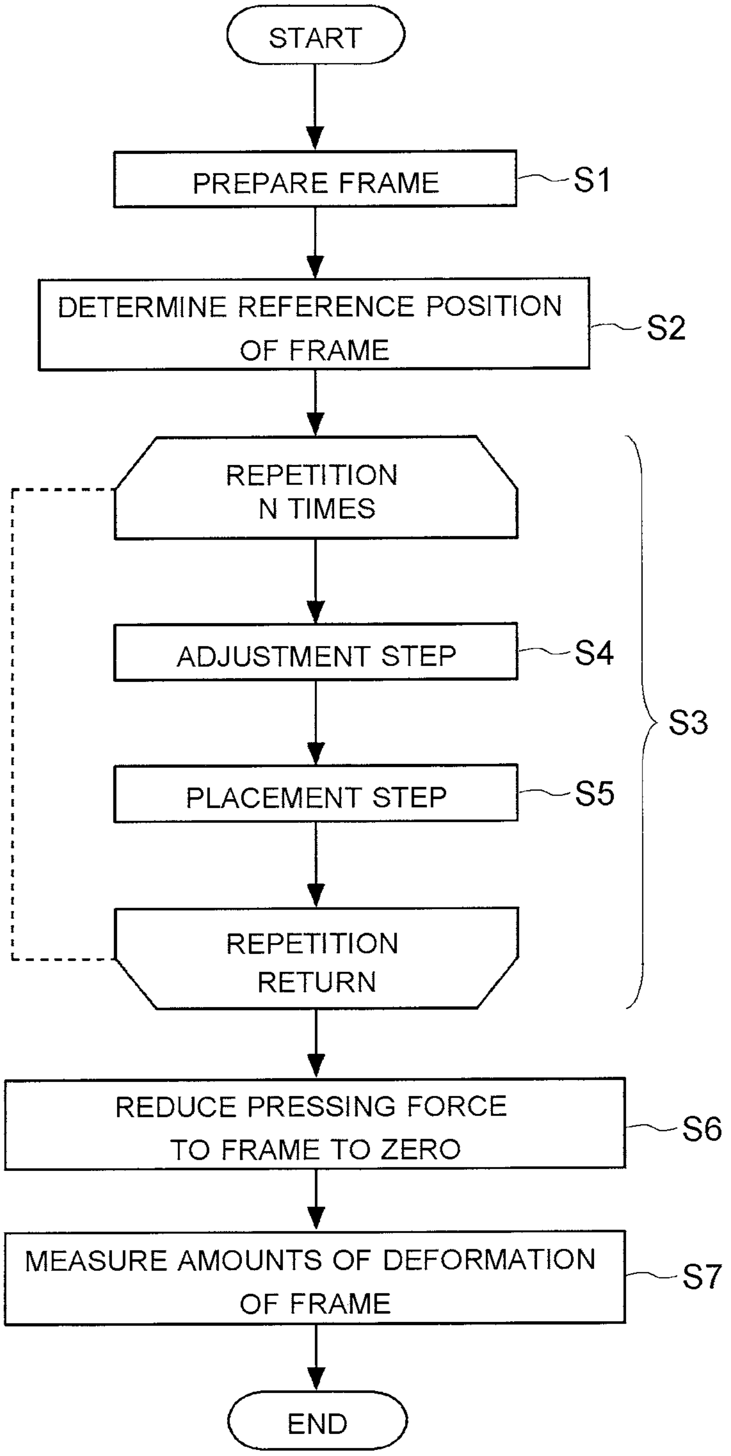
FIG. 12 is a flowchart illustrating an example of a method of manufacturing the mask apparatus.

Next, a method of manufacturing the mask apparatus 15 using the manufacturing apparatus 60 will be described. FIG. 12 is a flowchart illustrating an example of the method of manufacture. First, the frame 40 is prepared (step S1). The frame 40 may be placed on a stage (not shown) of the manufacturing apparatus 60. Next, the reference position of the frame 40 is determined (step S2). For example, the position of the frame 40 is measured using the displacement measuring mechanism 61, with the frame 40 not pressed by the pressing mechanism 62. For example, the sensor head 611 of the displacement meter 61*x* is brought into contact with the frame 40, with the rod 621 of the pressing unit 62*x* spaced apart from the frame 40. This allows determining the position of the frame 40 not deformed, that is, the reference position.

Next, a mask attaching step S3 for attaching N masks 50 to the frame 40 in order is performed. The step for attaching the k-th mask 50 (where k is an integer greater than or equal to 1 and less than or equal to N) to the frame 40 is also referred to as a k-th-mask attaching step S3(*k*). The mask attaching step S3 includes N steps of a first-mask attaching step S3(1) to an N-th-mask attaching step S3(N).

The mask attaching step S3 repeats an adjustment step S4 and a placement step S5 N times, as shown in FIG. 12. The adjustment step and the placement step in the k-th-mask attaching step S3(*k*) is also referred to as a k-th adjustment step S4(*k*) and a k-th placement step S5(*k*).

The adjustment step S4 adjusts the pressing force that the pressing mechanism 62 applies to the first side 41 and the second side 42 in the direction toward the opening 45. Specifically, the adjustment step S4 adjusts the pressing force so that the amounts of deformation of the first side 41 and the second side 42 when the masks 50 are fixed to the first side 41 and the second side 42 reach target amounts of deformation. In the method of manufacturing the mask apparatus 15, the pressing force that the pressing mechanism 62 applies to the first side 41 and the second side 42 is also referred to as a first pressing force.

The target amounts of deformation are determined in advance for the individual positions of the first side 41 and the individual positions of the second side 42. The first side 41 and the second side 42 deformed to the target amounts of deformation can apply target tensions to the N masks 50 on the basis of the elastic restoring force, with the N masks 50 attached to the frame 40. The target amounts of deformation may be calculated on the basis of the shape and the properties of the frame 40. For example, the relationship between the restoring force and the amount of deformation may be calculated on the basis of the three-dimensional geometry of the frame 40 created by computer-aided design (CAD) or the like using a finite element method. The target amounts of deformation may be calculated on the basis of the relationship.

In the following description, the first pressing force applied to the first side 41 in the k-th adjustment step S4(*k*) may be denoted by reference sign P(k). The first pressing forces that the 11th pressing unit 62A1, the 12th pressing unit 62A2, the 21st pressing unit 62B1, the 22nd pressing unit 62B2, the first central pressing unit 62C1, and the second central pressing unit 62C2 apply to the first side 41 in the k-th adjustment step S4(*k*) may be denoted by reference signs P(k)_A1, P(k)_A2, P(k)_B1, P(k)_B2, P(k)_C1, and P(k)_C2, respectively.

The average value of the first pressing forces that the pressing units of the first group 62A apply to the first side 41 in the k-th adjustment step S4(*k*) may be denoted by reference sign P(k)_A. The average value of the first pressing forces that the pressing units of the second group 62B apply to the first side 41 in the k-th adjustment step S4(*k*) may be denoted by reference sign P(k)_B. The average value of the first pressing forces that the pressing units of the central group 62C apply to the first side 41 in the k-th adjustment step S4(*k*) may be denoted by reference sign P(k)_C.

In the following description, the amount of deformation generated in the first side 41 in the k-th adjustment step S4(*k*) may be denoted by reference sign d(k). The amounts of deformation that the 11th displacement meter 61A1, the 12th displacement meter 61A2, the 21st displacement meter 61B1, the 22nd displacement meter 6162, the first central displacement meter 61C1, the second central displacement meter 61C2, the first auxiliary displacement meter 61D, and the second auxiliary displacement meter 61E measure in the k-th adjustment step S4(*k*) may be denoted by reference signs d(k)_A1, d(k)_A2, d(k)_B1, d(k)_B2, d(k)_C1, d(k)_C2, d(k)_D, and d(k)_E, respectively.

In the following description, the target amount of deformation at the position where the 11th displacement meter 61A1 measures the first side 41 may be denoted by reference sign T_A1. Likewise, the target amounts of deformation corresponding to the 12th displacement meter 61A2, the 21st displacement meter 6161, the 22nd displacement meter 6162, the first central displacement meter 61C1, the second central displacement meter 61C2, the first auxiliary displacement meter 61D, and the second auxiliary displacement meter 61E may be denoted by reference signs T_A2, T_B1, T_B2, T_C1, T_C2, T_D, and T_E, respectively.

Figure 13:
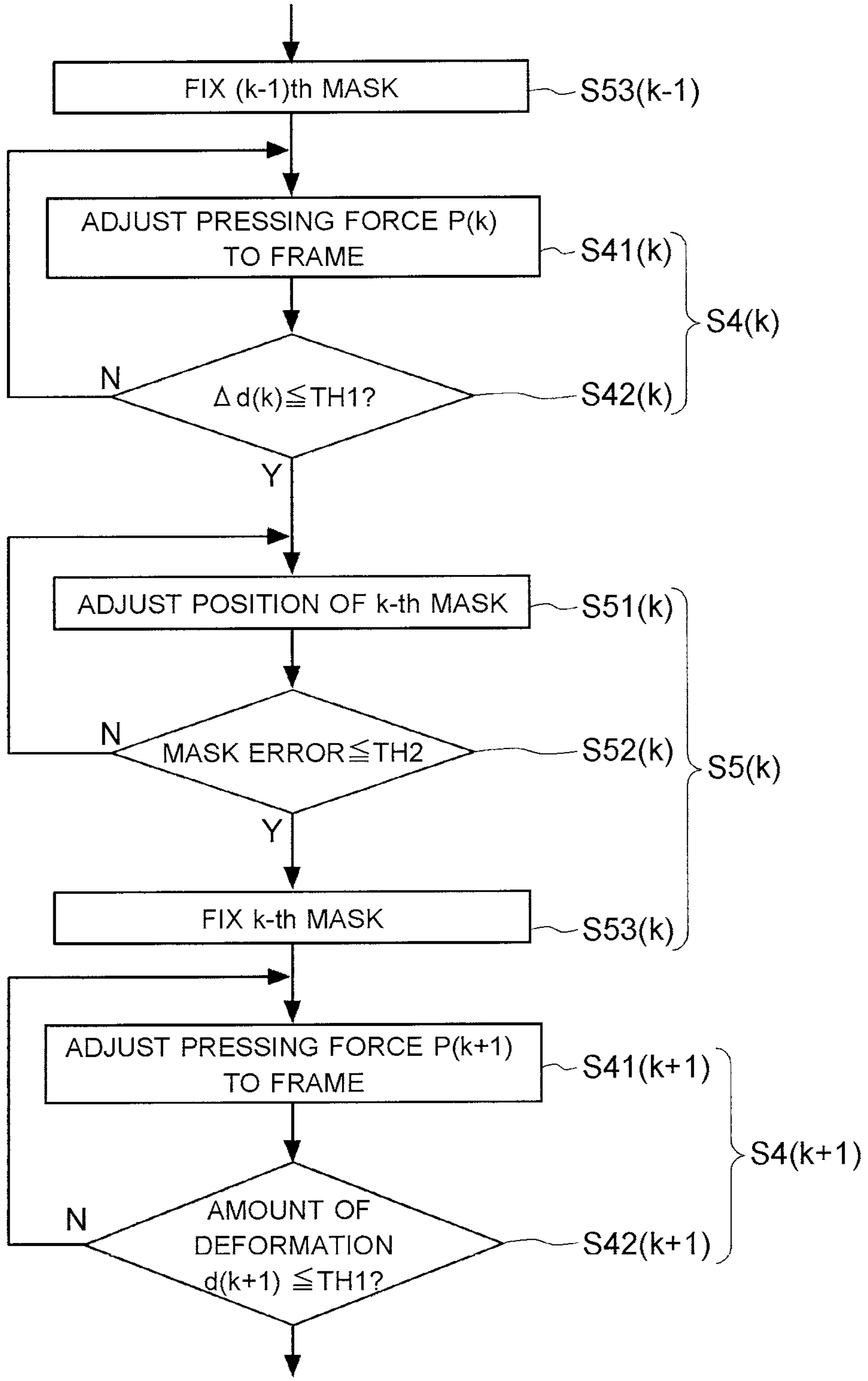
FIG. 13 is a flowchart illustrating an example of an adjustment step and a placement step.

FIG. 13 is a flowchart illustrating an example of the adjustment step S4 and the placement step S5. The k-th adjustment step S4(*k*) may include a pressing step S41(*k*) and a determination step S42(*k*). The pressing step S41(*k*) adjusts the first pressing force P(k) to the frame 40. The determination step S42(*k*) determines whether Δd(k) is less than or equal to a first threshold TH1. The value Δd(k) is the absolute value of the difference between the amount of deformation d(k) and the target amount of deformation. The value Δd(k) is, for example, the absolute value of the difference between the amount of deformation d(k)_C1 that the first central displacement meter 61C1 measured and the target amount of deformation T_C1. The determination step S42(*k*) may determine whether Δd(k) is less than or equal to the first threshold TH1 for the individual measurement values of a plurality of amounts of deformation. For example, the determination step S42(*k*) may determine whether the difference between the amount of deformation d(k)_C1 and the target amount of deformation T_C1, the difference between the amount of deformation d(k)_A1 and the target amount of deformation T_A1, and the difference between the amount of deformation d(k)_A2 and the target amount of deformation T_A2 are less than or equal to the first threshold TH1. The determination step S42(*k*) may determine whether Δd(k) is less than or equal to the first threshold TH1 for each of the amounts of deformation d(k)_A1, d(k)_A2, d(k)_B1, d(k)_B2, d(k)_C1, d(k)_C2, d(k)_D, and d(k)_E.

The first threshold TH1 may be determined on the basis of the accuracy of the desired tension. The first threshold TH1 may be, for example, 0.01 μm or more, 0.02 μm or more, or 0.05 μm or more. The first threshold TH1 may be, for example, 0.10 μm or less, 0.15 μm or less, or 0.20 μm or less. The range of the first threshold TH1 may be defined by a first group of 0.01 μm, 0.02 μm, and 0.05 μm and/or a second group of 0.10 μm, 0.15 μm, and 0.20 μm. The range of the first threshold TH1 may be defined by a combination of any one of the values included in the first group and any one of the values included in the second group. The range of the first threshold TH1 may be defined by any two combinations of the values included in the first group. The range of the first threshold TH1 may be defined by any two combinations of the values included in the second group. For example, the first threshold TH1 may be 0.01 μm or more and 0.20 μm or less, 0.01 μm or more and 0.15 μm or less, 0.01 μm or more and 0.10 μm or less, 0.01 μm or more and 0.05 μm or less, 0.01 μm or more and 0.02 μm or less, 0.02 μm or more and 0.20 μm or less, 0.02 μm or more and 0.15 μm or less, 0.02 μm or more and 0.10 μm or less, 0.02 μm or more and 0.05 μm or less, 0.05 μm or more and 0.20 μm or less, 0.05 μm or more and 0.15 μm or less, 0.05 μm or more and 0.10 μm or less, 0.10 μm or more and 0.20 μm or less, 0.10 μm or more and 0.15 μm or less, or 0.15 μm or more and 0.20 μm or less.

The placement step S5 fixes the ends 51 of the masks 50 to the first side 41 and the second side 42. The k-th fixing step S5(*k*) may include a position adjusting step S51(*k*) for adjusting the position of the k-th mask 50, a determination step S52(*k*), and a fixing step S53(*k*).

The position adjusting step S51(*k*) may adjust the position of the mask 50, with the mask 50 subjected to tension. The position of the mask 50 can be adjusted with the mask 50 subjected to tension by using the moving mechanism 71 and the tension unit 76. The position adjusting step S51(*k*) may control the moving mechanism 71 and the tension unit 76 so that the position of the mask 50 relative to the frame 40 reaches a target position. For example, the position adjusting step S51(*k*) may control the tension unit 76 and the fixing unit 74 on the basis of information from the observation unit 73 described above.

The determination step S52(*k*) determines whether the mask error is a second threshold TH2 or less. The mask error is, for example, the absolute value of the difference between the actual position of a mark on the mask 50 and the target position. The determination step S52(*k*) may determine whether the mask error is the second threshold TH2 or less for one mark. The determination step S52(*k*) may determine whether the mask error is the second threshold TH2 or less for two or more marks. The determination step S52(*k*) may determine whether the mask error is the second threshold TH2 or less on the basis of the position of an element other than the mark. For example, the determination step S52(*k*) may determine whether the mask error is the second threshold TH2 or less on the basis of the outline of the mask 50, the positions of the through-holes 56, or the like. The mask error is also referred to as PPA. The sign "PPA" refers to pixel position accuracy.

The second threshold TH2 may be, for example, 0.1 μm or more, 0.2 μm or more, or 0.5 μm or more. The second threshold TH2 may be, for example, 1.0 μm or less, 2.0 m or less, or 3.0 μm or less. The range of the second threshold TH2 may be defined by a first group of 0.1 μm, 0.2 μm, and 0.5 μm and/or a second group of 1.0 μm, 2.0 m, and 3.0 μm. The range of the second threshold TH2 may be defined by a combination of any one of the values included in the first group and any one of the values included in the second group. The range of the second threshold TH2 may be defined by any two combinations of the values included in the first group. The range of the second threshold TH2 may be defined by any two combinations of the values included in the second group. For example, the second threshold TH2 may be 0.1 μm or more and 3.0 μm or less, 0.1 μm or more and 2.0 m or less, 0.1 μm or more and 1.0 μm or less, 0.1 μm or more and 0.5 μm or less, 0.1 μm or more and 0.2 μm or less, 0.2 μm or more and 3.0 μm or less, 0.2 μm or more and 2.0 m or less, 0.2 μm or more and 1.0 μm or less, 0.2 μm or more and 0.5 μm or less, 0.5 μm or more and 3.0 μm or less, 0.5 μm or more and 2.0 m or less, 0.5 μm or more and 1.0 μm or less, 1.0 μm or more and 3.0 μm or less, 1.0 μm or more and 2.0 m or less, and 2.0 m or more and 3.0 μm or less.

The fixing step S53(*k*) fixes the k-th mask 50 to the first side 41 and the second side 42. The mask 50 can be fixed to the first side 41 and the second side 42 by using the fixing unit 74.

After the mask attaching step S3, a releasing step S6 may be performed. The releasing step S6 reduces the first pressing force to the frame 40 to zero. For example, the rods 621 of the pressing units of the pressing mechanism 62 are separated from the frame 40. Subsequently, a final checking step S7 may be performed. The final checking step S7 measures the amounts of deformation that is finally generated in the first side 41 and the second side 42. The amounts of deformation that is finally generated in the first side 41 and the second side 42 are also referred to as "final amount of deformation".

The final checking step S7 may determine whether the difference between the final amount of deformation and the target amount of deformation is less than or equal to the first threshold TH1. The final checking step S7 may determine a plurality of final amounts of deformation at the individual positions of the first side 41 and the second side 42. The final checking step S7 may determine final amounts of deformation measured by all displacement meters included in the manufacturing apparatus 60.

Referring to FIG. 10 and FIGS. 14 to 20, the method of manufacturing the mask apparatus 15 will be specifically described.

The position of the frame 40 is measured using the displacement measuring mechanism 61, with the frame 40 not deformed, as shown in FIG. 10. Subsequently, the mask attaching step S3 of attaching the N masks 50 to the frame 40 is performed. This embodiment shows an example in which the masks 50 are attached to the first side 41 and the second side 42 in order of decreasing distance from the center of the frame 40 in the second direction D2. If the distances from the center of the frame 40 in the second direction D2 are the same, the masks 50 located between the third side 43 and the second center line Lc2 are attached to the first side 41 and the second side 42 before the masks 50 located between the fourth side 44 and the second center line Lc2 are attached. Accordingly, the 11th mask 50A1, the 21st mask 50B1, the 12th mask 50A2, the 22nd mask 50B2, the 13th mask 50A3, the 23rd mask 50B3, the 14th mask 50A4, the 24th mask 50B4, the first central mask 50C1, and the second central mask 50C2 are attached in this order to the first side 41 and the second side 42.

The first-mask attaching step S3(1) of attaching the first mask 50 to the frame 40 will be descried. The first mask 50 is the 11th mask 50A1. The first-mask attaching step S3(1) includes a first adjustment step S4(1) and a first placement step S5(1).

Figure 14:
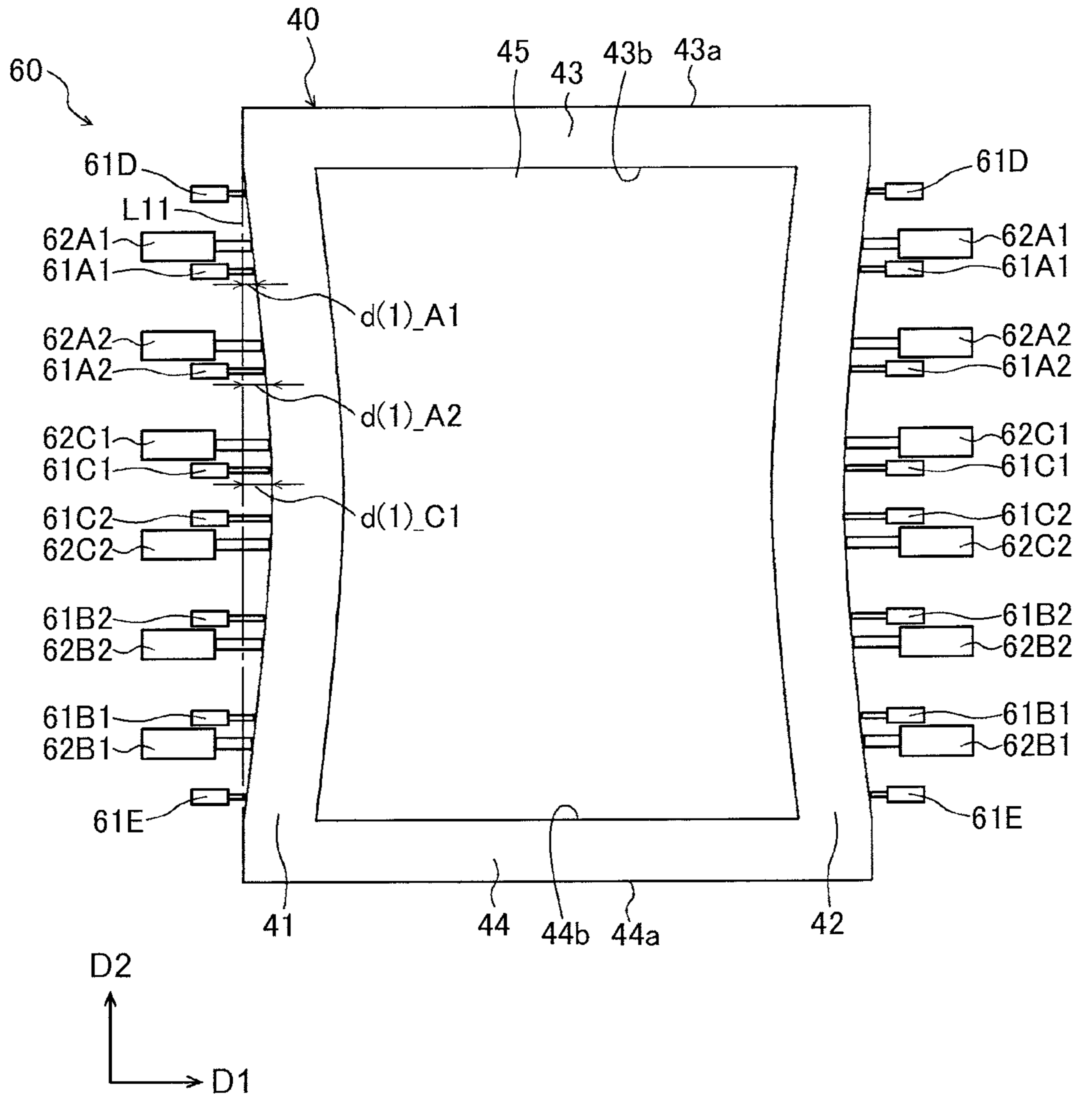
FIG. 14 is a diagram illustrating an example of a first adjustment step.

FIG. 14 is a diagram illustrating the first adjustment step S4(1). The first adjustment step S4(1) includes a pressing step S41(1) and a determination step S42(1). The pressing step S41(1) presses the first side 41 and the second side 42, with the masks 50 not attached to the frame 40, as shown in FIG. 14. The control unit 63 controls the pressing mechanism 62 so that the amounts of deformation, d(1)_A1, d(1)_A2, and d(1)_C(1), reach target amounts of deformation.

The determination step S42(1) determines whether Δd(1) is less than or equal to the first threshold TH1. If Δd(1) exceeds the first threshold TH1, the pressing step S41(1) is performed again. If Δd(1) is less than or equal to the first threshold TH1, the process goes to the first placement step S5(1). If Δd(1) is less than or equal to the first threshold TH1, the first pressing forces that the pressing units of the pressing mechanism 62 applies to the first side 41 and the second side 42 may be recorded.

In the first adjustment step S4(1), the control unit 63 may control the pressing mechanism 62 so that the difference between the first pressing forces that the pressing units of the pressing mechanism 62 apply to the first side 41 falls within a predetermined range. For example, the control unit 63 may control the pressing mechanism 62 so that a first ratio RA1 and a second ratio RA2 are less than or equal to predetermined values. The first ratio RA1 is the ratio of the average first pressing force P(1)_A of the first group 62A to the average first pressing force P(1)_C of the central group 62C in the first adjustment step S4(1). The second ratio RA2 is the ratio of the average first pressing force P(1)_B of the second group 62B to the average first pressing force P(1)_C of the central group 62C in the first adjustment step S4(1). The average first pressing force P(1)_A is the average value of the first pressing forces that the pressing units of the first group 62A apply to the first side 41 in the first adjustment step S4(1). The average first pressing force P(1)_B is the average value of the first pressing forces that the pressing units of the second group 62B apply to the first side 41 in the first adjustment step S4(1). The average first pressing force P(1)_C is the average value of the first pressing forces that the pressing units of the central group 62C apply to the first side 41 in the first adjustment step S4(1).

The first ratio RA1 and the second ratio RA2 may be, for example, 0.6 or higher, 0.7 or higher, 0.8 or higher, or 0.9 or higher. The first ratio RA1 and the second ratio RA2 may be, for example, 1.1 or lower, 1.2 or lower, 1.3 or lower, or 1.4 or lower. The range of the first ratio RA1 and the second ratio RA2 may be defined by a first group of 0.6, 0.7, 0.8, and 0.9 and/or a second group of 1.1, 1.2, 1.3, and 1.4. The range of the first ratio RA1 and the second ratio RA2 may be defined by a combination of any one of the values included in the first group and any one of the values included in the second group. The range of the first ratio RA1 and the second ratio RA2 may be defined by any two combinations of the values included in the first group. The range of the first ratio RA1 and the second ratio RA2 may be defined by any two combinations of the values included in the second group. For example, the first ratio RA1 and the second ratio RA2 may be 0.6 or higher and 1.4 or lower, 0.6 or higher and 1.3 or lower, 0.6 or higher and 1.2 or lower, 0.6 or higher and 1.1 or lower, 0.6 or higher and 0.9 or lower, 0.6 or higher and 0.8 or lower, 0.6 or higher and 0.7 or lower, 0.7 or higher and 1.4 or lower, 0.7 or higher and 1.3 or lower, 0.7 or higher and 1.2 or lower, 0.7 or higher and 1.1 or lower, 0.7 or higher and 0.9 or lower, 0.7 or higher and 0.8 or lower, 0.8 or higher and 1.4 or lower, 0.8 or higher and 1.3 or lower, 0.8 or higher and 1.2 or lower, 0.8 or higher and 1.1 or lower, 0.8 or higher and 0.9 or lower, 0.9 or higher and 1.4 or lower, 0.9 or higher and 1.3 or lower, 0.9 or higher and 1.2 or lower, 0.9 or higher and 1.1 or lower, 1.1 or higher and 1.4 or lower, 1.1 or higher and 1.3 or lower, 1.1 or higher and 1.2 or lower, 1.2 or higher and 1.4 or lower, 1.2 or higher and 1.3 or lower, or 1.3 or higher and 1.4 or lower.

Figure 15:
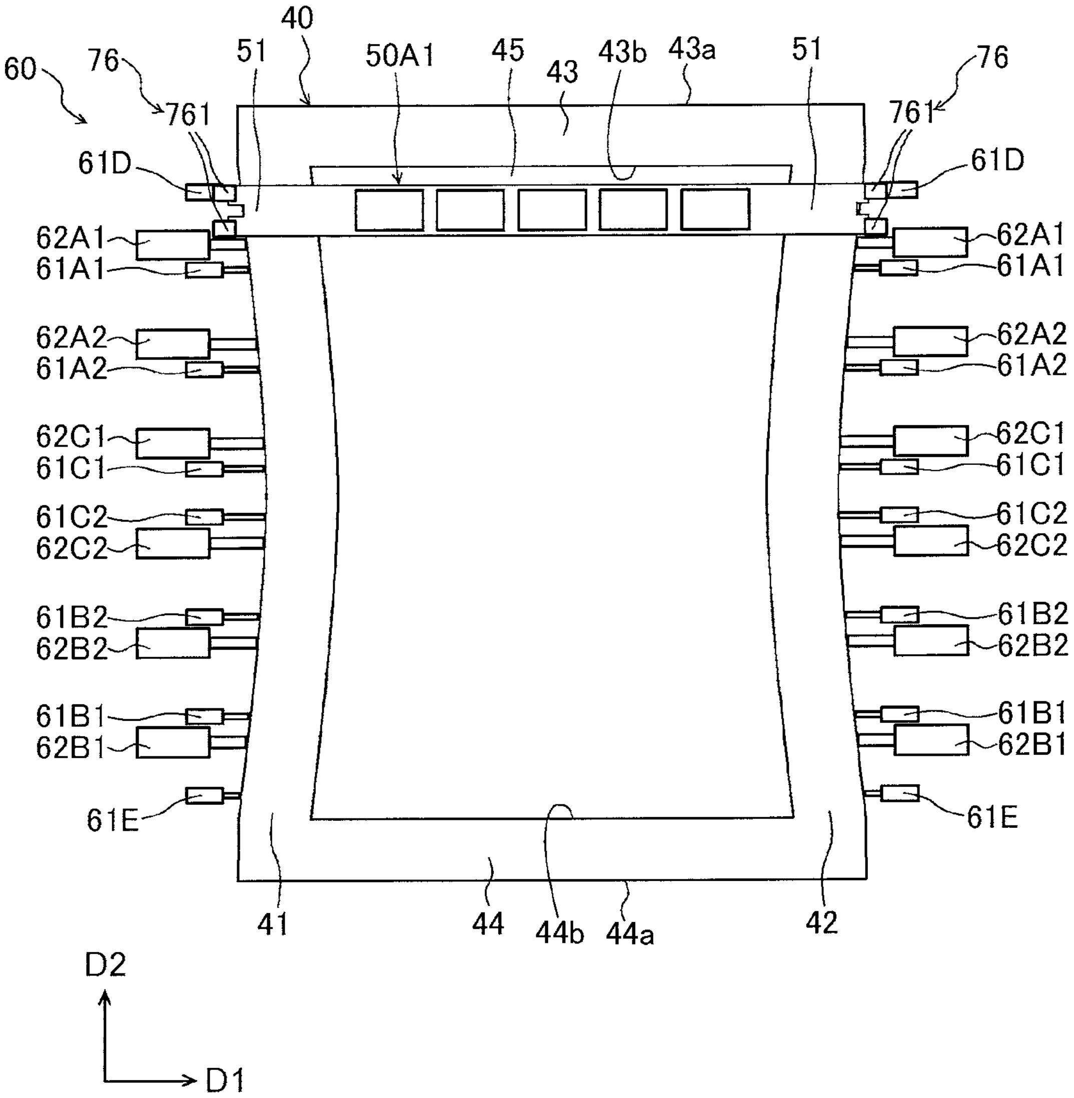
FIG. 15 is a diagram illustrating an example of a first placement step.

The first placement step S5(1) includes a position adjusting step S51(1), a determination step S52(1), and a fixing step S53(1). FIG. 15 is a diagram illustrating the position adjusting step S51(1) and the determination step S52(1).

The position adjusting step S51(1) adjusts the position of the 11th mask 50A1, with the 11th mask 50A1 subjected to tension, as shown in FIG. 15. The position adjusting step S51(1) adjusts the position of the 11th mask 50A1 using the tension unit 76. The tension unit 76 may apply tension to the 11th mask 50A1 using a clamp. The tension unit 76 may include, for example, two clamps 761 attached to a first end 51 and two clamps 761 attached to a second end 51. The position of and the tension to the 11th mask 50A1 can be adjusted by adjusting the positions of the clamps 761.

The determination step S52(1) observes the position of the 11th mask 50A1 using the observation unit 73. The determination step S52(1) determines whether the mask error of the 11th mask 50A1 is less than or equal to the second threshold TH2. If the mask error exceeds the second threshold TH2, the position adjusting step S51(1) is performed again. If the mask error is less than or equal to the second threshold TH2, the process goes to the fixing step S53(1).

Figure 16:
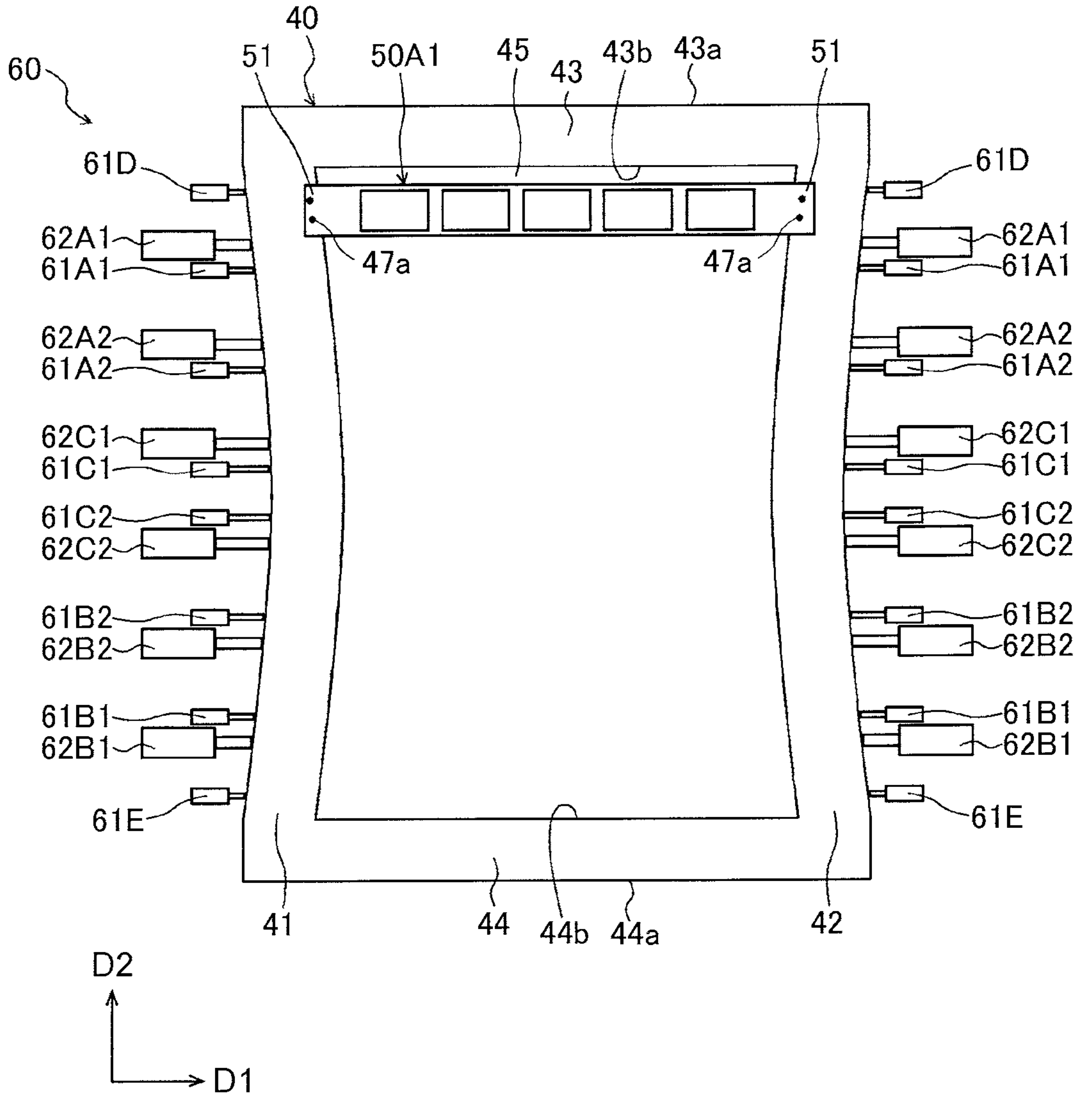
FIG. 16 is a diagram illustrating an example of the first placement step.

FIG. 16 is a diagram illustrating the fixing step S53(1). The fixing step S53(1) applies, for example, laser light, to the ends 51 of the 11th mask 50A1. This allows creating the welded portions 47*a* at the ends 51. The 11th mask 50A1 is fixed to the first side 41 and the second side 42 with the welded portions 47*a*. The portions of the ends 51 outside the welded portions 47*a* may be removed, as shown in FIG. 16. The portions of the ends 51 outside the welded portions 47*a* may be removed after the N masks 50 are attached to the frame 40.

Figure 17:
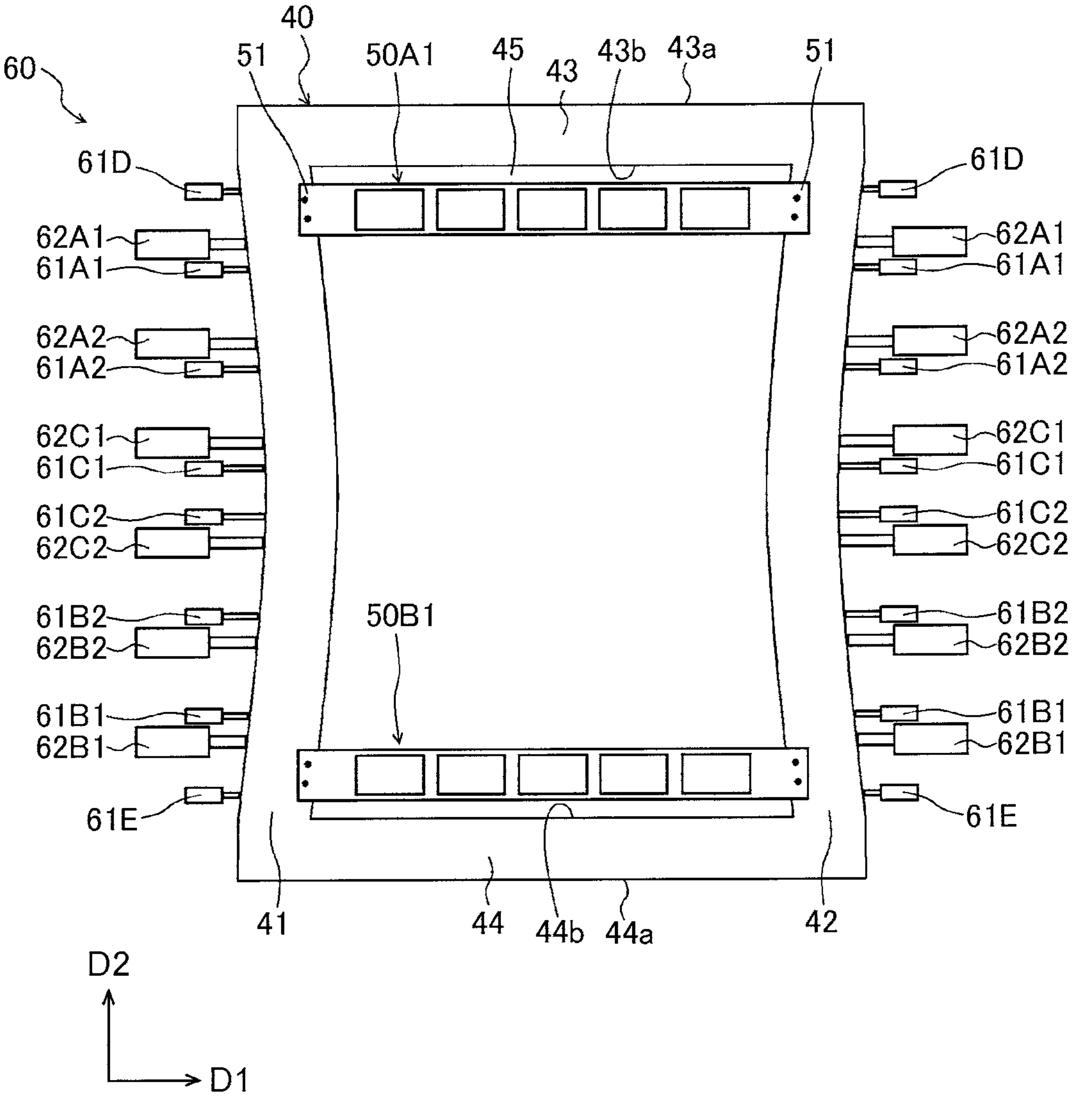
FIG. 17 is a diagram illustrating an example of a second-mask attaching step.

Next, as shown in FIG. 17, a second-mask attaching step S3(2) of attaching the second mask 50 to the frame 40 is performed. The second mask 50 is the 21st mask 50B1. The second-mask attaching step S3(2) includes a second adjustment step S4(2) and a second placement step S5(2).

Figure 18:
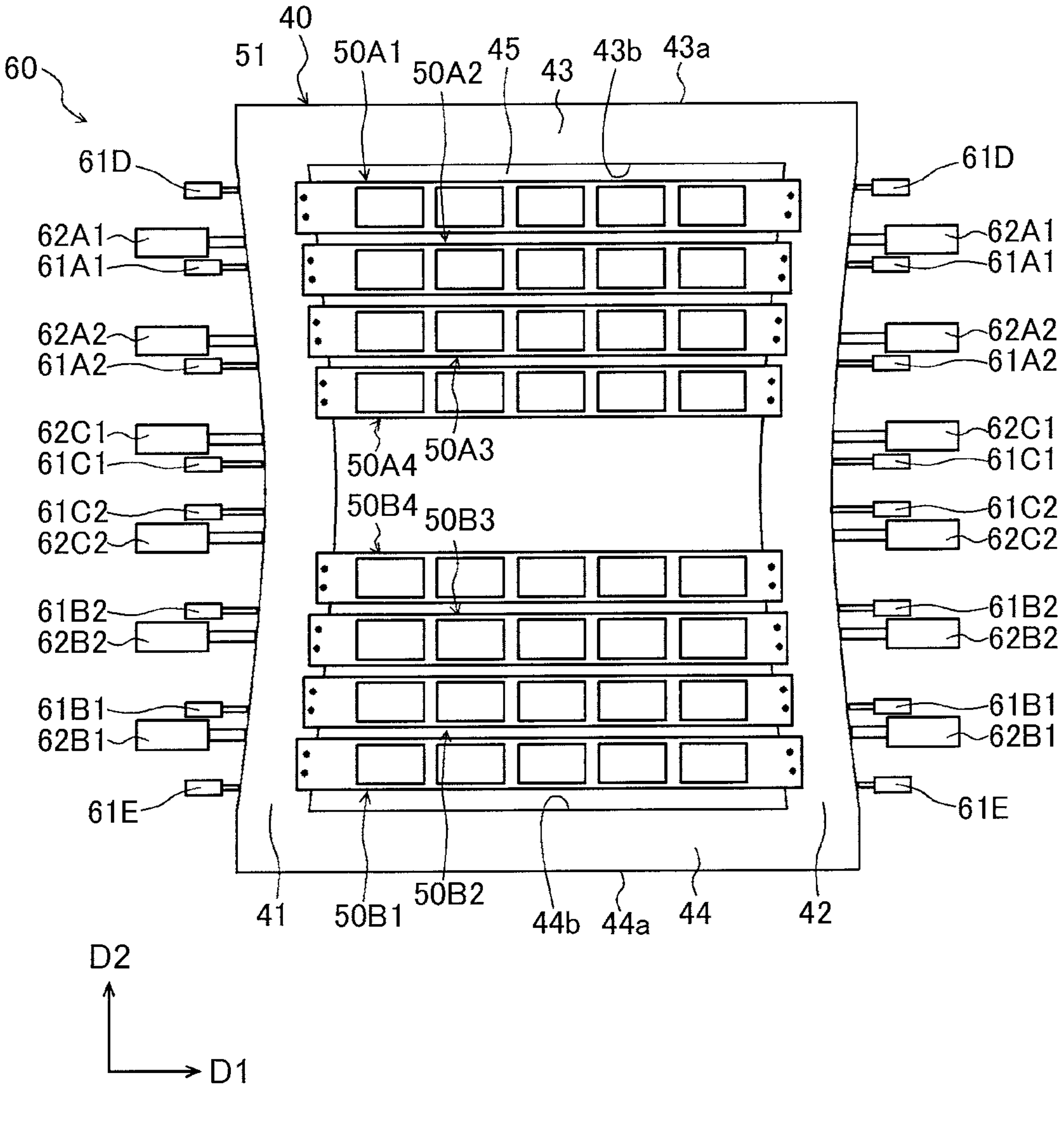
FIG. 18 is a diagram illustrating an example of a third-mask attaching step to an eighth-mask attaching step.

Subsequently, as shown in FIG. 18, third-mask attaching step S3(3) to an eighth-mask attaching step S3(8) are performed in order. This allows the masks 50 of the first mask group 50A and the masks 50 of the second mask group 50B to be attached to the frame 40. The third-mask attaching step S3(3) to the eighth-mask attaching step S3(8) include a third adjustment step S4(3) to an eighth adjustment step S4(8) and a third placement step S5(3) to an eighth placement step S5(8), respectively.

Figure 19:
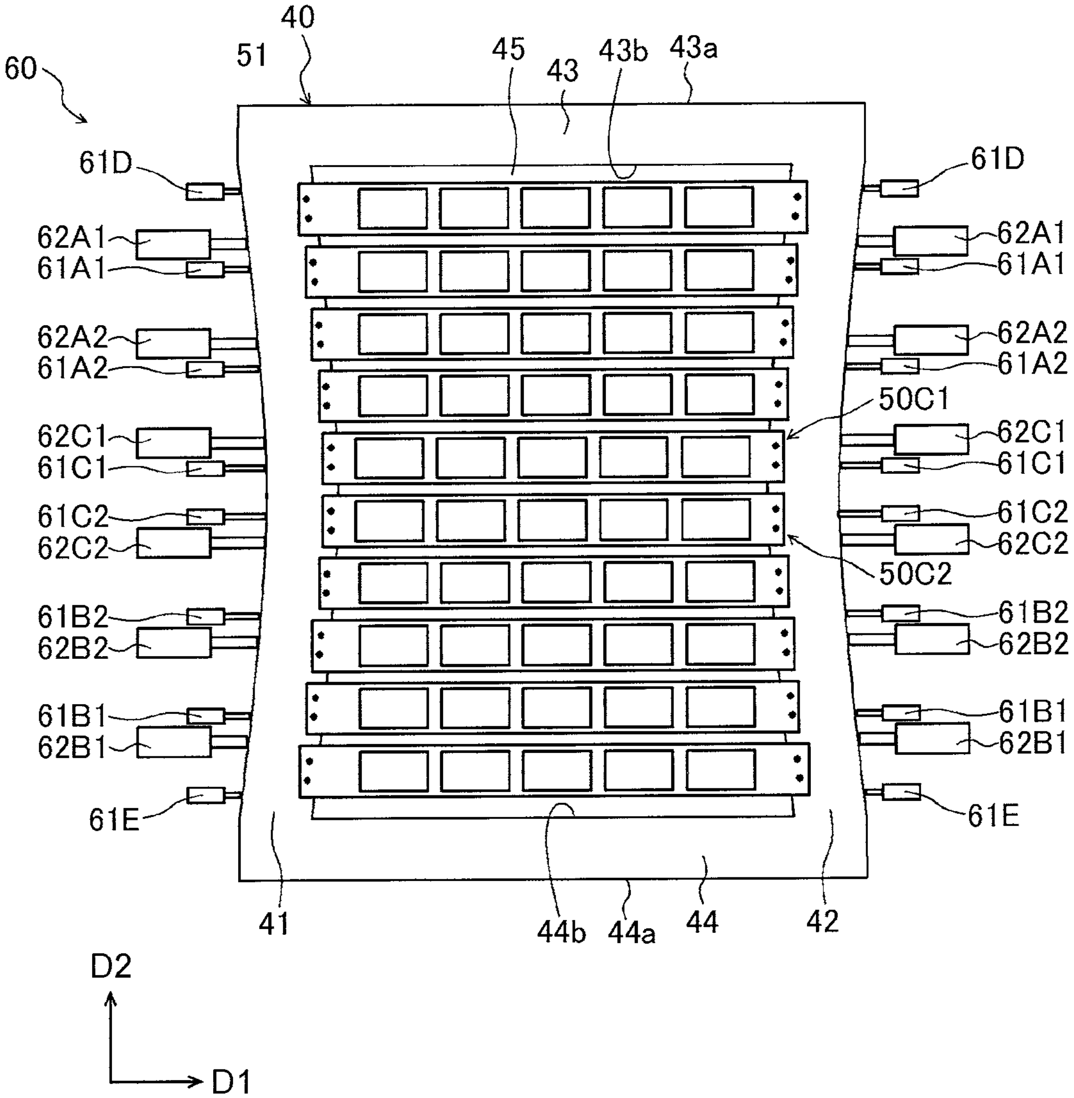
FIG. 19 is a diagram illustrating an example of a ninth-mask attaching step and a tenth-mask attaching step.

Next, as shown in FIG. 19, a ninth-mask attaching step S3(9) to a tenth-mask attaching step S3(10) are performed in order. This allows the masks 50 of the central mask group 50C to be attached to the frame 40. The ninth-mask attaching step S3(9) to the tenth-mask attaching step S3(10) include a ninth adjustment step S4(9) to a tenth adjustment step S4(10) and a ninth placement step S5(9) to a tenth placement step S5(10), respectively.

Figure 20:
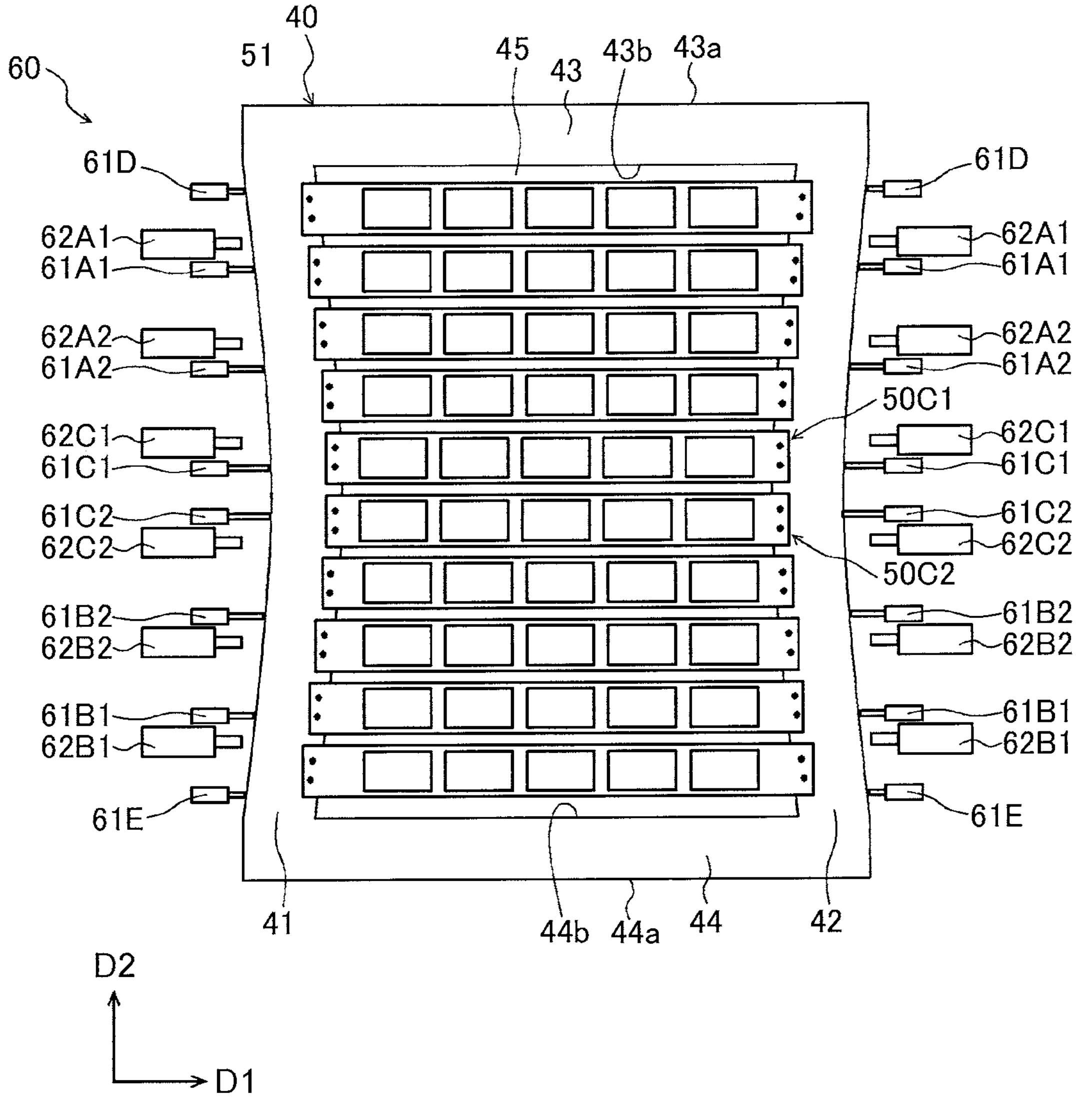
FIG. 20 is a diagram illustrating an example of a releasing step.

Next, the releasing step S6 is performed. The rods 621 of the pressing units of the pressing mechanism 62 are separated from the frame 40, as shown in FIG. 20, for example. Next, the final checking step S7 is performed. The final checking step S7 determines whether the difference between the final amounts of deformation of the first side 41 and the second side 42 and the target amounts of deformation are less than or equal to the first threshold TH1. If the difference is less than or equal to the first threshold TH1, the mask apparatus 15 is approved as an accepted product.

Figure 21:
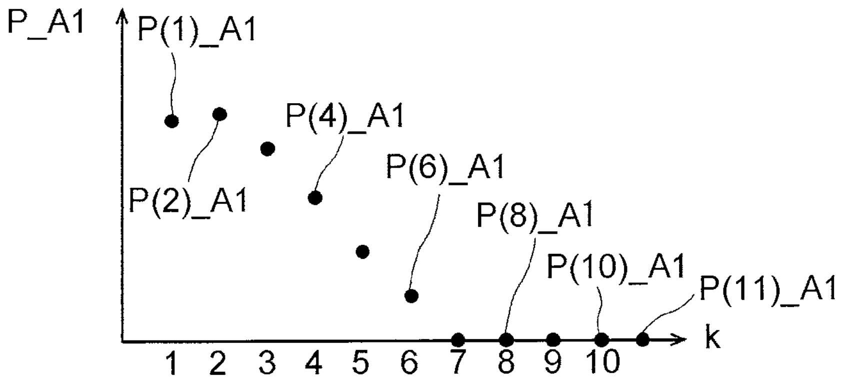
FIG. 21 is a graph showing an example of the pressing force of an 11th pressing unit.

FIG. 21 is a graph showing an example of the transition of a first pressing force P_A1 that the 11th pressing unit 62A1 applies to the first side 41 during the period from the first adjustment step S4(1) to the tenth adjustment step S4(10). As shown in FIG. 21, the first pressing force P_A1 may be decreased during two or more times of adjustment step S4. In the example shown in FIG. 21, the first pressing force P_A1 decreases during the period from the second adjustment step S4(2) to the seventh adjustment step S4(7).

As shown in FIG. 21, the first pressing force P_A1 may be decreased to zero before the last adjustment step S4, that is, before the tenth adjustment step S4(10). In the example shown in FIG. 21, the first pressing force P_A1 becomes zero in the seventh adjustment step S4(7). Reference sign P(11)_A1 denotes the first pressing force P_A1 at the releasing step S6. The first pressing force P(11)_A1 is zero.

Figure 22:
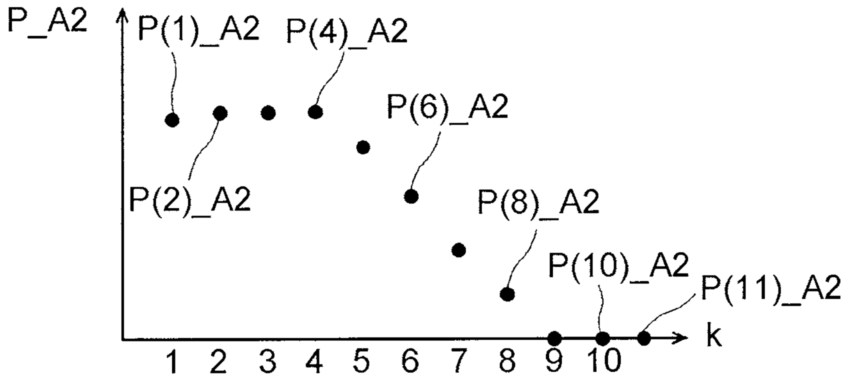
FIG. 22 is a graph showing an example of the pressing force of a 12th pressing unit.

FIG. 22 is a graph showing an example of the transition of a first pressing force P_A2 that the 12th pressing unit 62A2 applies to the first side 41 during the period from the first adjustment step S4(1) to the tenth adjustment step S4(10). As shown in FIG. 22, the first pressing force P_A2 may be decreased during two or more times of adjustment step S4. In the example shown in FIG. 22, the first pressing force P_A2 decreases during the period from the fourth adjustment step S4(4) to the ninth adjustment step S4(9). The period during which the first pressing force P_A2 decreases may be after the period during which the first pressing force P_A1 decreases.

As shown in FIG. 22, the first pressing force P_A2 may become zero before the last adjustment step S4, that is, before the tenth adjustment step S4(10). In the example shown in FIG. 22, the first pressing force P_A2 becomes zero in the ninth adjustment step S4(9). The first pressing force P_A2 may become zero after the first pressing force P_A1 becomes zero. Reference sign P(11)_A2 denotes the first pressing force P_A2 at the releasing step S6. The first pressing force P(11)_A2 is zero.

Figure 23:
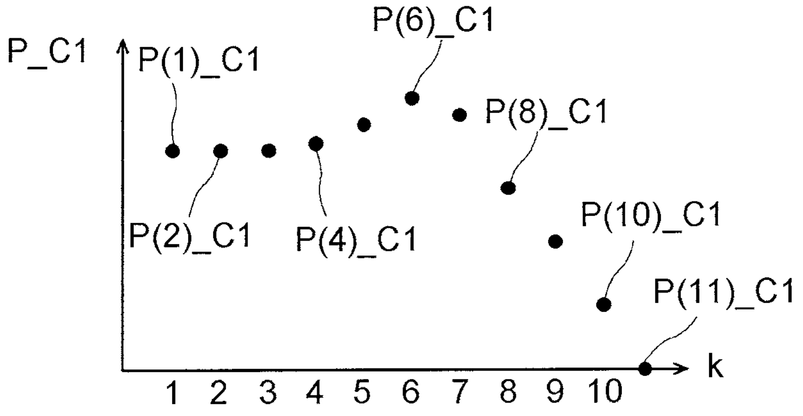
FIG. 23 is a graph showing an example of the pressing force of a first central pressing unit.

FIG. 23 is a graph showing an example of the transition of a first pressing force P_C1 that the first central pressing unit 62C1 applies to the first side 41 during the period from the first adjustment step S4(1) to the tenth adjustment step S4(10). As shown in FIG. 23, the first pressing force P_C1 may be decreased during two or more times of adjustment step S4. In the example shown in FIG. 23, the first pressing force P_C1 decreases during the period from the sixth adjustment step S4(6) to the tenth adjustment step S4(10). The period during which the first pressing force P_C1 decreases may be after the period during which the first pressing forces of the pressing units of the first group 62A decrease.

As shown in FIG. 23, the first pressing force P_C1 may be greater than zero at the last adjustment step S4, that is, at the N-th adjustment step S4(N). Reference sign P(11)_C1 denotes the first pressing force P_C1 at the releasing step S6. The first pressing force P(11)_C1 is zero.

The first pressing force P_C1 may stand at the maximum value at the U-th adjustment step S4(U) (where U is an integer greater than 1 and less than N). This allows reducing the difference between the amount of deformation and the target amount of deformation in the central measurement group 61C. In the example shown in FIG. 23, the first pressing force P_C1 stands at the maximum value at the sixth adjustment step S4(6). In the U-th adjustment step S4(U), the first central pressing unit 62C1 applies the first pressing force P(U)_C1 to the first side 41.

Inequality U≥N/2 may be satisfied. In other words, the first pressing force P_C1 may stand at the maximum value in the latter half of the adjustment step S4.

The ratio of the first pressing force P(U)_C1 to the first pressing force P(1)_C1 may be, for example, 1.05 or higher, 1.10 or higher, or 1.15 or higher. The ratio of the first pressing force P(U)_C1 to the first pressing force P(1)_C1 may be, for example, 1.20 or lower, 1.30 or lower, or 1.50 or lower. The first pressing force P(1)_C1 is the first pressing force that the first central pressing unit 62C1 applies to the first side 41 in the first adjustment step S4(1).

The range of the ratio of the first pressing force P(U)_C1 to the first pressing force P(1)_C1 may be defined by a first group of 1.05, 1.10, and 1.15 and/or a second group of 1.20, 1.30, and 1.50. The range of the ratio of the first pressing force P(U)_C1 to the first pressing force P(1)_C1 may be defined by a combination of any one of the values included in the first group and any one of the values included in the second group. The range of the ratio of the first pressing force P(U)_C1 to the first pressing force P(1)_C1 may be defined by any two combinations of the values included in the first group. The range of the ratio of the first pressing force P(U)_C1 to the first pressing force P(1)_C1 may be defined by any two combinations of the values included in the second group. For example, the ratio of the first pressing force P(U)_C1 to the first pressing force P(1)_C1 may be 1.05 or higher and 1.50 or lower, 1.05 or higher and 1.30 or lower, 1.05 or higher and 1.20 or lower, 1.05 or higher and 1.15 or lower, 1.05 or higher and 1.10 or lower, 1.10 or higher and 1.50 or lower, 1.10 or higher and 1.30 or lower, 1.10 or higher and 1.20 or lower, 1.10 or higher and 1.15 or lower, 1.15 or higher and 1.50 or lower, 1.15 or higher and 1.30 or lower, 1.15 or higher and 1.20 or lower, 1.20 or higher and 1.50 or lower, 1.20 or higher and 1.30 or lower, or 1.30 or higher and 1.50 or lower.

The transition of the first pressing force P_A1 shown in FIG. 21 may also be made by the 21st pressing unit 62B1. The transition of the first pressing force P_A2 shown in FIG. 22 may also be made by the 22nd pressing unit 62B2. The transition of the first pressing force P_C1 shown in FIG. 23 may also be made by the second central pressing unit 62C2.

The pressing mechanism 62 of the manufacturing apparatus 60 includes five or more pressing units that are arranged at intervals of 500 mm or less in the second direction D2 to press the first side 41, as described above. This configuration allows accurate adjustment of the amounts of deformation at the individual positions of the first side 41. This can eliminate or reduce deviation of the tension that the first side 41 applies to the individual masks 50 from target tensions even if the frame 40 is large in size.

The displacement measuring mechanism 61 of the manufacturing apparatus 60 includes five or more displacement meters that measure the amounts of deformation of the first side 41 at the positions 100 mm or less distant from the pressing units in the second direction D2, as described above. This configuration allows accurate adjustment of the amounts of deformation at the individual positions of the first side 41. This can eliminate or reduce deviation of the tension that the first side 41 applies to the individual masks 50 from target tensions even if the frame 40 is large in size.

A disassemble method of detaching the masks 50 from the mask apparatus 15 may be performed. The disassemble method may detach the masks 50 from the frame 40 while applying pressing force to the first side 41 and the second side 42. This allows the masks 50 to be detached from the frame 40 while maintaining the deformation of the frame 40. The first pressing force applied to the frame 40 in the method of manufacturing the mask apparatus 15 can be presumed. The disassemble method may be performed using the displacement measuring mechanism 61, the pressing mechanism 62, and the control unit 63 of the manufacturing apparatus 60. The pressing force that the pressing mechanism 62 applies to the first side 41 and the second side 42 in the disassemble method for the mask apparatus 15 is also referred to as a second pressing force.

Figure 24:
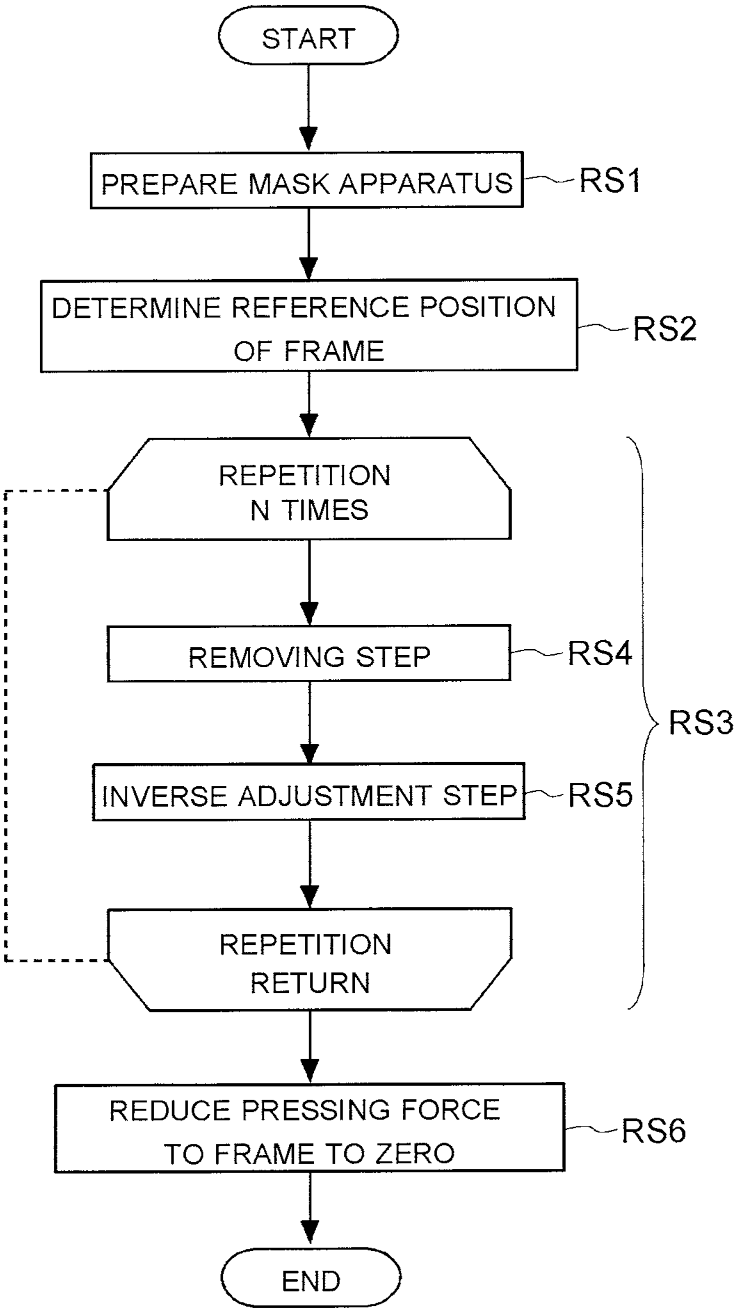
FIG. 24 is a flowchart illustrating an example of a method of disassembling the mask apparatus.

FIG. 24 is a flowchart illustrating an example of the disassemble method. First, the mask apparatus 15 is prepared (step RS1). The mask apparatus 15 may be placed on a stage (not shown). Next, the reference position of the frame 40 is determined (step RS2). Specifically, the final amounts of deformation of the first side 41 and the second side 42 of the frame 40 are measured using the displacement measuring mechanism 61. The final amounts of deformation of the first side 41 and the second side 42 are calculated on the basis of the straight line L11 and the straight line L12 each connecting the angles 46.

Next, a mask detaching step RS3 of detaching N masks 50 in order from the frame 40 is performed. The step of detaching an m-th mask 50 (where m is an integer greater than or equal to 1 and less than or equal to N) from the frame 40 is also referred to as an m-th-mask detaching step RS3(*m*). The mask detaching step RS3 includes N steps from a first-mask detaching step RS3(1) to an N-th-mask detaching step RS3(N).

The mask detaching step RS3 repeats a removing step RS4 and an inverse adjustment step RS5 N times, as shown in FIG. 24. The removing step and the inverse adjustment step in the m-th mask detaching step RS3(*m*) are also referred to as an m-th removing step RS4(*m*) and an m-th inverse adjustment step RS5(*m*), respectively.

The removing step RS4 removes the mask 50 from the frame 40. For example, the mask 50 is cut off. This causes the reactive force that the first side 41 and the second side 42 receive from the mask 50 becomes almost zero.

After the removing step RS5, the inverse adjustment step RS5 adjusts the second pressing forces that the pressing mechanism 62 applies to the first side 41 and the second side 42 in the direction toward the opening 45. Specifically, the inverse adjustment step RS5 adjusts the second pressing forces so that the amounts of deformation of the first side 41 and the second side 42 after the masks 50 are detached from the first side 41 and the second side 42 become final amounts of deformation.

In the following description, the second pressing force that is applied to the first side 41 in the m-th inverse adjustment step RS5(*m*) may be denoted by reference sign RP(m). The second pressing forces that the 11th pressing unit 62A1, the 12th pressing unit 62A2, the 21st pressing unit 62B1, the 22nd pressing unit 62B2, the first central pressing unit 62C1, and the second central pressing unit 62C2 apply to the first side 41 in the m-th inverse adjustment step RS5(*m*) may be denoted by reference sign RP(m)_A1, RP(m)_A2, RP(m)_B1, RP(m)_B2, RP(m)_C1, and RP(m)_C2, respectively.

The average value of the second pressing forces that the pressing units of the first group 62A apply to the first side 41 in the m-th inverse adjustment step RS5(*m*) may be denoted by reference sign RP(m)_A. The average value of the second pressing forces that the pressing units of the second group 62B apply to the first side 41 in the m-th inverse adjustment step RS5(*m*) may be denoted by reference sign RP(m)_B. The average value of the second pressing forces that the pressing units of the central group 62C apply to the first side 41 in the m-th inverse adjustment step RS5(*m*) may be denoted by reference sign RP(m)_C.

Figure 25:
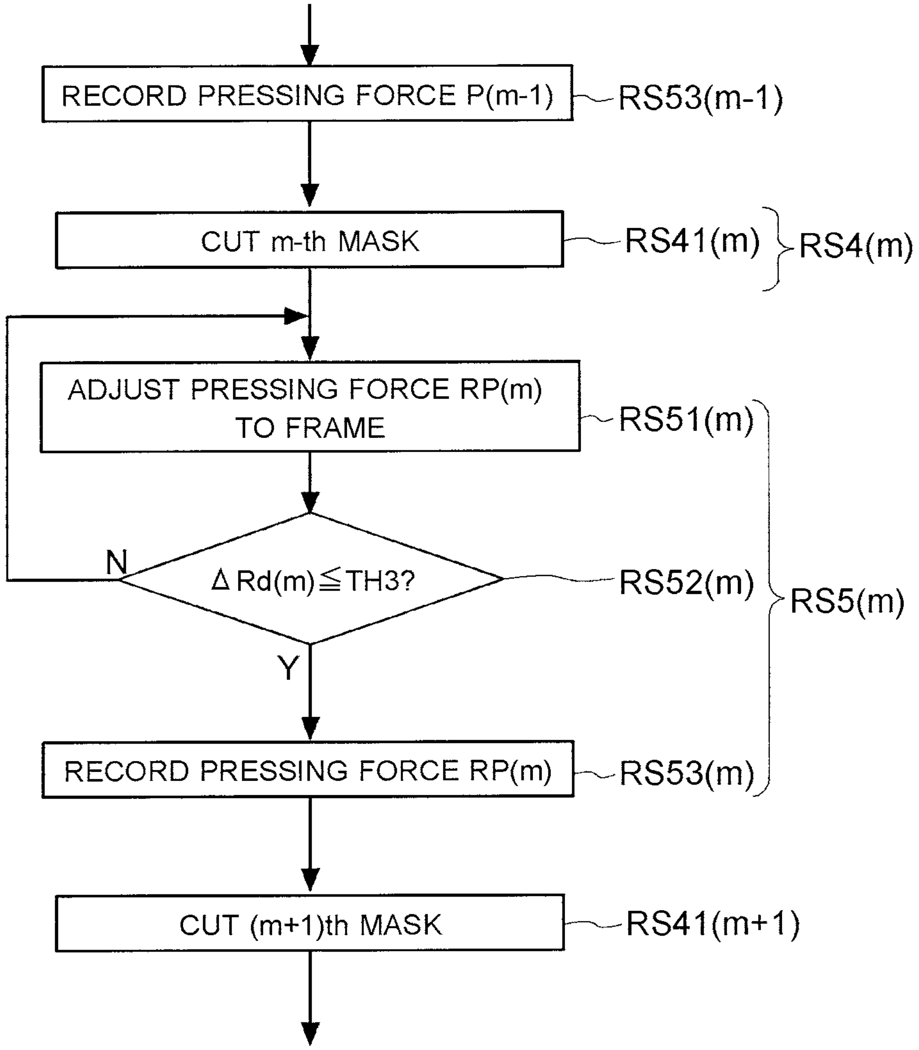
FIG. 25 is a flowchart illustrating an example of a removing step and an inverse adjustment step.

FIG. 25 is a flowchart illustrating an example of the removing step RS4 and the inverse adjustment step RS5.

The m-th removing step RS4(*m*) may include a cutting step RS41(*m*). The cutting step RS41(*m*) cuts the m-th mask 50.

The inverse adjustment step RS5 may include a pressing step RS51(*m*), a determination step RS52(*m*), and a recording step RS53(*m*). After the cutting step RS41(*m*), the pressing step RS51(*m*) adjusts the second pressing force RP(m) to the frame 40. The determination step RS52(*m*) determines whether ΔRd(m) is less than or equal to a third threshold TH3. The value ΔRd(m) is the absolute value of the difference between the amount of deformation Rd(m) and the final amount of deformation of the first side 41 in the pressing step RS51(*m*). As in the determination step S42(*k*) described above, the determination step RS52(*m*) may determine whether the amount of deformation ΔRd(m) measured with the first central displacement meter 61C1 is less than or equal to the third threshold TH3. The determination step RS52(*m*) may determine whether ΔRd(m) is less than or equal to the third threshold TH3 for the plurality of measured amounts of deformation. As in the determination step S42(*k*), the determination step RS52(*m*) may determine whether ΔRd(m) is less than or equal to the third threshold TH3 for each of the amounts of deformation measured by the individual displacement meters of the displacement measuring mechanism 61. The numerical range of the third threshold TH3 may be the same as the numerical range of the first threshold TH1.

The recording step RS53(*m*) records the second pressing force RP(m) when ΔRd(m) is less than or equal to the third threshold TH3.

After the mask detaching step RS3, a releasing step RS6 may be performed, as shown in FIG. 24. The releasing step RS6 reduces the second pressing force to the frame 40 to zero. For example, the rods 621 of the pressing units of the pressing mechanism 62 are separated from the frame 40.

Referring to FIG. 20 and FIGS. 26 to 29, a method of disassembling the mask apparatus 15 will be specifically described.

As shown in FIG. 20, the final amounts of deformation of the first side 41 and the second side 42 are measured with the displacement measuring mechanism 61, with N masks 50 fixed to the frame 40. Next, the mask detaching step RS3 of detaching N masks 50 from the frame 40 is performed. This embodiment shows an example in which the masks 50 are detached from the frame 40 in order of increasing distance from the center of the frame 40 in the second direction D2. Specifically, the first central mask 50C1, the second central mask 50C2, the 14th mask 50A4, the 24th mask 50B4, the 13th mask 50A3, the 23rd mask 50B3, the 12th mask 50A2, the 22nd mask 5062, the 11th mask 50A1, and the 21st mask 50B1 are detached from the first side 41 and the second side 42 in this order.

A first-mask detaching step RS3(1) of detaching the first mask 50 from the frame 40 is performed. The first mask 50 is the first central mask 50C1. The first-mask detaching step RS3(1) includes a first removing step RS4(1) and a first inverse adjustment step RS5(1).

Figure 26:
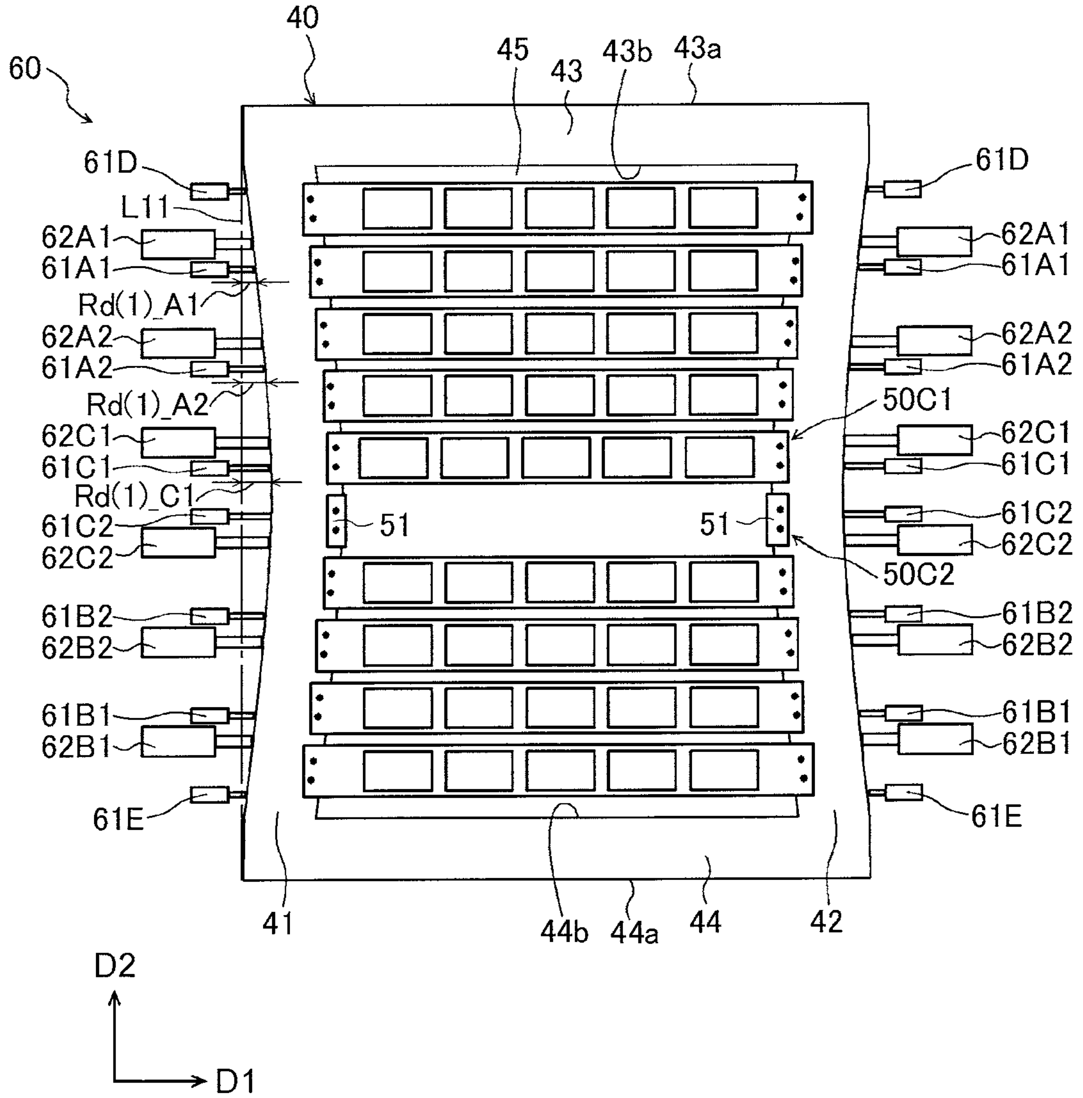
FIG. 26 is a diagram illustrating an example of a first removing step.

FIG. 26 is a diagram illustrating the first removing step RS4(1) and the first inverse adjustment step RS5(1). The first removing step RS4(1) includes a cutting step RS41(1). The cutting step RS41(1) cuts the first central mask 50C1, as shown in FIG. 26. The ends 51 of the first central mask 50C1 may be left on the frame 40.

The first inverse adjustment step RS5(1) includes a pressing step RS51(1), a determination step RS52(1), and a recording step RS53(1).

After the first central mask 50C1 is removed, as shown in FIG. 26, the pressing step RS51(1) presses the first side 41 and the second side 42. The control unit 63 controls the pressing mechanism 62 so that the amounts of deformation of the first side 41 and the second side 42 reach the final amounts of deformation.

The determination step RS52(1) determines whether ΔRd (1) is less than or equal to the third threshold TH3. If ΔRd(1) exceeds the third threshold TH3, the pressing step RS51(1) is performed again. If ΔRd(1) is less than or equal to the third threshold TH3, the process goes to the recording step RS53(1). The recording step RS53(1) records each of the second pressing forces that the pressing units of the pressing mechanism 62 apply to the first side 41 and the second side 42 as a second pressing force RP(1).

Figure 27:
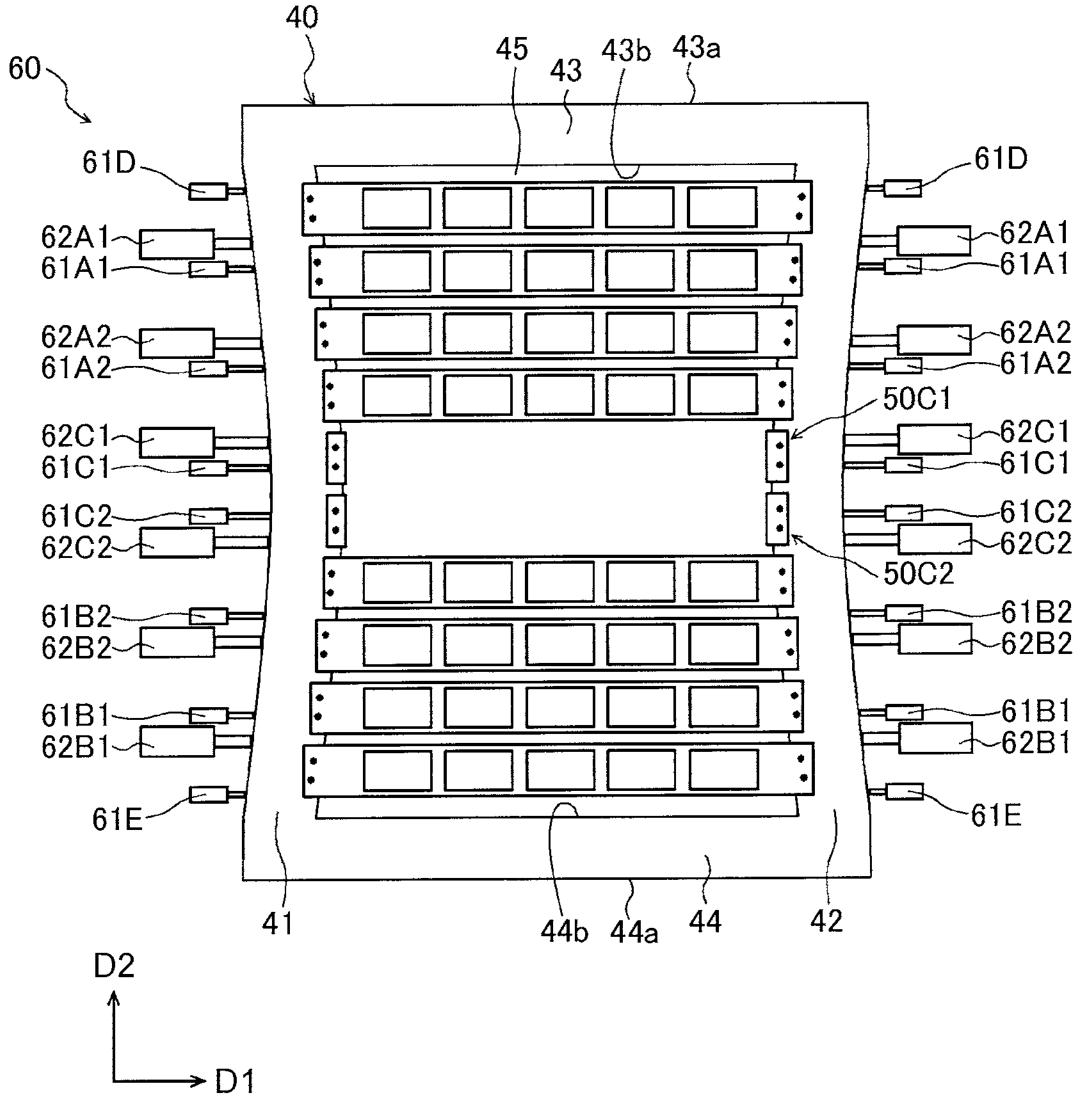
FIG. 27 is a diagram illustrating an example of a second removing step.

Next, as shown in FIG. 27, a second-mask detaching step RS3(2) of detaching the second mask 50 from the frame 40 is performed. The second mask 50 is the second central mask 50C2. The second-mask detaching step RS3(2) includes a second removing step RS4(2) and a second inverse adjustment step RS5(2). Thus, the masks 50 of the central mask group 50C are detached from the frame 40.

Figure 28:
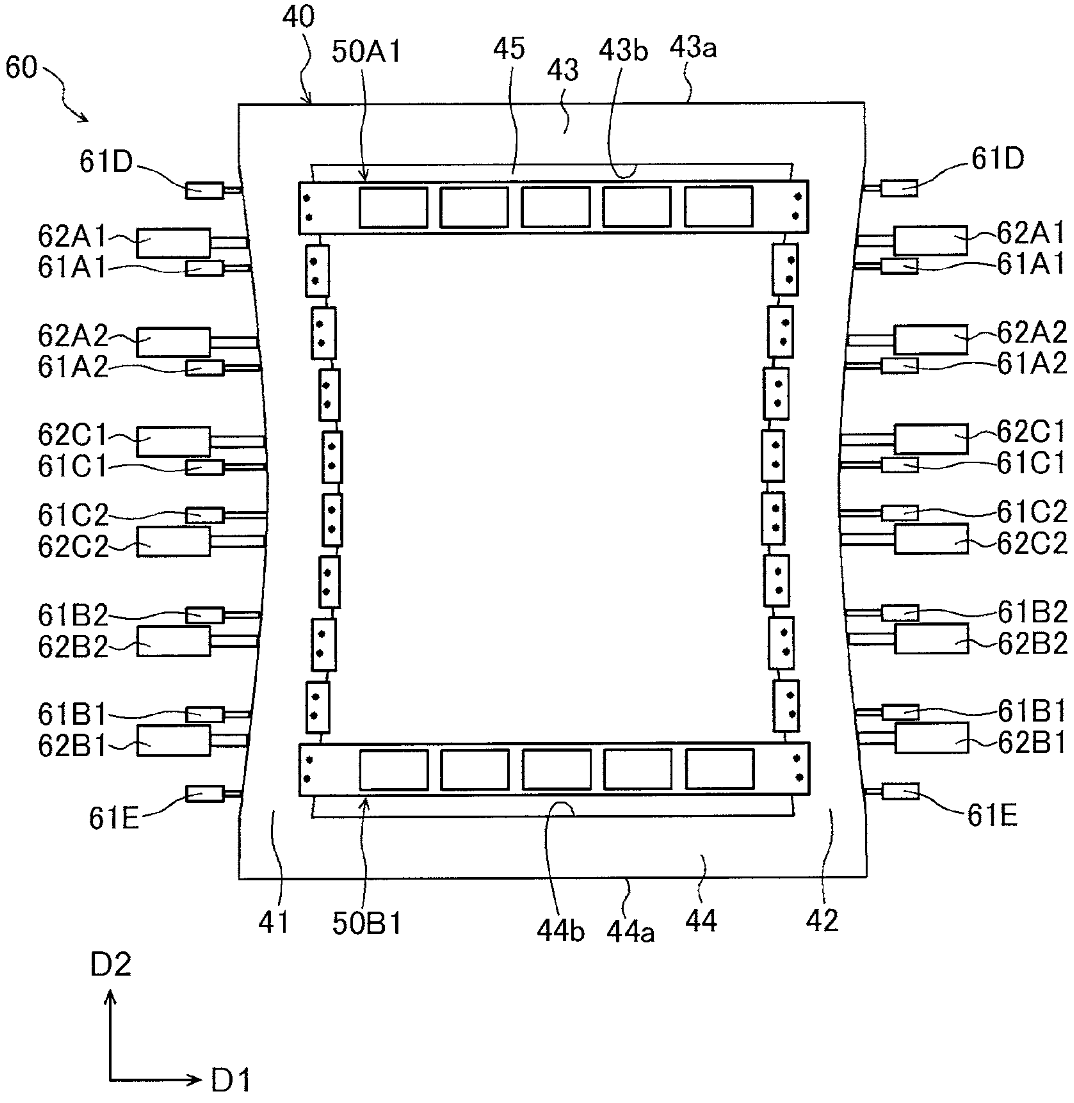
FIG. 28 is a diagram illustrating an example of a third removing step to an eighth removing step.

Next, as shown in FIG. 28, a third-mask detaching step RS3(3) to an eighth-mask detaching step RS3(8) are performed in order. The third-mask detaching step RS3(3) to the eighth-mask detaching step RS3(8) include a third removing step RS4(3) to an eighth removing step RS4(8) and a third inverse adjustment step RS5(3) to an eighth inverse adjustment step RS5(8).

Figure 29:
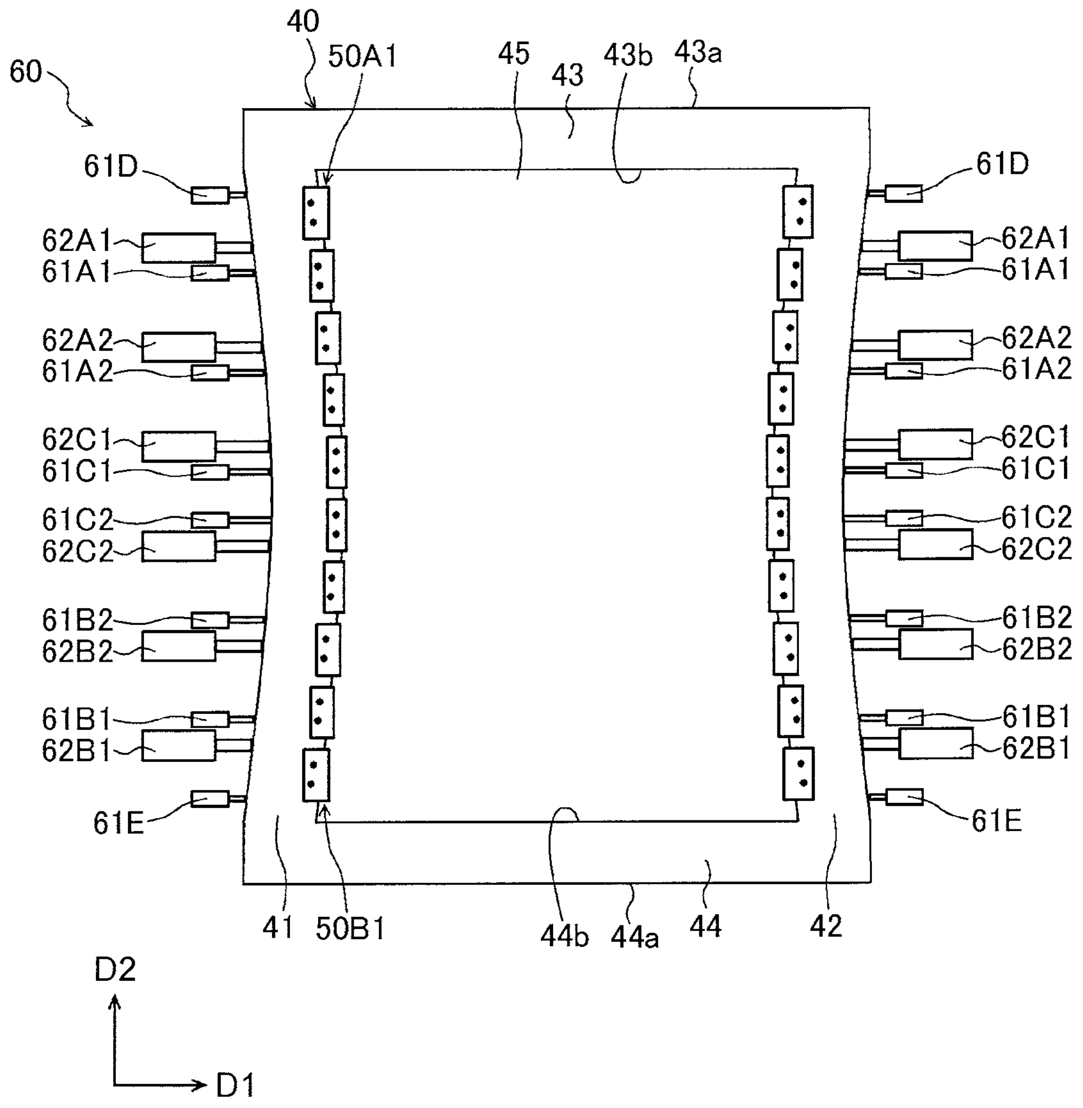
FIG. 29 is a diagram illustrating an example of a ninth removing step and a tenth removing step.

Next, as shown in FIG. 29, a ninth-mask detaching step RS3(9) to a tenth-mask detaching step RS3(10) are performed in order. The ninth-mask detaching step RS3(9) to the tenth-mask detaching step RS3(10) include a ninth removing step RS4(9) to a tenth removing step RS4(10) and a ninth inverse adjustment step RS5(9) to a tenth inverse adjustment step RS5(10).

Next, the releasing step RS6 is performed. For example, the rods 621 of the pressing units of the pressing mechanism 62 are separated from the frame 40.

Figure 30:
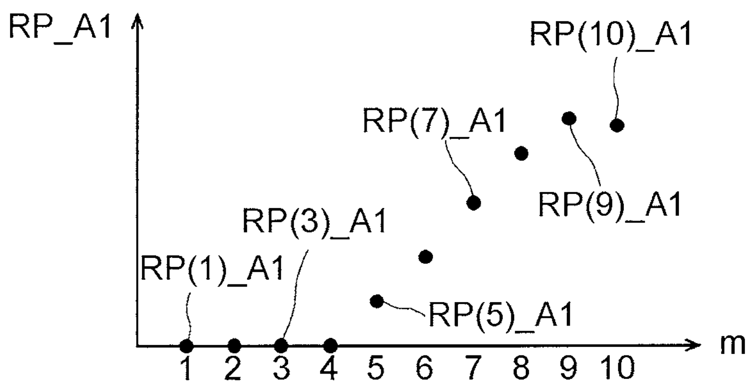
FIG. 30 is a graph showing an example of the pressing force of the 11th pressing unit.

FIG. 30 is a graph showing an example of the transition of a second pressing force RP_A1 that the 11th pressing unit 62A1 applies to the first side 41 during the period from the first inverse adjustment step RS5(1) to the tenth inverse adjustment step RS5(10). As shown in FIG. 30, the second pressing force RP_A1 may be increased during two or more times of inverse adjustment step RS5. In the example shown in FIG. 30, the second pressing force RP_A1 increases during the period from the fourth inverse adjustment step RS5(4) to the ninth adjustment step RS5(9).

As shown in FIG. 30, the second pressing force RP_A1 may be increased from zero from the second inverse adjustment step RS5 onward. In the example shown in FIG. 30, the second pressing force RP_A1 becomes greater than zero at the fifth adjustment step RS5(5).

Figure 31:
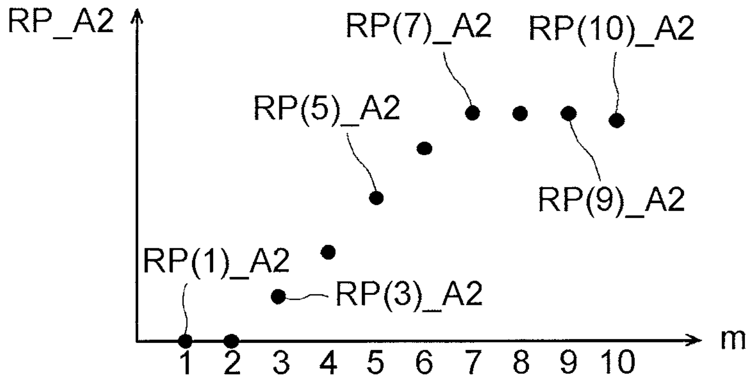
FIG. 31 is a graph showing an example of the pressing force of the 12th pressing unit.

FIG. 31 is a graph showing an example of the transition of a second pressing force RP_A2 that the 12th pressing unit 62A2 applies to the first side 41 during the period from the first inverse adjustment step RS5(1) to the tenth inverse adjustment step RS5(10). As shown in FIG. 31, the second pressing force RP_A2 may be increased during two or more times of inverse adjustment step RS5. In the example shown in FIG. 31, the second pressing force RP_A2 increases during the period from the second inverse adjustment step RS5(2) to the seventh inverse adjustment step RS5(7).

As shown in FIG. 31, the second pressing force RP_A2 may become greater than zero from the second inverse adjustment step RS5 onward. In the example shown in FIG. 31, the second pressing force RP_A2 becomes greater than zero at the third adjustment step RS5(3). The second pressing force RP_A2 may become greater than zero before the second pressing force RP_A1 becomes greater than zero.

Figure 32:
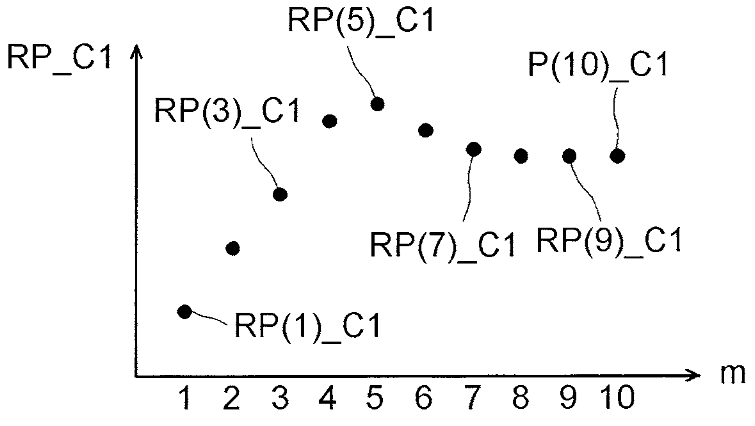
FIG. 32 is a graph showing an example of the pressing force of the first central pressing unit.

FIG. 32 is a graph showing an example of the transition of a second pressing force RP_C1 that the first central pressing unit 62C1 applies to the first side 41 during the period from the first inverse adjustment step RS5(1) to tenth inverse adjustment step RS5(10). As shown in FIG. 32, the second pressing force RP_C1 may be increased during two or more times of inverse adjustment step RS5. In the example shown in FIG. 32, the second pressing force RP_C1 increases during the period from the first inverse adjustment step RS5(1) to the fifth inverse adjustment step RS5(5). The period during which the second pressing force RP_C1 increases may be before the period during which the second pressing forces of the pressing units of the first group 62A increase.

As shown in FIG. 32, the second pressing force RP_C1 may be greater than zero at the first inverse adjustment step RS5(1).

The second pressing force RP_C1 may stand at the maximum value at a Q-th inverse adjustment step RS5(Q) (where Q is an integer greater than 1 and less than N). In the example shown in FIG. 32, the second pressing force RP_C1 stands at the maximum value at the fifth inverse adjustment step RS5(5).

Inequality $Q \leq N/2$ may be satisfied. In other words, the second pressing force RP_C1 may stand at the maximum value in the first half of the inverse adjustment step RS5.

The first central pressing unit 62C1 applies the second pressing force RP(N)_C1 to the first side 41 in the last inverse adjustment step RS5, that is, in the N-th inverse adjustment step RS5(N).

The ratio of the second pressing force RP(Q)_C1 to the second pressing force RP(N)_C1 may be, for example, 1.05 or higher, 1.10 or higher, or 1.15 or higher. The ratio of the second pressing force RP(Q)_C1 to the second pressing force RP(N)_C1 may be, for example, 1.20 or lower, 1.30 or lower, or 1.50 or lower. The second pressing force RP(Q)_C1 is a second pressing force that the first central pressing unit 62C1 applies to the first side 41 in the Q-th inverse adjustment step RS5(Q).

The range of the ratio of the second pressing force RP(Q)_C1 to the second pressing force RP(N)_C1 may be defined by a first group of 1.05, 1.10, and 1.15 and/or a second group of 1.20, 1.30, and 1.50. The ratio of the second pressing force RP(Q)_C1 to the second pressing force RP(N)_C1 may be defined by a combination of any one of the values included in the first group and any one of the values includes in the second group. The ratio of the second pressing force RP(Q)_C1 to the second pressing force RP(N)_C1 may be defined by any two combinations of the values included in the first group. The ratio of the second pressing force RP(Q)_C1 to the second pressing force RP(N)_C1 may be defined by any two combinations of the values included in the second group. For example, the ratio of the second pressing force RP(Q)_C1 to the second pressing force RP(N)_C1 may be 1.05 or higher and 1.50 or lower, 1.05 or higher and 1.30 or lower, 1.05 or higher and 1.20 or lower, 1.05 or higher and 1.15 or lower, 1.05 or higher and 1.10 or lower, 1.10 or higher and 1.50 or lower, 1.10 or higher and 1.30 or lower, 1.10 or higher and 1.20 or lower, 1.10 or higher and 1.15 or lower, 1.15 or higher and 1.50 or lower, 1.15 or higher and 1.30 or lower, 1.15 or higher and 1.20 or lower, 1.20 or higher and 1.50 or lower, 1.20 or higher and 1.30 or lower, or 1.30 or higher and 1.50 or lower.

The transition of the second pressing force RP_A1 shown in FIG. 30 may also be made by the 21st pressing unit 62B1. The transition of the second pressing force RP_A2 shown in FIG. 31 may also be made by the 22nd pressing unit 62B2. The transition of the second pressing force RP_C1 shown in FIG. 32 may also be made the second central pressing unit 62C2.

The control unit 63 may control the pressing mechanism 62 so that the difference between the second pressing forces that the pressing units of the pressing mechanism 62 apply to the first side 41 in the N-th inverse adjustment step RS5(N) falls within a predetermined range. For example, the control unit 63 may control the pressing mechanism 62 so that the third ratio RA3 and the fourth ratio RA4 are less than or equal to predetermined values. The third ratio RA3 is the ratio of the average second pressing force RP(N)_A of the first group 62A to the average second pressing force RP(N)_C of the central group 62C in the N-th inverse adjustment step RS5(N). The fourth ratio RA4 is the ratio of the average second pressing force RP(N)_B of the second group 62B to the average second pressing force RP(N)_C of the central group 62C in the N-th inverse adjustment step RS5(N). The average second pressing force RP(N)_A is the average value of the second pressing forces that the pressing units of the first group 62A apply to the first side 41 in the N-th inverse adjustment step RS5(N). The average second pressing force RP(N)_B is the average value of the second pressing forces that the pressing units of the second group 62B apply to the first side 41 in the N-th inverse adjustment step RS5(N). The average second pressing force RP(N)_C is the average value of the second pressing forces that the pressing units of the central group 62C apply to the first side 41 in the N-th inverse adjustment step RS5(N).

The third ratio RA3 and the fourth ratio RA4 may be, for example, 0.6 or higher, 0.7 or higher, 0.8 or higher, or 0.9 or higher. The third ratio RA3 and the fourth ratio RA4 may be, for example, 1.1 or lower, 1.2 or lower, 1.3 or lower, or 1.4 or lower. The range of the third ratio RA3 and the fourth ratio RA4 may be defined by a first group of 0.6, 0.7, 0.8, and 0.9 and/or a second group of 1.1, 1.2, 1.3, and 1.4. The range of the third ratio RA3 and the fourth ratio RA4 may be defined by a combination of any one of the values included in the first group and any one of the values included in the second group. The range of the third ratio RA3 and the fourth ratio RA4 may be defined by any two combinations of the values included in the first group. The range of the third ratio RA3 and the fourth ratio RA4 may be defined by any two combinations of the values included in the second group. For example, the third ratio RA3 and the fourth ratio RA4 may be 0.6 or higher and 1.4 or lower, 0.6 or higher and 1.3 or lower, 0.6 or higher and 1.2 or lower, 0.6 or higher and 1.1 or lower, 0.6 or higher and 0.9 or lower, 0.6 or higher and 0.8 or lower, 0.6 or higher and 0.7 or lower, 0.7 or higher and 1.4 or lower, 0.7 or higher and 1.3 or lower, 0.7 or higher and 1.2 or lower, 0.7 or higher and 1.1 or lower, 0.7 or higher and 0.9 or lower, 0.7 or higher and 0.8 or lower, 0.8 or higher and 1.4 or lower, 0.8 or higher and 1.3 or lower, 0.8 or higher and 1.2 or lower, 0.8 or higher and 1.1 or lower, 0.8 or higher and 0.9 or lower, 0.9 or higher and 1.4 or lower, 0.9 or higher and 1.3 or lower, 0.9 or higher and 1.2 or lower, 0.9 or higher and 1.1 or lower, 1.1 or higher and 1.4 or lower, 1.1 or higher and 1.3 or lower, 1.1 or higher and 1.2 or lower, 1.2 or higher and 1.4 or lower, 1.2 or higher and 1.3 or lower, or 1.3 or higher and 1.4 or lower.

The above embodiment may be variously modified. Other embodiments will be described hereinbelow with reference to the drawing as needed. In the following description and the drawings used in the following description, the elements with the same configurations as those of the above embodiment are denoted by the same reference signs as the signs used for the corresponding elements of the embodiment. Redundant description will be omitted. The operational advantages given in the above embodiment may be omitted if they are apparently given in the other embodiments.

Figure 33:
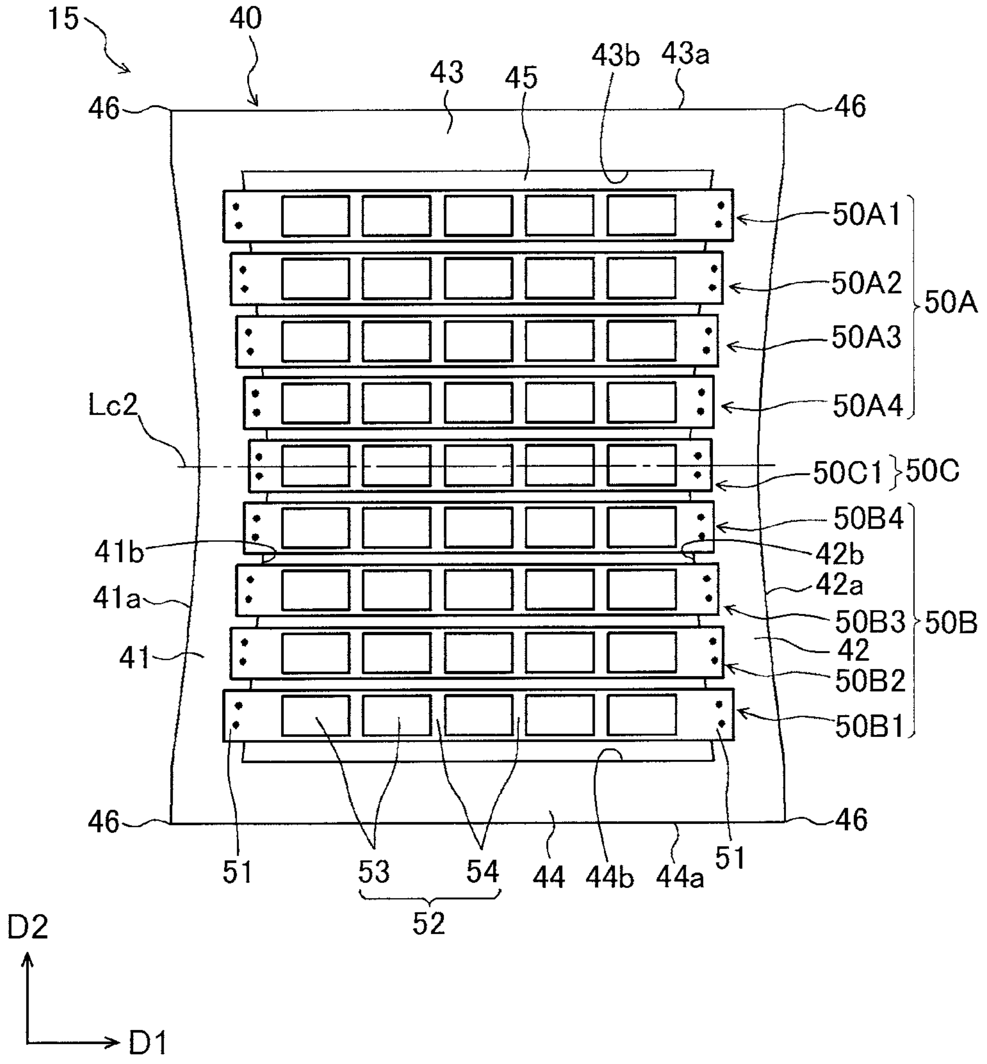
FIG. 33 is a plan view of an example of a mask apparatus.

FIG. 33 is a plan view of a mask apparatus 15 according to a second embodiment. The mask apparatus 15 includes N masks 50 arranged in a second direction. The value N is an odd number. The mask apparatus 15 shown in FIG. 33 includes nine masks 50.

A central mask group 50C includes one mask 50. Specifically, the central mask group 50C includes a first central mask 50C1. The first central mask 50C1 may overlap with a second center line Lc2.

A first mask group 50A includes one or more masks 50. The first mask group 50A may include two or more masks 50. The first mask group 50A shown in FIG. 33 includes an 11th mask 50A1, a 12th mask 50A2, a 13th mask 50A3, and a 14th mask 50A4 arranged in order in the direction from a third side 43 to the second center line Lc2.

The second mask group 50B includes one or more masks 50. The second mask group 50B may include two or more masks 50. The number of masks 50 included in the second mask group 50B may be the same as the number of masks 50 included in the first mask group 50A. The second mask group 50B shown in FIG. 33 includes a 21st mask 50B1, a 22nd mask 50B2, a 23rd mask 50B3, and a 24th mask 50B4 arranged in order in the direction from the fourth side 44 to the second center line Lc2.

Figure 34:
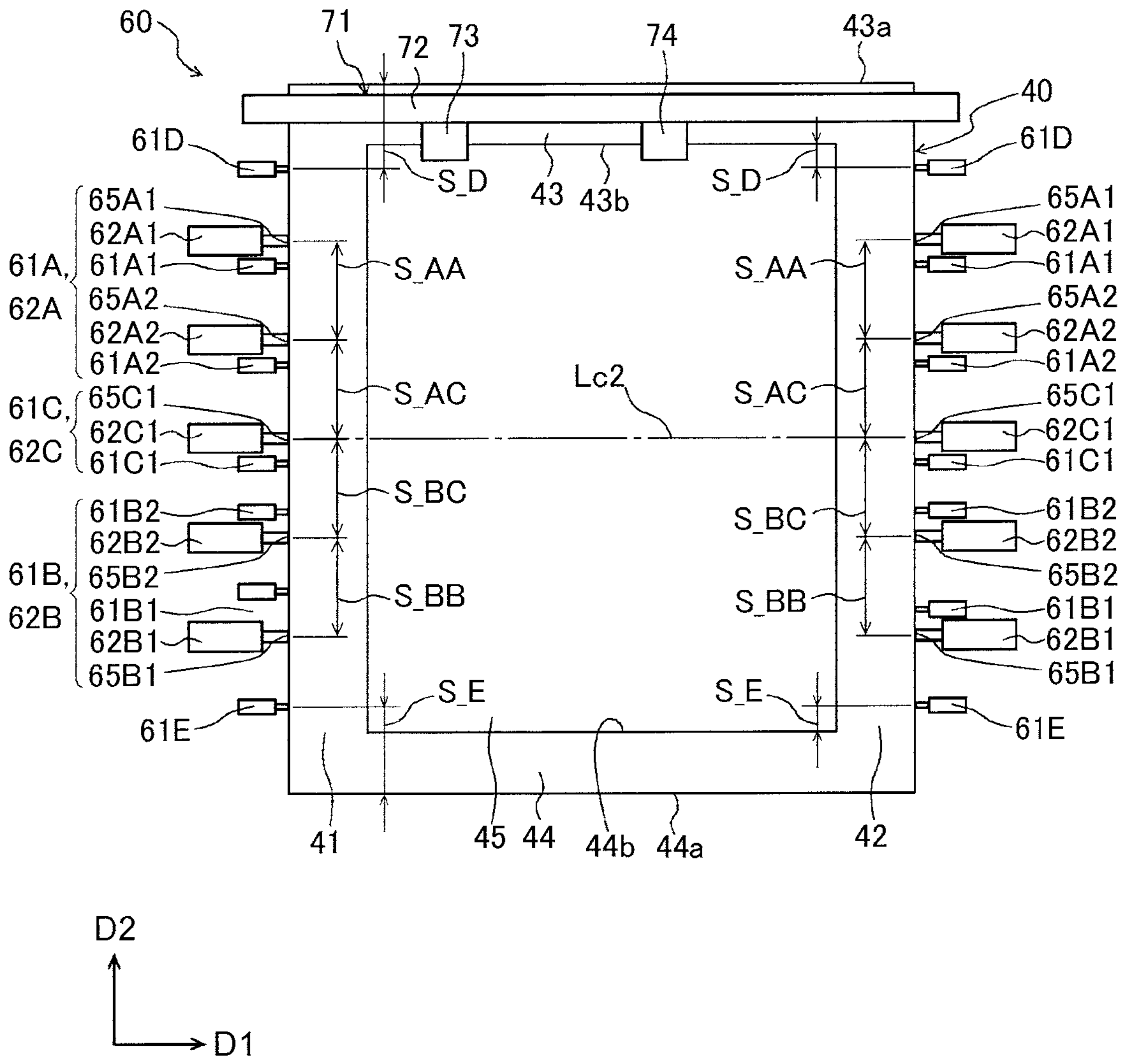
FIG. 34 is a plan view of an example of a manufacturing apparatus.

FIG. 34 is a plan view of a manufacturing apparatus 60 according to the second embodiment.

A pressing mechanism 62 that presses the first side 41 includes a central group 62C, a first group 62A, and a second group 62B. The central group 62C may include one pressing unit. Specifically, the central group 62C includes a first central pressing unit 62C1. The first central pressing unit 62C1 may overlap with the second center line Lc2.

The first group 62A includes two or more pressing units. In this embodiment, the first group 62A includes an 11th pressing unit 62A1 and a 12th pressing unit 62A2 arranged in order in the direction from the third side 43 to the second center line Lc2.

The second group 62B includes two or more pressing units. The number of pressing units included in the second group 62B may be the same as the number of pressing units included in the first group 62A. In this embodiment, the second group 62B include a 21st pressing unit 62B1 and a 22nd pressing unit 62B2 arranged in order in the direction from the fourth side 44 to the second center line Lc2.

A displacement measuring mechanism 61 that measures the amount of deformation of the first side 41 includes a central measurement group 61C, a first measurement group 61A, and a second measurement group 61B. The central measurement group 61C may include one displacement meter. Specifically, the central measurement group 61C may include a first central displacement meter 61C1. The first central displacement meter 61C1 is located near the first central pressing unit 62C1. The displacement measuring mechanism 61 may include a first auxiliary displacement meter 61D and a second auxiliary displacement meter 61E.

The first measurement group 61A includes two or more displacement meters. In this embodiment, the first measurement group 61A includes an 11th displacement meter 61A1 and a 12th displacement meter 61A2 arranged in order in the direction from the third side 43 to the second center line Lc2. The 11th displacement meter 61A1 is located near the 11th pressing unit 62A1. The 12th displacement meter 61A2 is located near the 12th pressing unit 62A2.

The second measurement group 61B includes two or more displacement meters. In this embodiment, the second measurement group 61B includes a 21st displacement meter 61B1 and a 22nd displacement meter 61B2 arranged in order in the direction from the fourth side 44 to the second center line Lc2. The 21st displacement meter 61B1 is located near the 21st pressing unit 62B1. The 22nd displacement meter 61B2 is located near the 22nd pressing unit 62B2.

The pressing units of the pressing mechanism 62 are arranged at intervals of 500 mm or less in the second direction D2, as in the above embodiment. This allows accurate adjustment of the amounts of deformation of the first side 41 at the individual positions of the first side 41. This can eliminate or reduce deviation of the tension that the first side 41 applies to the masks 50 from a target tension even if the frame 40 is large.

The displacement meters of the displacement measuring mechanism 61 measure the amounts of deformation of the first side 41 at positions 100 mm or less apart from the corresponding pressing units in the second direction, as in the above embodiment. This allows accurate adjustment of the amounts of deformation at the individual positions of the first side 41. This can eliminate or reduce deviation of the tension that the first side 41 applies to the masks 50 from a target tension even if the frame 40 is large.

Figure 35:
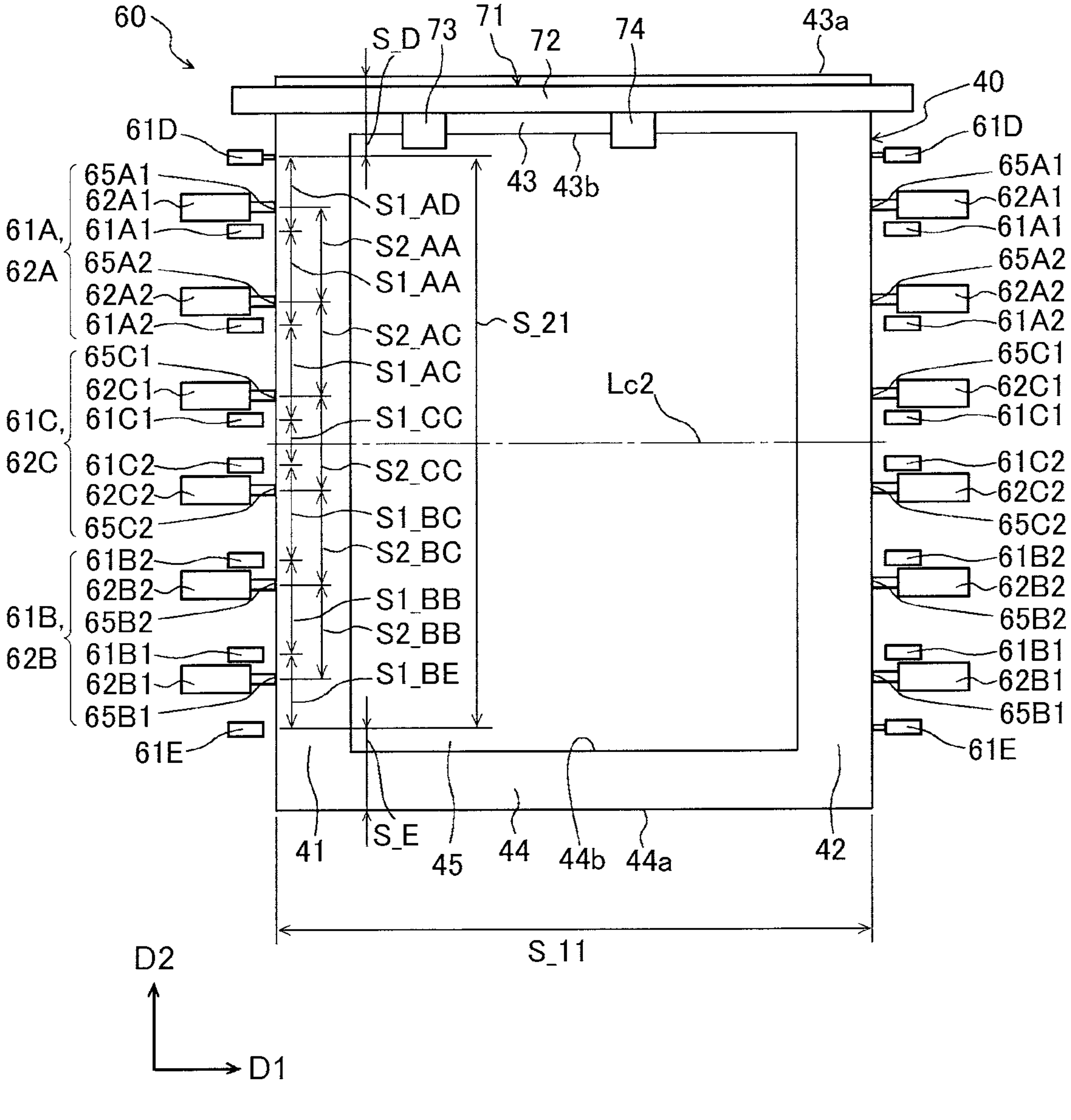
FIG. 35 is a plan view of an example of a manufacturing apparatus.

FIG. 35 is a plan view of a manufacturing apparatus 60 according to a third embodiment. The displacement meters of the displacement measuring mechanism 61 may measure the amounts of deformation of the first side 41 and the second side 42 without contact with the frame 40. The displacement meters are of an optical type, an eddy current type, an ultrasonic type, a laser focusing type, a capacitance type, or the like.

A laser focusing displacement meter applies laser light to the frame 40 and detects laser light reflected by the frame 40.

A capacitance type displacement meter measures the electrostatic capacitance between the displacement meter and the frame 40 and calculates the distance between the displacement meter and the frame 40 on the basis of the electrostatic capacitance.

Figure 36:
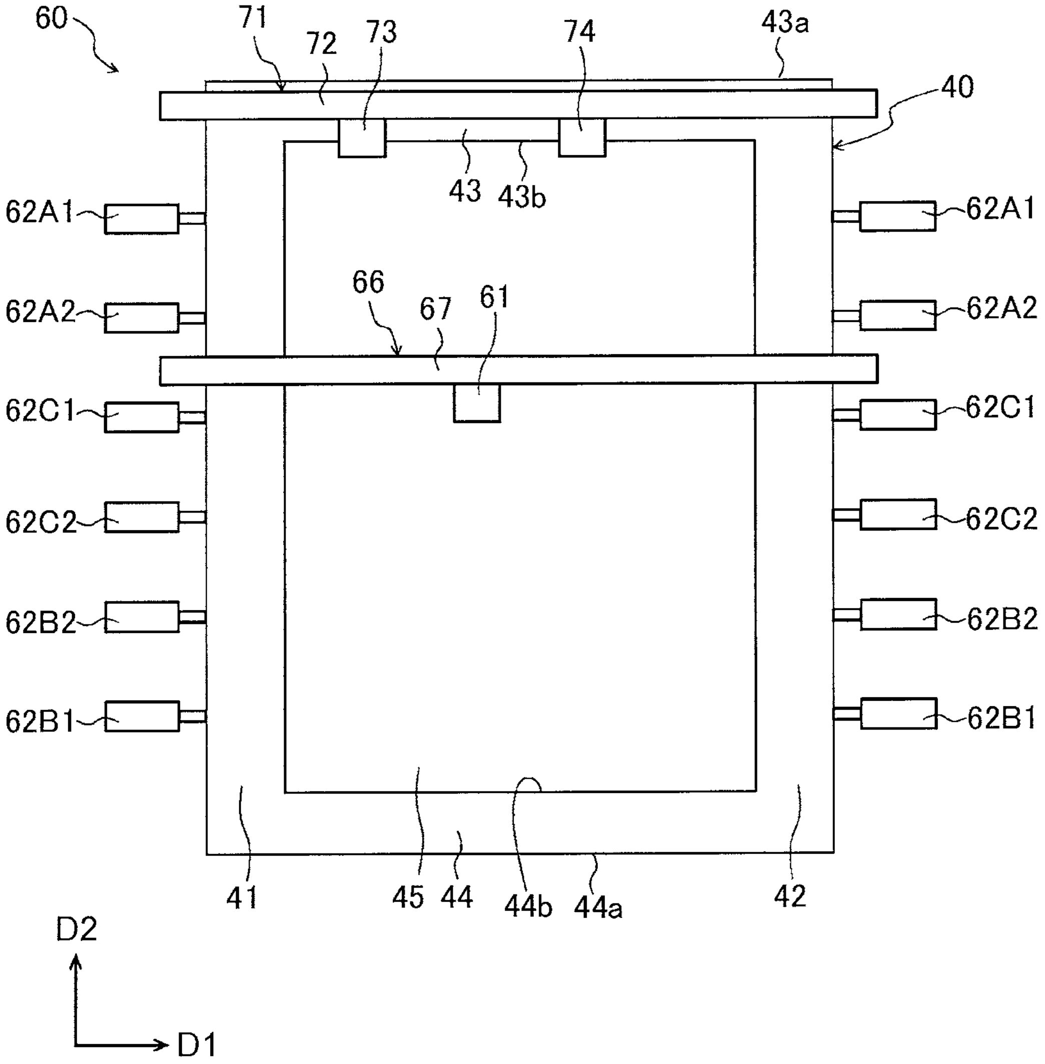
FIG. 36 is a plan view of an example of a manufacturing apparatus.

FIG. 36 is a plan view of a manufacturing apparatus 60 according to a fourth embodiment. The displacement measuring mechanism 61 may be supported by a moving mechanism 66. In this case, the displacement measuring mechanism 61 measures the amounts of deformation of the first side 41 and the second side 42 without contact with the frame 40. The moving mechanism 66 moves the displacement measuring mechanism 61 in the first direction D1 and the second direction D2. For example, the moving mechanism 66 may include a first moving unit 67 that moves the displacement measuring mechanism 61 in the first direction D1. The moving mechanism 66 may include a second moving unit that moves the first moving unit 67 in the second direction D2. The amounts of deformation of the first side 41 and the second side 42 can be measured by having the displacement measuring mechanism 61 observe the frame 40 at a plurality of positions.

The above embodiments are examples in which the masks 50 are attached to the first side 41 and the second side 42 in order of decreasing distance from the center of the frame 40 in the second direction D2. In a fifth embodiment, the masks 50 are attached to the first side 41 and the second side 42 in order of increasing distance from the center of the frame 40 in the second direction D2. In other words, in this embodiment, the masks 50 of the central mask group 50C are attached to the first side 41 and the second side 42 before the masks 50 of the first mask group 50A and the masks 50 of the second mask group 50B are attached. If the distances from the center of the frame 40 in the second direction D2 are the same, the masks 50 located between the third side 43 and the second center line Lc2 are attached to the first side 41 and the second side 42 before the masks 50 located between the fourth side 44 and the second center line Lc2 are attached. Accordingly, the first central mask 50C1, the second central mask 50C2, the 14th mask 50A4, the 24th mask 50B4, the 13th mask 50A3, the 23rd mask 5063, the 12th mask 50A2, the 22nd mask 5062, the 11th mask 50A1, and the 21st mask 50B1 are attached to the first side 41 and the second side 42 in this order.

First, a first-mask attaching step S3(1) of attaching the first mask 50 to the frame 40 is performed. The first mask 50 is the first central mask 50C1. The first-mask attaching step S3(1) includes a first adjustment step S4(1) and a first placement step S5(1).

The first adjustment step S4(1) includes a pressing step S41(1) and a determination step S42(1), as in the first embodiment. The first placement step S5(1) includes a position adjusting step S51(1), a determination step S52(1), and a fixing step S53(1), as in the first embodiment.

Figure 40:
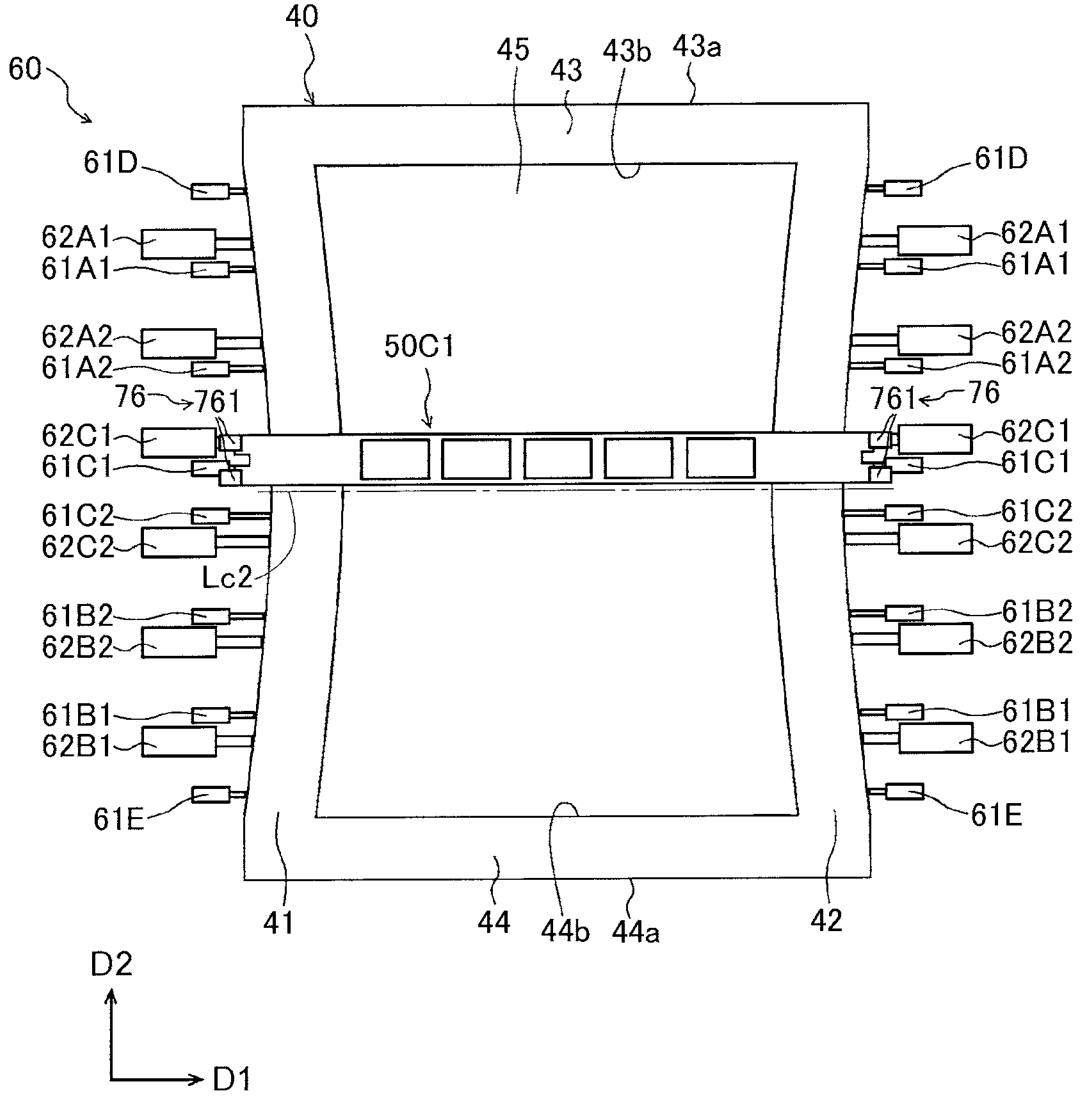
FIG. 40 is a diagram illustrating an example of a first-mask attaching step according to a fifth embodiment.
Figure 41:
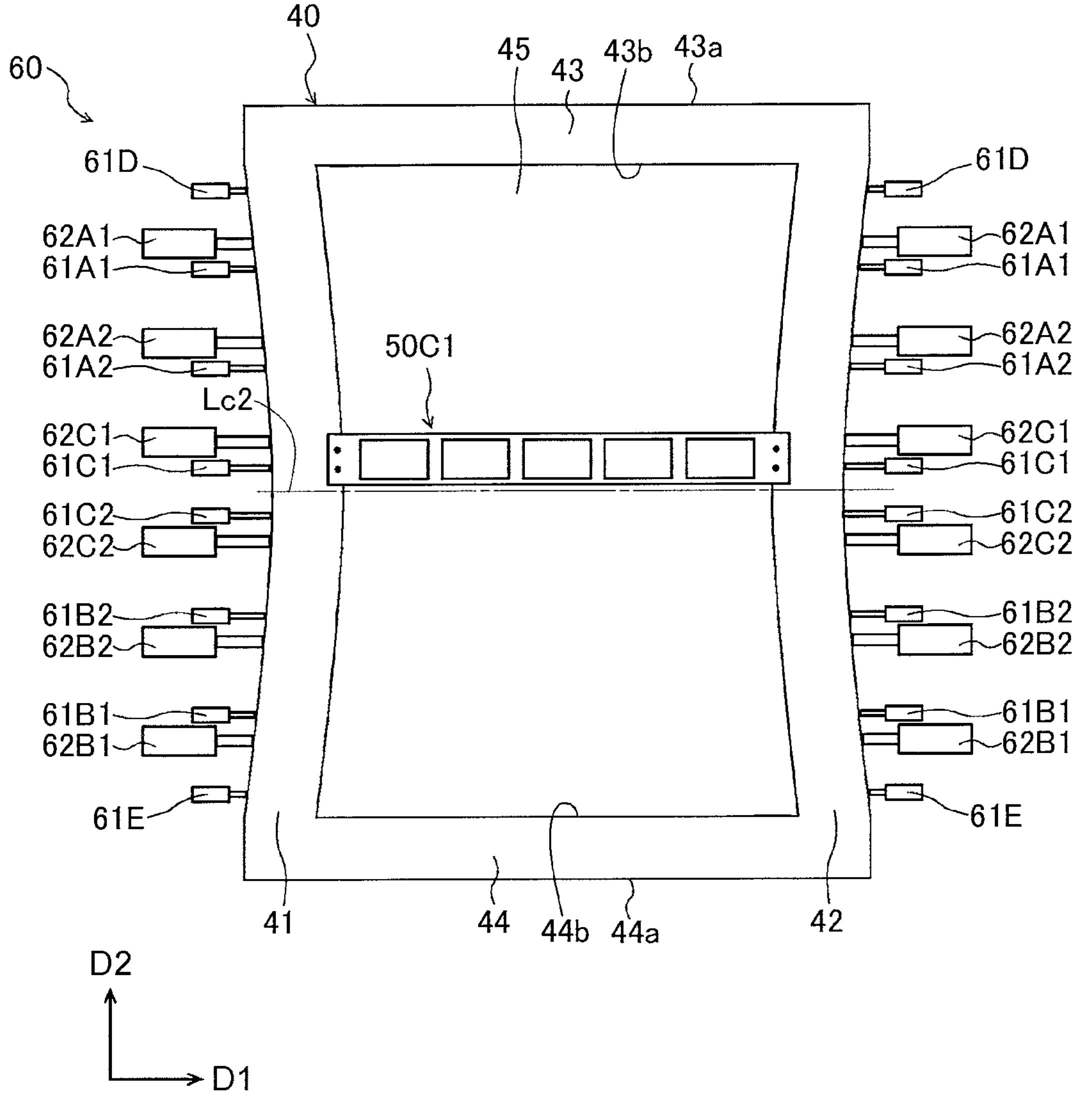
FIG. 41 is a diagram illustrating an example of the first-mask attaching step according to the fifth embodiment.

The position adjusting step S51(1) adjusts the position of the first central mask 50C1, with the first central mask 50C1 subjected to tension, as shown in FIG. 40. The determination step S52(1) observes the position of the first central mask 50C1 using the observation unit 73. The determination step S52(1) determines whether the mask error of the first central mask 50C1 is the second threshold TH2 or less. If the mask error exceeds the second threshold TH2, the position adjusting step S51(1) is performed again. If the mask error is less than or equal to the second threshold TH2, the process goes to the fixing step S53(1). FIG. 41 is a diagram illustrating the fixing step S53(1).

Figure 42:
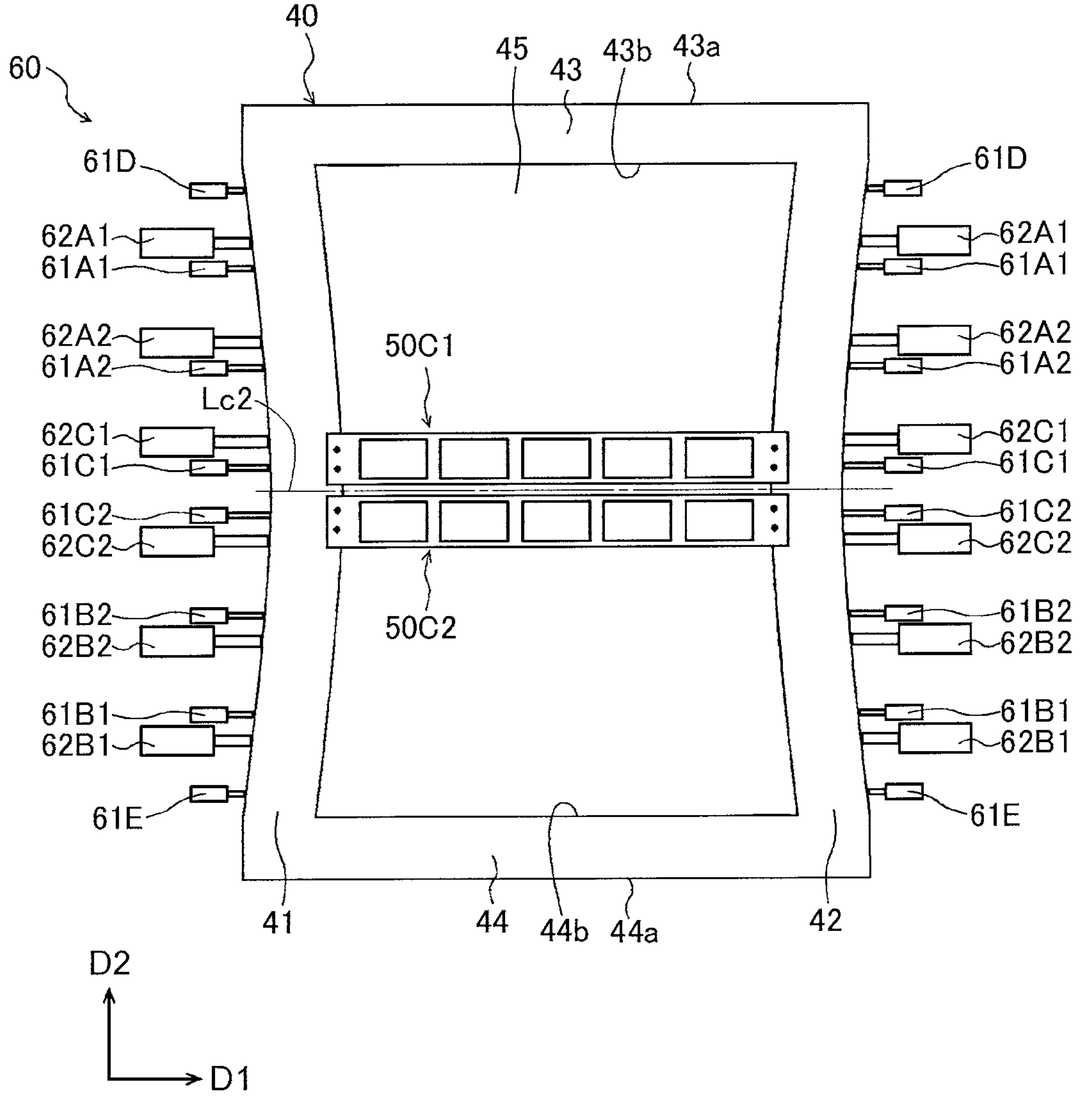
FIG. 42 is a diagram illustrating an example of a second-mask attaching step according to the fifth embodiment.

Next, as shown in FIG. 42, a second-mask attaching step S3(2) of attaching the second mask 50 to the frame 40 is performed. The second mask 50 is the second central mask 50C2. The second-mask attaching step S3(2) includes a second adjustment step S4(2) and a second placement step S5(2).

Figure 43:
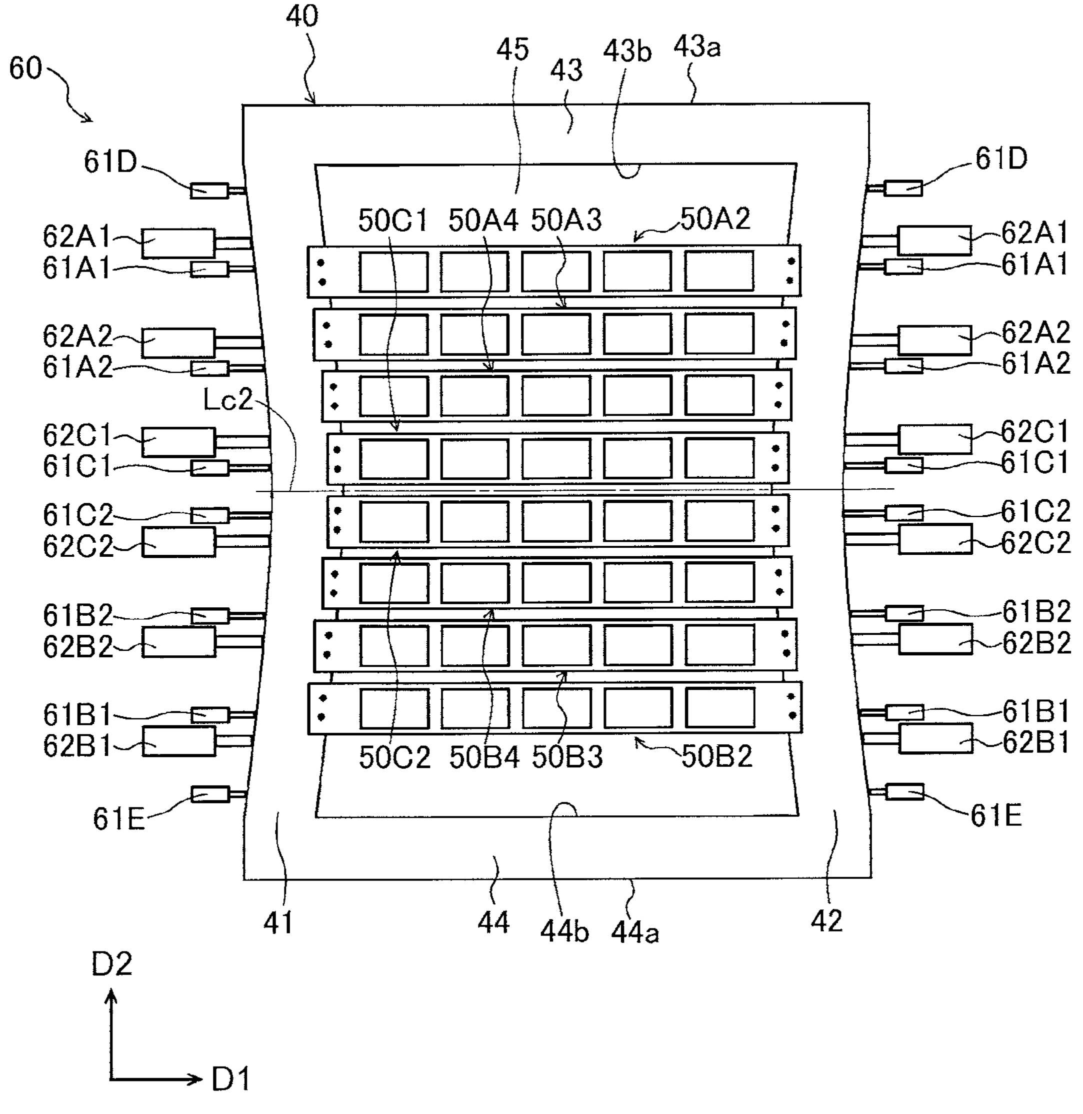
FIG. 43 is a diagram illustrating an example of a third-mask attaching step to an eighth-mask attaching step according to the fifth embodiment.

Next, as shown in FIG. 43, a third-mask attaching step S3(3) to an eighth-mask attaching step S3(8) are performed in order. This allows the 14th mask 50A4, the 24th mask 50B4, the 13th mask 50A3, the 23rd mask 5063, the 12th mask 50A2, and the 22nd mask 5062 to be attached to the frame 40 in this order. The third-mask attaching step S3(3) to the eighth-mask attaching step S3(8) include a third adjustment step S4(3) to an eighth adjustment step S4(8), and a third placement step S5(3) to an eighth placement step S5(8).

Figure 44:
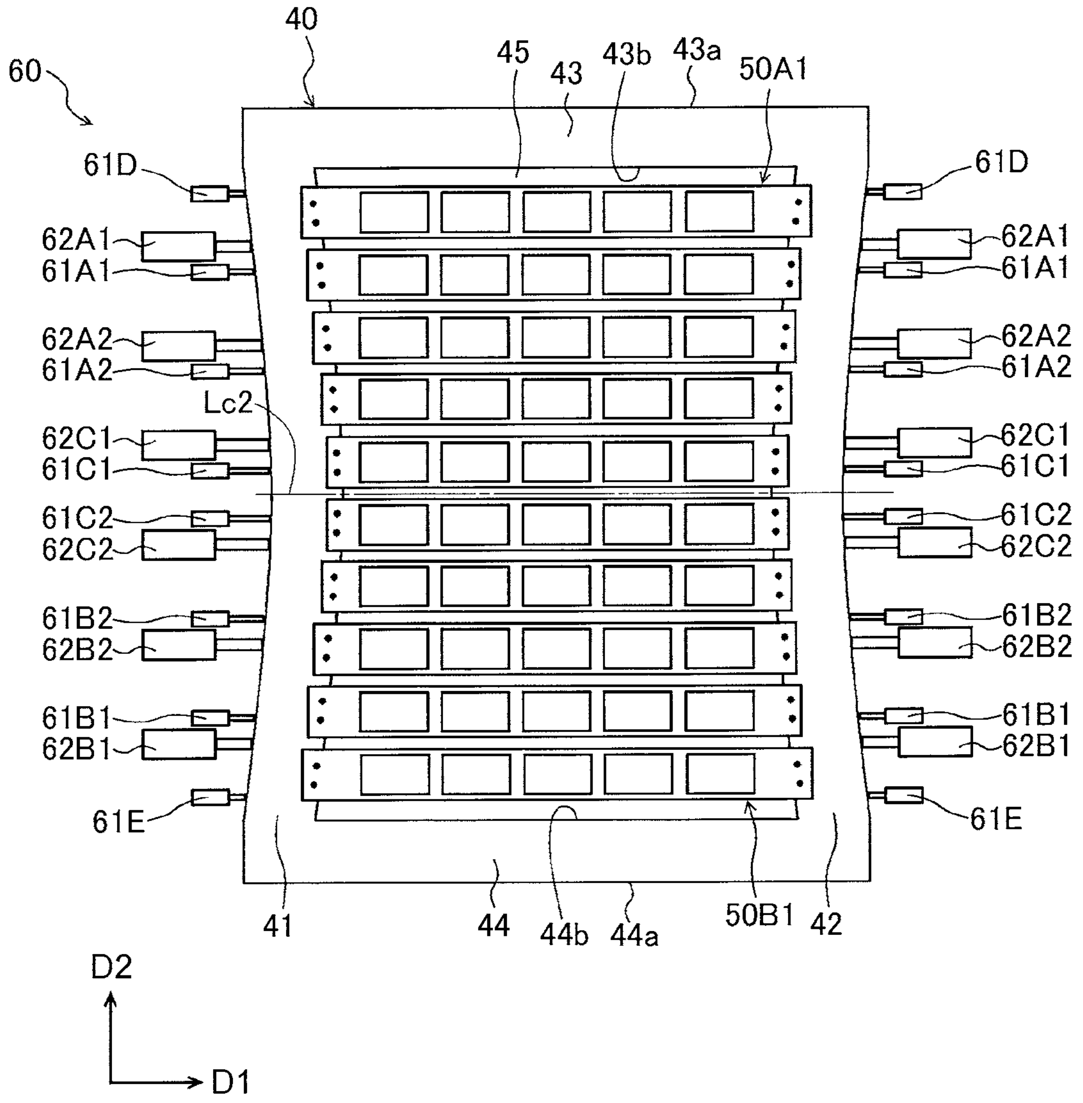
FIG. 44 is a diagram illustrating an example of a ninth-mask attaching step and a tenth-mask attaching step according to the fifth embodiment.

Next, as shown in FIG. 44, a ninth-mask attaching step S3(9) to a tenth-mask attaching step S3(10) are performed in order. This allows the 11th mask 50A1 and the 21st mask 50B1 to be attached to the frame 40 in this order. The ninth-mask attaching step S3(9) to the tenth-mask attaching step S3(10) include a ninth placement step S5(9) to a tenth placement step S5(10) and a ninth adjustment step S4(9) to a tenth adjustment step S4(10).

Next, a releasing step S6 is performed. For example, the rods 621 of the pressing units of the pressing mechanism 62 are separated from the frame 40. Next, a final checking step S7 is performed. The final checking step S7 determines whether the difference between the final amounts of deformation and the target amounts of deformation of the first side 41 and the second side 42 are less than or equal to the first threshold TH1. If the difference is less than or equal to the first threshold TH1, the mask apparatus 15 is approved as an acceptable product.

Figure 45:
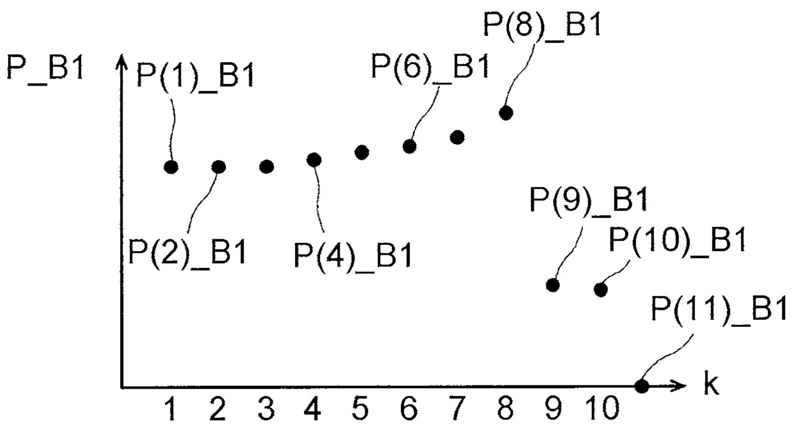
FIG. 45 is a graph showing an example of the pressing force of a 21st pressing unit according to the fifth embodiment.

FIG. 45 is a graph showing an example of the transition of a first pressing force P_B1 that the 21st pressing unit 62B1 applies to the first side 41 during the period from the first adjustment step S4(1) to the tenth adjustment step S4(10). The 21st pressing unit 62B1 is a pressing unit closest to the fourth side 44 among the pressing units of the second group 62B. As shown in FIG. 45, the first pressing force P_B1 may be decreased during two or more times of adjustment step S4. In the example shown in FIG. 45, the first pressing force P_B1 decreases during the period from the eighth adjustment step S4(8) to the tenth adjustment step S4(10). The period during which the first pressing force P_B1 decreases may be after the period during which the first pressing forces of the pressing units of the central group 62C decrease.

As shown in FIG. 45, the first pressing force P_B1 may be greater than zero at the last adjustment step S4, that is, at the N-th adjustment step S4(N). In the example shown in FIG. 45, the last adjustment step S4 is the tenth adjustment step S4(10). Reference sign P(11)_B1 denotes the first pressing force P_B1 at the releasing step S6. The first pressing force P(11)_B1 is zero.

The first pressing force P_B1 may stand at the maximum value at the U-th adjustment step S4(U) (where U is an integer greater than 1 and less than N). This allows reducing the difference between the amount of deformation and the target amount of deformation of the second measurement group 61B. In the example shown in FIG. 45, the first pressing force P_B1 stands at the maximum value at the eighth adjustment step S4(8). In the U-th adjustment step S4(U), the 21st pressing unit 62B1 applies the first pressing force P(U)_B1 to the first side 41.

Inequality $U \geq N/2$ may be satisfied. In other words, the first pressing force P_B1 may stand at the maximum value in the latter half of the adjustment step S4.

The ratio of the first pressing force P(U)_B1 to the first pressing force P(1)_B1 may be, for example, 1.05 or higher, 1.10 or higher, or 1.15 or higher. The ratio of the first pressing force P(U)_B1 to the first pressing force P(1)_B1 may be, for example, 1.20 or lower, 1.30 or lower, or 1.50 or lower. The first pressing force P(1)_B1 is a first pressing force that the 21st pressing unit 62B1 applies to the first side 41 in the first adjustment step S4(1).

The range of the ratio of the first pressing force P(U)_B1 to the first pressing force P(1)_B1 may be defined by a first group of 1.05, 1.10, and 1.15 and/or a second group of 1.20, 1.30, and 1.50. The range of the ratio of the first pressing force P(U)_B1 to the first pressing force P(1)_B1 may be defined by a combination of any one of the values included in the first group and any one of the values included in the second group. The range of the ratio of the first pressing force P(U)_B1 to the first pressing force P(1)_B1 may be defined by any two combinations of the values included in the first group. The range of the ratio of the first pressing force P(U)_B1 to the first pressing force P(1)_B1 may be defined by any two combinations of the values included in the second group. For example, the ratio of the first pressing force P(U)_B1 to the first pressing force P(1)_B1 may be 1.05 or higher and 1.50 or lower, 1.05 or higher and 1.30 or lower, 1.05 or higher and 1.20 or lower, 1.05 or higher and 1.15 or lower, 1.05 or higher and 1.10 or lower, 1.10 or higher and 1.50 or lower, 1.10 or higher and 1.30 or lower, 1.10 or higher and 1.20 or lower, 1.10 or higher and 1.15 or lower, 1.15 or higher and 1.50 or lower, 1.15 or higher and 1.30 or lower, 1.15 or higher and 1.20 or lower, 1.20 or higher and 1.50 or lower, 1.20 or higher and 1.30 or lower, or 1.30 or higher and 1.50 or lower.

Figure 46:
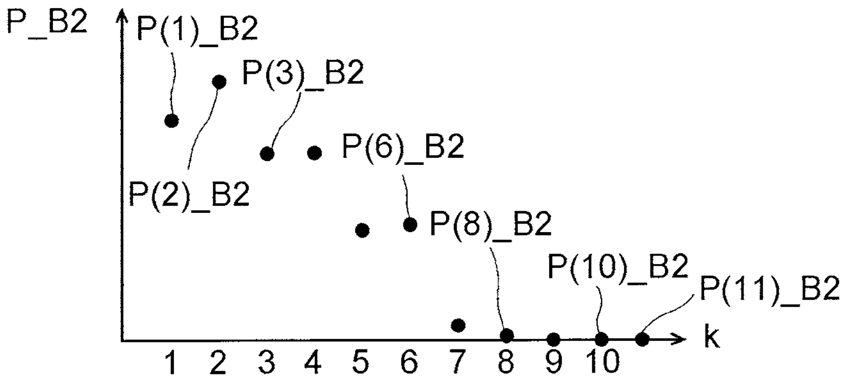
FIG. 46 is a graph showing an example of the pressing force of a 22nd pressing unit according to the fifth embodiment.

FIG. 46 is a graph showing an example of the transition of a first pressing force P_B2 that the 22nd pressing unit 62B2 applies to the first side 41 during the period from the first adjustment step S4(1) to the tenth adjustment step S4(10). As shown in FIG. 46, the first pressing force P_B2 may be decreased during two or more times of adjustment step S4. In the example shown in FIG. 46, the first pressing force P_B2 decreases during the period from the sixth adjustment step S4(6) to the eighth adjustment step S4(8). The period during which the first pressing force P_B2 decreases may be after the period during which the first pressing forces of the pressing units of the central group 62C decrease. The period during which the first pressing force P_B2 decreases may be before the period during which the first pressing force P_B1 decreases.

As shown in FIG. 46, the first pressing force P_B2 may become zero before the last adjustment step S4, that is, before the tenth adjustment step S4(10). In the example shown in FIG. 46, the first pressing force P_B2 becomes zero in the ninth adjustment step S4(9). The first pressing force P_B2 may become zero before the first pressing force P_B1 becomes zero. Reference sign P(11)_B2 denotes the first pressing force P_B2 in the releasing step S6. The first pressing force P(11)_B2 is zero.

The first pressing force P_B2 may stand at the maximum value at a step other than the first adjustment step S4(1). This allows reducing the difference between the amounts of deformation and the target amount of deformation in the second measurement group 61B. In the example shown in FIG. 46, the first pressing force P_B2 stands at the maximum value at the second adjustment step S4(2). In the second adjustment step S4(2), the 22nd pressing unit 62B2 applies the first pressing force P(2)_B2 to the first side 41. The first pressing force P_B2 may stand at the maximum value at the third adjustment step S4(3) or the fourth adjustment step S4(4) (not shown).

The range of the ratio of the maximum value of the first pressing force P_B2 to the first pressing force P(1)_B2 may be the same as the numerical range of "the ratio of the first pressing force P(U)_B1 to the first pressing force P(1)_B1" described above.

Figure 47:
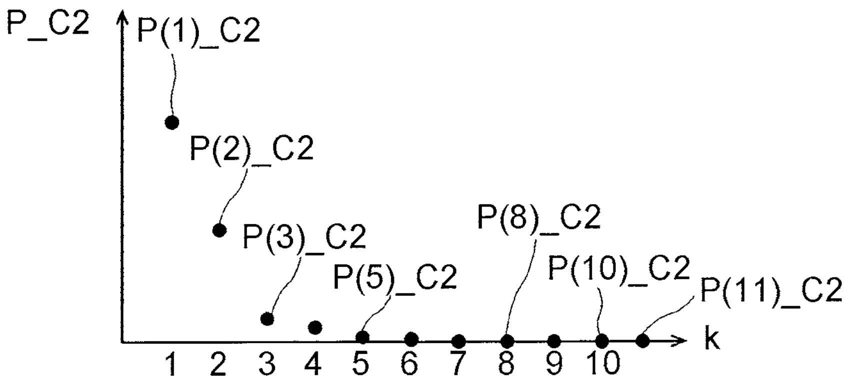
FIG. 47 is a graph showing an example of the pressing force of a second central pressing unit according to the fifth embodiment.

FIG. 47 is a graph showing an example of the transition of a first pressing force P_C2 that the second central pressing unit 62C2 applies to the first side 41 during the period from the first adjustment step S4(1) to the tenth adjustment step S4(10). As shown in FIG. 47, the first pressing force P_C2 may be decreased during two or more times of adjustment step S4. In the example shown in FIG. 47, the first pressing force P_C2 decreases during the period from the first adjustment step S4(1) to the seventh adjustment step S4(7). Thus, the first pressing force P_C2 may monotonically decrease from the first adjustment step S4(1).

As shown in FIG. 47, the first pressing force P_C2 may become zero before the last adjustment step S4, that is, before the tenth adjustment step S4(10). In the example shown in FIG. 47, the first pressing force P_C2 becomes zero at the seventh adjustment step S4(7). Reference sign P(11)_C2 denotes the first pressing force P_C2 at the releasing step S6. The first pressing force P(11)_C2 is zero.

The transition of the first pressing force P_B1 shown in FIG. 45 may also be made by the 11th pressing unit 62A1. The transition of the first pressing force P_B2 shown in FIG. 46 may also be made by the 12th pressing unit 62A2. The transition of the first pressing force P_C2 shown in FIG. 47 may also be made by the first central pressing unit 62C1.

In the first adjustment step S4(1), the control unit 63 may control the pressing mechanism 62 so that the difference between the first pressing forces that the pressing units of the pressing mechanism 62 apply to the first side 41 falls within a predetermined range. For example, the control unit 63 may control the pressing mechanism 62 so that the first ratio RA1 and the second ratio RA2 are less than or equal to predetermined values, as in the first embodiment.

Figure 48:
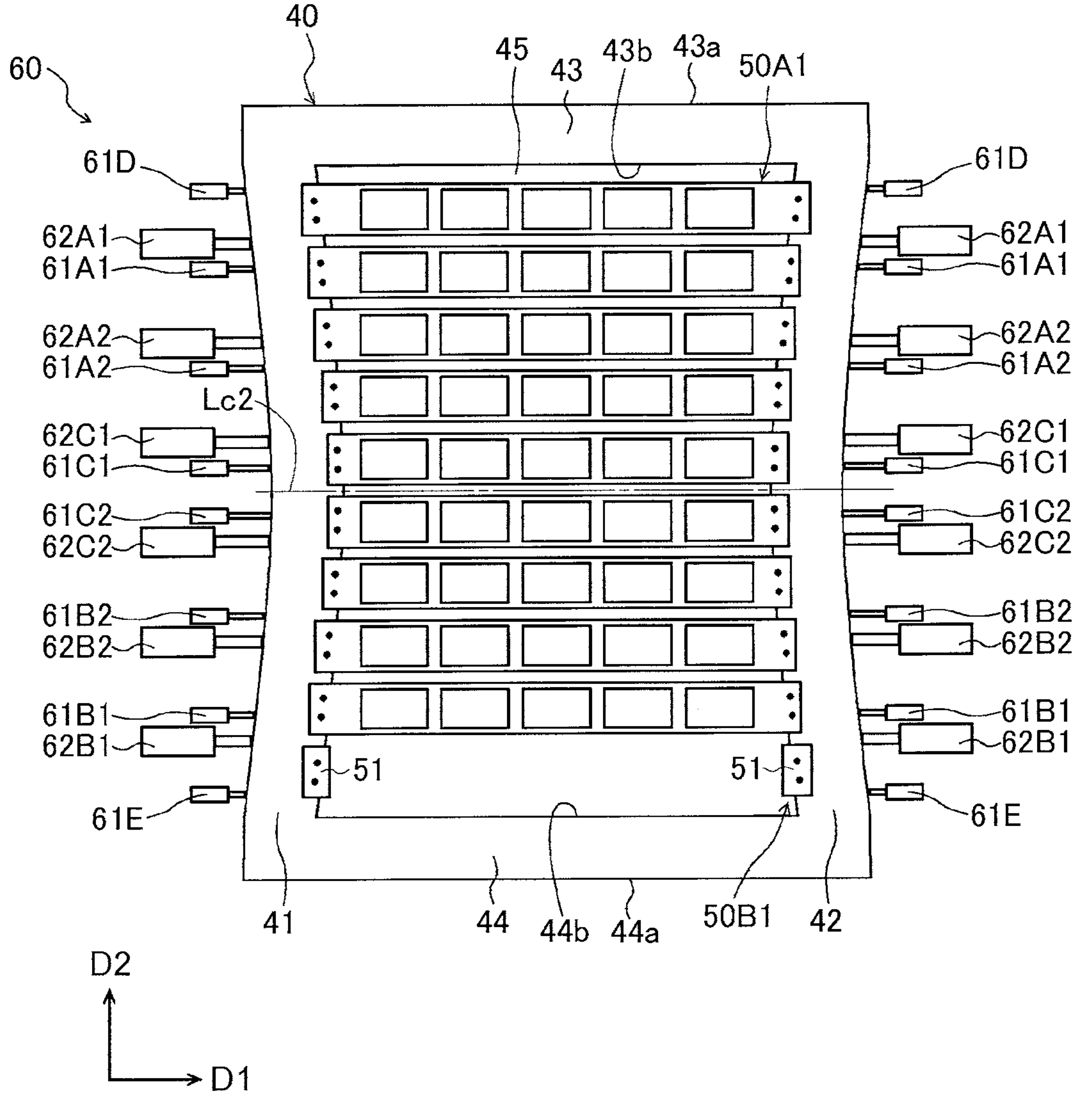
FIG. 48 is a diagram illustrating an example of a first removing step according to the fifth embodiment.
Figure 49:
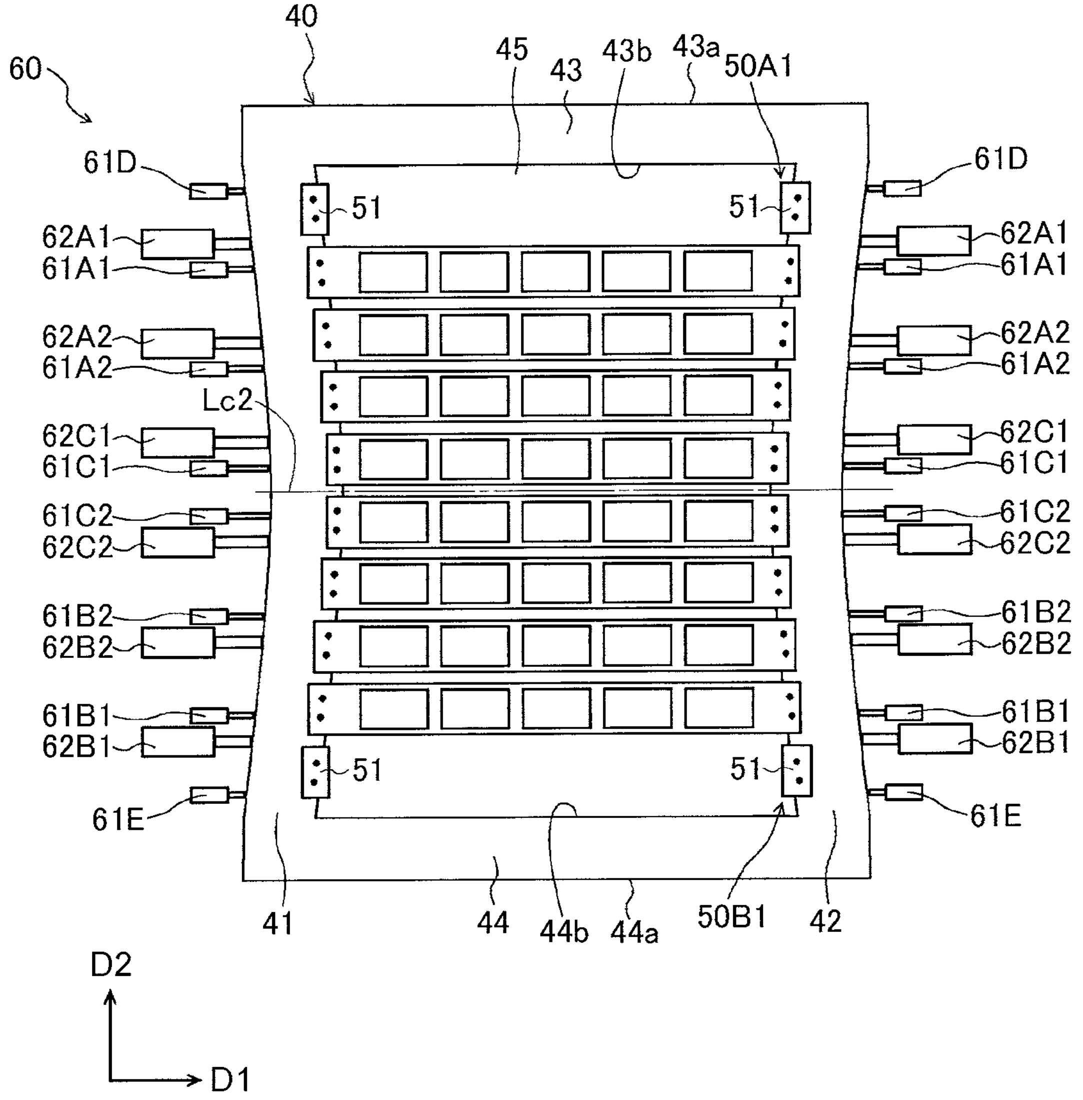
FIG. 49 is a diagram illustrating an example of a second removing step according to the fifth embodiment.

A disassemble method of detaching the masks 50 from the mask apparatus 15 may be performed. Referring to FIG. 44 and FIGS. 48 to 49, the method of disassembling the mask apparatus 15 will be specifically described.

As shown in FIG. 44, the final amounts of deformation of the first side 41 and the second side 42 are measured using the displacement measuring mechanism 61, with N masks 50 fixed to the frame 40. Next, the mask detaching step RS3 of detaching the N masks 50 from the frame 40 is performed. This embodiment shows an example in which the masks 50 are detached from the frame 40 in order of decreasing distance from the center of the frame 40 in the second direction D2. In other words, in this embodiment, the masks 50 of the first mask group 50A and the masks 50 of the second mask group 50B are detached from the frame 40 before the masks 50 of the central mask group 50C are detached. If the distances from the frame 40 in the second direction D2 are the same, the masks 50 located between the fourth side 44 and the second center line Lc2 are detached from the frame 40 before the masks 50 located between the third side 43 and the second center line Lc2 are detached. Accordingly, the 21st mask 50B1, the 11th mask 50A1, the 22nd mask 50B2, the 12th mask 50A2, the 23rd mask 50B3, the 13th mask 50A3, the 24th mask 50B4, the 14th mask 50A4, the second central mask 50C2, and the first central mask 50C1 are detached from the frame 40 in this order.

A first-mask detaching step RS3(1) of detaching the first mask 50 from the frame 40 is performed. The first mask 50 is the 21st mask 50B1. The first-mask detaching step RS3(1) includes a first removing step RS4(1) and a first inverse adjustment step RS5(1), as in the above embodiments.

FIG. 48 is a diagram illustrating the first removing step RS4(1) and the first inverse adjustment step RS5(1). The first removing step RS4(1) includes a cutting step RS41(1). The cutting step RS41(1) cuts the 21st mask 50B1, as shown in FIG. 48. The ends 51 of the 21st mask 50B1 may be left on the frame 40.

The first inverse adjustment step RS5(1) includes a pressing step RS51(1), a determination step RS52(1), and a recording step RS53(1).

After the 21st mask 50B1 is removed, as shown in FIG. 48, the pressing step RS51(1) presses the first side 41 and the second side 42. The control unit 63 controls the pressing mechanism 62 so that the amounts of deformation of the first side 41 and the second side 42 reach the final amounts of deformation.

The determination step RS52(1) determines whether ΔRd(1) is less than or equal to the third threshold TH3. If ΔRd(1) exceeds the third threshold TH3, the pressing step RS51(1) is performed again. If ΔRd(1) is less than or equal to the third threshold TH3, the process goes to a recording step RS53(1). The recording step RS53(1) records each of the second pressing forces that the pressing units of the pressing mechanism 62 apply to the first side 41 and the second side 42 as a second pressing force RP(1).

Next, as shown in FIG. 49, a second-mask detaching step RS3(2) of detaching the second mask 50 from the frame 40 is performed. The second mask 50 is the 11th mask 50A1. The second-mask detaching step RS3(2) includes a second removing step RS4(2) and a second inverse adjustment step RS5(2).

Next, the third-mask detaching step RS3(3) to the tenth-mask detaching step RS3(10) are performed in order. The third-mask detaching step RS3(3) to the tenth-mask detaching step RS3(10) include a third removing step RS4(3) to a tenth removing step RS4(10) and a third placement inverse adjustment step RS5(3) to a tenth inverse adjustment step RS5(10).

Next, a releasing step RS6 is performed. For example, the rods 621 of the pressing units of the frame 40 are separated from the pressing mechanism 62.

Figure 50:
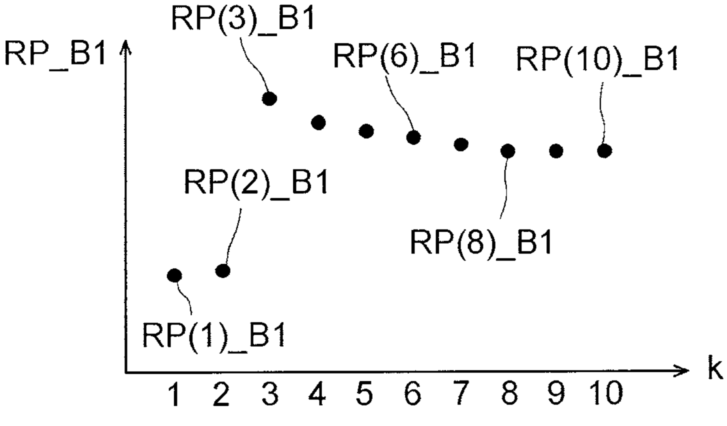
FIG. 50 is a graph showing an example of the pressing force of the 21st pressing unit according to the fifth embodiment.

FIG. 50 is a graph showing an example of the transition of a second pressing force RP_B1 that the 21st pressing unit 62B1 applies to the first side 41 in the period from the first inverse adjustment step RS5(1) to the tenth inverse adjustment step RS5(10). The 21st pressing unit 62B1 is a pressing unit that is closest to the fourth side 44 among the pressing units of the second group 62B. As shown in FIG. 50, the second pressing force RP_B1 may be increased during two or more times of inverse adjustment step RS5. In the example shown in FIG. 50, the second pressing force RP_B1 increases during the period from the first inverse adjustment step RS5(1) to the third inverse adjustment step RS5(3). The period during which the first pressing force P_B1 increases may be before the period during which the first pressing force of the pressing units of the central group 62C increases.

As shown in FIG. 50, the second pressing force RP_B1 may be greater than zero in the first inverse adjustment step RS5(1).

The second pressing force RP_B1 may stand at the maximum value at the Q-th inverse adjustment step RS5(Q) (where Q is an integer greater than 1 and less than N). In the example shown in FIG. 50, the second pressing force RP_B1 stands at the maximum value at the third inverse adjustment step RS5(3).

Inequality $Q \leq N/2$ may be satisfied. In other words, the second pressing force RP_B1 may stand at the maximum value in the first half of the inverse adjustment step RS5.

The 21st pressing unit 62B1 applies the second pressing force RP(N)_B1 to the first side 41 at the last inverse adjustment step RS5, that is, at the N-th inverse adjustment step RS5(N).

The ratio of the second pressing force RP(Q)_B1 to the second pressing force RP(N)_B1 may be, for example, 1.05 or higher, 1.10 or higher, or 1.15 or higher. The ratio of the second pressing force RP(Q)_B1 to the second pressing force RP(N)_B1 may be, for example, 1.20 or lower, 1.30 or lower, or 1.50 or lower. The second pressing force RP(Q)_B1 is a second pressing force that the 21st pressing unit 62B1 applies to the first side 41 in the Q-th inverse adjustment step RS5(Q). The numerical range of the ratio of the second pressing force RP(Q)_B1 to the second pressing force RP(N)_B1 may be the same as the numerical range of "the ratio of the first pressing force P(U)_B1 to the first pressing force P(1)_B1" described above.

Figure 51:
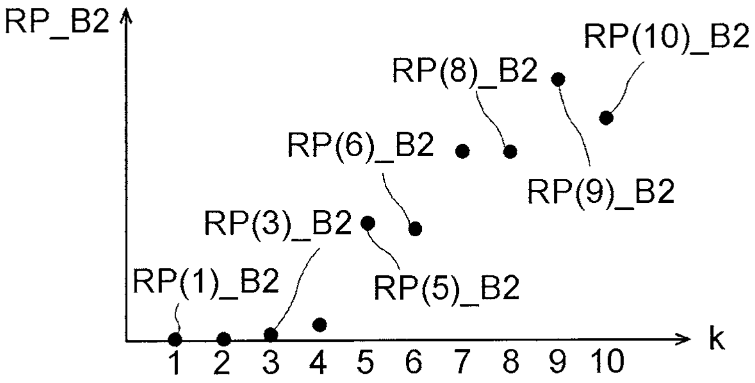
FIG. 51 is a graph showing an example of the pressing force of the 22nd pressing unit according to the fifth embodiment.

FIG. 51 is a graph showing an example of the transition of a second pressing force RP_B2 that the 22nd pressing unit 62B2 applies to the first side 41 during the period from the first inverse adjustment step RS5(1) to the tenth inverse adjustment step RS5(10). As shown in FIG. 51, the second pressing force RP_B2 may be increased during two or more times of inverse adjustment step RS5. In the example shown in FIG. 51, the second pressing force RP_B2 increases during the period from the second inverse adjustment step RS5(2) to the seventh inverse adjustment step RS5(5).

As shown in FIG. 51, the second pressing force RP_B2 may become greater than zero from the second inverse adjustment step RS5 onward. In the example shown in FIG. 51, the second pressing force RP_B2 becomes greater than zero in the second adjustment step RS5(2). The second pressing force RP_B2 may become greater than zero after the second pressing force RP_B1 becomes greater than zero. The second pressing force RP_B2 may become greater than zero before the second pressing force RP_C2 (described later) becomes greater than zero.

The second pressing force RP_B2 may stand at the maximum value at a step other than the N-th inverse adjustment step RS5(N). In the example shown in FIG. 51, the second pressing force RP_B2 stands at the maximum value at the ninth inverse adjustment step RS5(9). In other words, the second pressing force RP_B2 stands at the maximum value at the (N−1)th inverse adjustment step RS5(N-1). In the ninth inverse adjustment step RS5(9), the 22nd pressing unit 62B2 applies the second pressing force P(9)_B2 to the first side 41. The second pressing force P_B2 may stand at the maximum value at the (N−2)th inverse adjustment step RS5(N-2) or the (N−3)th inverse adjustment step RS5(N-3) (not shown).

The range of the ratio of the maximum value of the second pressing force P_B2 to the second pressing force P(N)_B2 may be the same as the numerical range of "the ratio of the first pressing force P(U)_B1 to the first pressing force P(1)_B1", described above.

Figure 52:
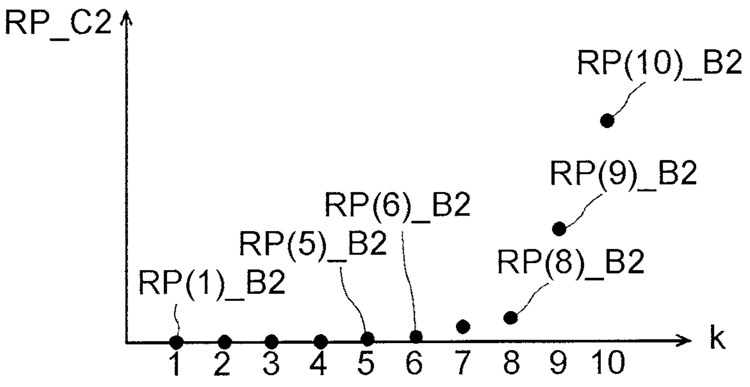
FIG. 52 is a graph showing an example of the pressing force of the second central pressing unit according to the fifth embodiment.

FIG. 52 is a graph showing an example of the transition of a second pressing force RP_C2 that the second central pressing unit 62C2 applies to the first side 41 during the period from the first inverse adjustment step RS5(1) to the tenth inverse adjustment step RS5(10). As shown in FIG. 52, the second pressing force RP_C2 may be increased during two or more times of inverse adjustment step RS5. In the example shown in FIG. 52, the second pressing force RP_C2 increases during the period from the sixth inverse adjustment step RS5(6) to the tenth adjustment step RS5(10).

The transition of the second pressing force RP_B1 shown in FIG. 50 may also be made by the 11th pressing unit 62A1. The transition of the second pressing force RP_B2 shown in FIG. 51 may also be made by the 12th pressing unit 62A2. The transition of the second pressing force RP_C2 shown in FIG. 52 may also be made by the first central pressing unit 62C1.

The control unit 63 may control the pressing mechanism 62 so that the difference between the second pressing forces that the pressing units of the pressing mechanism 62 apply to the first side 41 in the N-th inverse adjustment step RS5(N) falls within a predetermined range. For example, as in the first embodiment, the control unit 63 may control the pressing mechanism 62 so that each of the third ratio RA3 and the fourth ratio RA4 are less than or equal to a predetermined value.

EXAMPLES

Embodiments of the present disclosure will be described more specifically using examples. However, it is to be understood that the embodiments of the present disclosure are not limited to the description in the following examples unless departing from the spirit and scope of the disclosure.

Example 1

Figure 37:
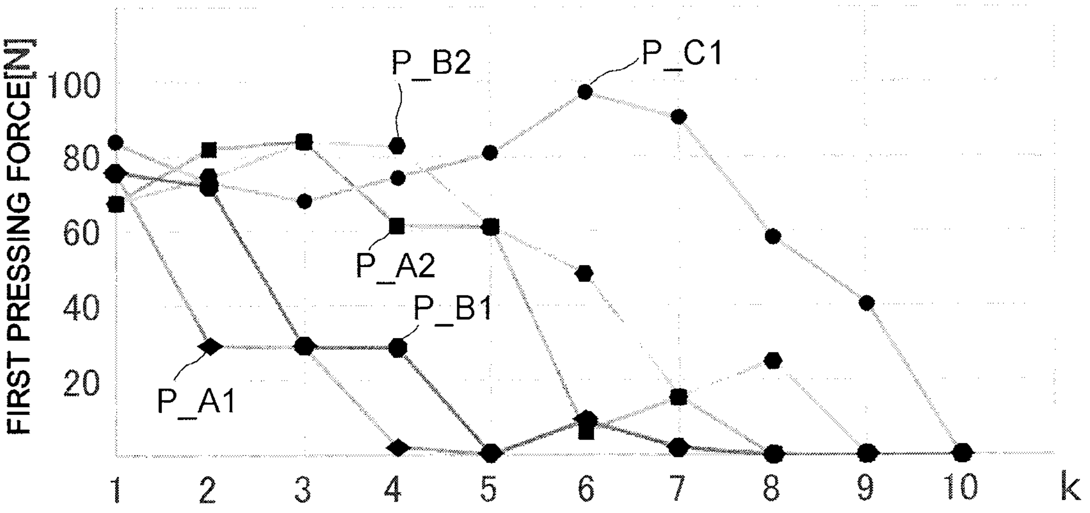
FIG. 37 is a graph showing an 11th pressing force, a 12th pressing force, a 21st pressing force, a 22nd pressing force, and a first central pressing force in Example 1.

The mask apparatus 15 was produced using the manufacturing apparatus 60. The main constitution of the mask apparatus 15 and the manufacturing apparatus 60 is as follows:

Dimension G11 of frame 40: 1493.2 mm
Dimension G21 of frame 40: 2491.9 mm
Number N of masks 50: 9
Number of pressing units that press first side 41: 5
Interval between two pressing units adjacent in second direction D2: 415 mm
Number of displacement meters that measure first side 41: 7
Type of displacement meters: Keyence digital contact sensor GT2-A12K
Interval between two displacement meters adjacent in second direction D2: 415 mm In Example 1, the masks 50 were attached to the frame 40 in order of decreasing distance from the center of the frame 40 in the second direction D2, as in the first embodiment. FIG. 37 is a graph showing the transition of first pressing forces that the pressing units of the pressing mechanism 62 apply to the first side 41 during the period from the first adjustment step S4(1) to the ninth adjustment step S4(9). Reference sign k=1 denotes the first adjustment step S4(1). Reference sign k=9 denotes the ninth adjustment step S4(9). Reference sign P_A1 denotes the first pressing force that the 11th pressing unit 62A1 applied to the first side 41. Reference sign P_A2 denotes the first pressing force that the 12th pressing unit 62A2 applied to the first side 41. Reference sign P_B1 denotes the first pressing force that the 21st pressing unit 62B1 applied to the first side 41. Reference sign P_B2 denotes the first pressing force that the 22nd pressing unit 62B2 applied to the first side 41. Reference sign P_C1 denotes the first pressing force that the first central pressing unit 62C1 applied to the first side 41.

As shown in FIG. 37, the first pressing force P_C1 of the first central pressing unit 62C1 stood at the maximum value at the sixth adjustment step S4(6). The ratio of the first pressing force P_C1 at the sixth adjustment step S4(6) to the first pressing force P_C1 at the first adjustment step S4(1) was 1.17.

Figure 39:
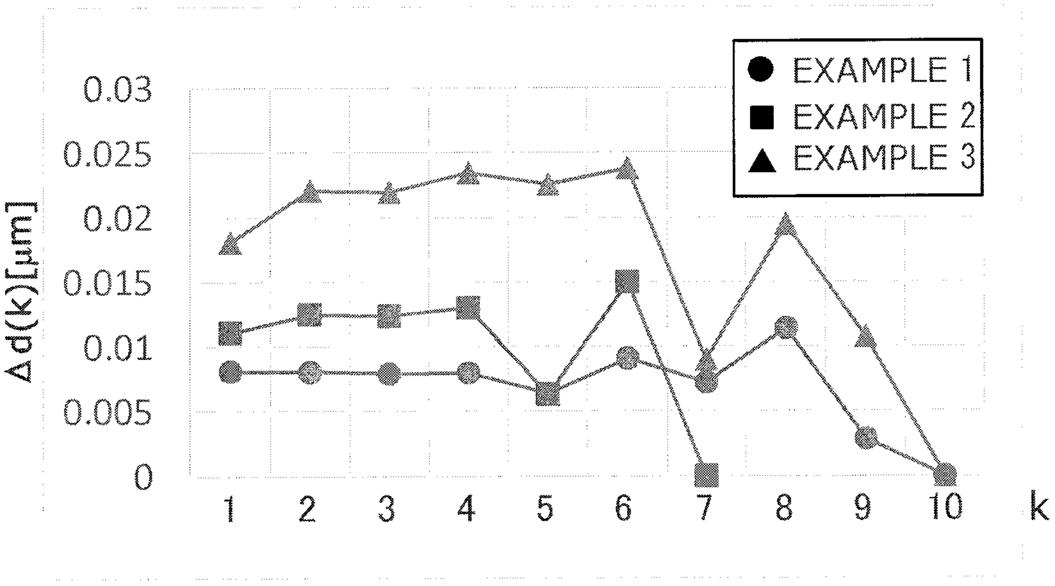
FIG. 39 is a graph showing the difference among the amounts of deformation and the target amounts of deformation in Examples 1 to 3.

After the k-th fixing step (k), the amount of deformation d(k) of the first side 41 was measured using the first central displacement meter 61C1. FIG. 39 shows the absolute values of the difference among the amounts of deformation d(k) and the target amounts of deformation.

Example 2

Figure 38:
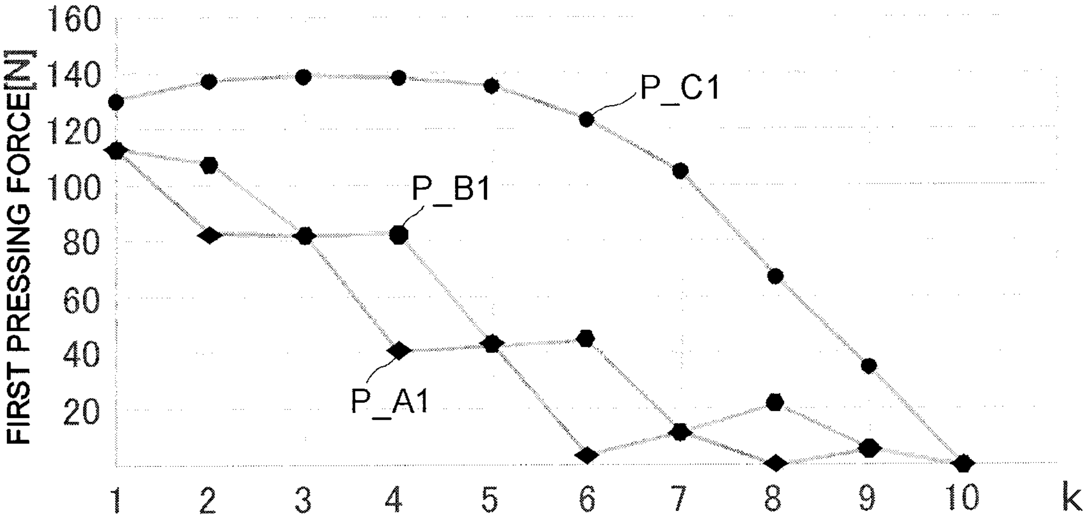
FIG. 38 is a graph showing an 11th pressing force, a 21st pressing force, and a first central pressing force in Example 2.

The mask apparatus 15 was produced using the manufacturing apparatus 60. The main constitution of the mask apparatus 15 and the manufacturing apparatus 60 is as follows:

Dimension G11 of frame 40: 1493.2 mm
Dimension G21 of frame 40: 2491.9 mm
Number N of masks 50: 9
Number of pressing units that press first side 41: 3
Interval between two pressing units adjacent in second direction D2: 695 mm.
Number of displacement meters that measure first side 41: 5
Type of displacement meter: Keyence digital contact sensor GT2-A12K
Interval between two displacement meters adjacent in second direction D2: 695 mm Also in Example 2, the masks 50 were attached to the frame 40 in order of decreasing distance from the center of the frame 40 in the second direction D2. FIG. 38 is a graph showing the transition of first pressing forces that the pressing units of the pressing mechanism 62 applied to the first side 41 during the period from the first adjustment step S4(1) to the ninth adjustment step S4(9). Reference sign P_A1 denotes the first pressing force that the 11th pressing unit 62A1 applied to the first side 41. Reference sign P_B1 denotes the first pressing force that the 21st pressing unit 62B1 applied to the first side 41. Reference sign P_C1 denotes the first pressing force that the first central pressing unit 62C1 applied to the first side 41.

After the k-th fixing step (k), the amount of deformation d(k) of the first side 41 was measured using the first central displacement meter 61C1. FIG. 39 shows the absolute value of the difference between the amount of deformation d(k) and the target amount of deformation.

Example 3

The mask apparatus 15 was produced using the manufacturing apparatus 60. The main constitution of the mask apparatus 15 and the manufacturing apparatus 60 is as follows:

Dimension G11 of frame 40: 1,105 mm
Dimension G21 of frame 40: 1,701 mm
Number N of masks 50: 6
Number of pressing units that press first side 41: 3
Interval between two pressing units adjacent in second direction D2: 475 mm
Number of displacement meters that measure first side 41: 5
Type of displacement meter: Keyence digital contact sensor GT2-A12K
Interval between two displacement meters adjacent in second direction D2: 475 mm Also in Example 3, the masks 50 were attached to the frame 40 in order of decreasing distance from the center of the frame 40 in the second direction D2. After the k-th fixing step (k), the amount of deformation d(k) of the first side 41 was measured using the first central displacement meter 61C1. FIG. 39 shows the absolute value of the difference between the amount of deformation d(k) and the target amount of deformation.

Example 4

Figure 53:
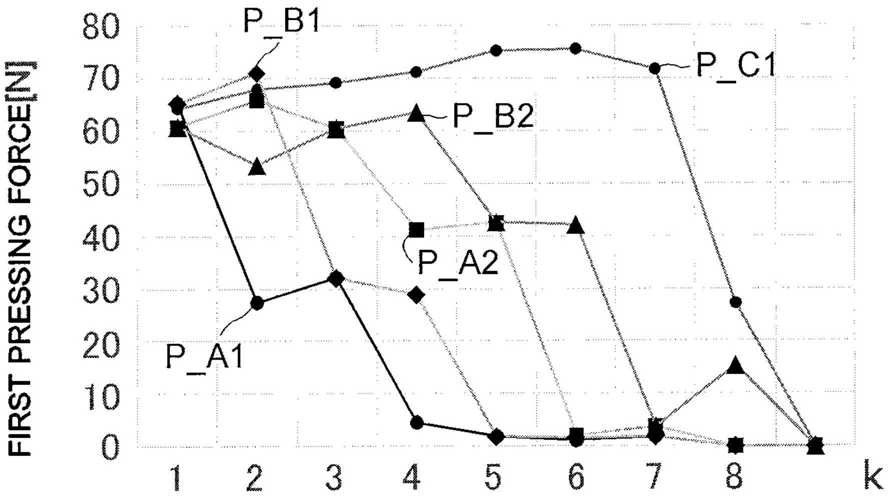
FIG. 53 is a graph showing an 11th pressing force, a 12th pressing force, a 21st pressing force, a 22nd pressing force, and a first central pressing force in Example 4.

The mask apparatus 15 was produced using the manufacturing apparatus 60. The main constitution of the mask apparatus 15 and the manufacturing apparatus 60 is as follows:

Dimension G11 of frame 40: 1493.2 mm
Dimension G21 of frame 40: 2491.9 mm
Number N of masks 50: 8
Number of pressing units that press first side 41: 5
Interval between two pressing units adjacent in second direction D2: 415 mm
Number of displacement meters that measure first side 41: 7
Type of displacement meter: Keyence digital contact sensor GT2-A12K
Interval between two displacement meters adjacent in second direction D2: 415 mm Also in Example 4, the masks 50 were attached to the frame 40 in order of decreasing distance from the center of the frame 40 in the second direction D2. FIG. 53 is a graph showing the transition of first pressing forces that the pressing units of the pressing mechanism 62 applied to the first side 41 during the period from the first adjustment step S4(1) to the eighth adjustment step S4(8).

As shown in FIG. 53, the first pressing force P_C1 of the first central pressing unit 62C1 stood at the maximum value at the sixth adjustment step S4(6). The ratio of the first pressing force P_C1 at the sixth adjustment step S4(6) to the first pressing force P_C1 at the first adjustment step S4(1) was 1.17.

Figure 55:
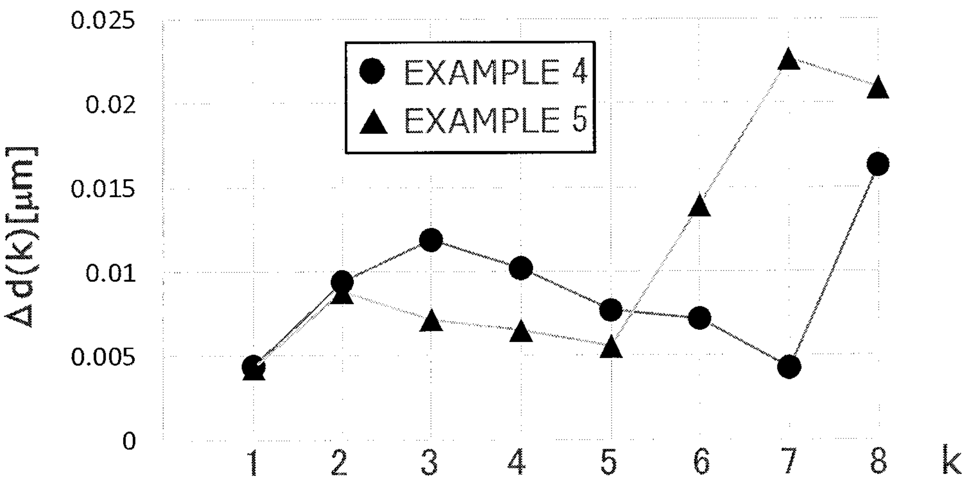
FIG. 55 is a graph showing the difference among the amounts of deformation and the target amounts of deformation in Examples 4 and 5.

After the k-th fixing step (k), the amount of deformation d(k) of the first side 41 was measured using the first central displacement meter 61C1. FIG. 55 shows the absolute value of the difference between the amount of deformation d(k) and the target amount of deformation.

Example 5

The mask apparatus 15 was produced using the manufacturing apparatus 60. The main constitution of the mask apparatus 15 and the manufacturing apparatus 60 is the same as that of Example 4.

Figure 54:
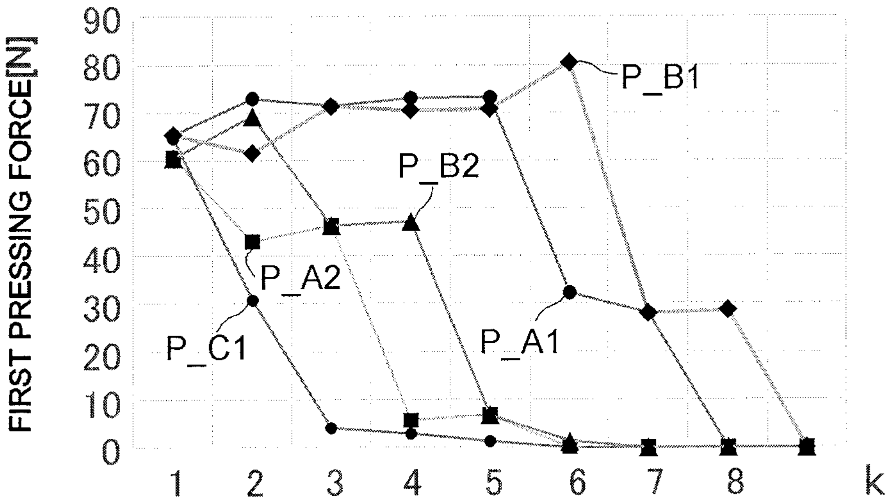
FIG. 54 is a graph showing an 11th pressing force, a 12th pressing force, a 21st pressing force, a 22nd pressing force, and a first central pressing force in Example 5.

In Example, 5, the masks 50 were attached to the frame 40 in order of increasing distance from the center of the frame 40 in the second direction D2, as in the fifth embodiment. FIG. 54 is a graph showing the transition of first pressing forces that the pressing units of the pressing mechanism 62 applied to the first side 41 during the period from the first adjustment step S4(1) to the eighth adjustment step S4(8).

As shown in FIG. 54, the first pressing force P_B1 of the 21st pressing unit 62B1 stood at the maximum value at the sixth adjustment step S4(6). The ratio of the first pressing force P_B1 at the sixth adjustment step S4(6) to the first pressing force P_B1 at the first adjustment step S4(1) was 1.23.

After the k-th fixing step (k), the amount of deformation d(k) of the first side 41 was measured using the first central displacement meter 61C1. FIG. 55 shows the absolute value of the difference between the amount of deformation d(k) and the target amount of deformation.

What is claimed is:

1. A method of manufacturing a mask apparatus, the method comprising:

preparing a frame including a first side and a second side opposing each other in a first direction across an opening and a third side and a fourth side opposing each other in a second direction crossing the first direction across the opening;

adjusting first pressing forces that a pressing mechanism applies to the first side and the second side in a direction toward the opening; and fixing ends of at least two masks to the first side and the second side, wherein the pressing mechanism includes:

five or more pressing units that are arranged at intervals of 500 mm or less in the second direction and that press the first side; and five or more pressing units that are arranged at intervals of 500 mm or less in the second direction and that press the second side, wherein the at least one mask comprises N masks, where N is an integer greater than or equal to 2, arranged in the second direction, wherein the adjusting includes adjusting the first pressing forces in such a manner that a difference between the amount of deformation of the first side and a target amount of deformation when the masks are fixed to the first side is less than or equal to a first threshold, wherein the fixing includes fixing the masks to the first side and the second side in order of decreasing distance from a center of the frame in the second direction, wherein the pressing mechanism that presses the first side includes:

a central group including one or two of the pressing units;

a first group including two or more of the pressing units between the central group and the third side in the second direction; and a second group including two or more of the pressing units between the central group and the fourth side in the second direction, wherein the one or two pressing units of the central group apply a first pressing force (1) to the first side when a first one of the masks is fixed to the frame, wherein the one or two pressing units of the central group apply a first pressing force (U) to the first side when a U-th one of the masks, where U is an integer greater than 1 and less than N, is fixed to the frame, and wherein a ratio of the first pressing force (U) to the first pressing force (1) is 1.05 or higher.

2. The method of manufacture according to claim 1, wherein the adjusting includes adjusting the first pressing forces so as to satisfy the following inequality:

$$U \geq N/2.$$

3. A method of manufacturing a mask apparatus, the method comprising:

preparing a frame including a first side and a second side opposing each other in a first direction across an opening and a third side and a fourth side opposing each other in a second direction crossing the first direction across the opening;

adjusting first pressing forces that a pressing mechanism applies to the first side and the second side in a direction toward the opening; and fixing ends of at least two masks to the first side and the second side, wherein the pressing mechanism includes;

five or more pressing units that are arranged at intervals of 500 mm or less in the second direction and that press the first side; and five or more pressing units that are arranged at intervals of 500 mm or less in the second direction and that press the second side, wherein the at least one mask comprises N masks, where N is an integer greater than or equal to 2, arranged in the second direction, wherein the adjusting includes adjusting the first pressing forces in such a manner that a difference between the amount of deformation of the first side and a target amount of deformation when the masks are fixed to the first side is less than or equal to a first threshold, wherein the fixing includes fixing the masks to the first side and the second side in order of increasing distance from a center of the frame in the second direction, wherein the pressing mechanism that presses the first side includes:

a central group including one or two of the pressing units;

a first group including two or more of the pressing units between the central group and the third side in the second direction; and a second group including two or more of the pressing units between the central group and the fourth side in the second direction, wherein one of the pressing units that belongs to the second group and that is closest to the fourth side applies a first pressing force (1) to the first side when a first one of the masks is fixed to the frame, wherein the pressing unit that belongs to the second group and that is closest to the fourth side applies a first pressing force (U) to the first side when a U-th one of the masks, where U is an integer greater than 1 and less than Na is fixed to the frame, and wherein a ratio of the first pressing force (U) to the first pressing force (1) is 1.05 or higher.

* * * * *